United States Patent
Zhao et al.

(10) Patent No.: US 6,616,767 B2
(45) Date of Patent: Sep. 9, 2003

(54) HIGH TEMPERATURE CERAMIC HEATER ASSEMBLY WITH RF CAPABILITY

(75) Inventors: Jun Zhao, Cupertino, CA (US); Talex Sajoto, San Jose, CA (US); Charles Dornfest, Fremont, CA (US); Harold Mortensen, Carlsbad, CA (US); Richard Palicka, San Clemente, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/057,005

(22) Filed: Mar. 27, 1998

(65) Prior Publication Data

US 2003/0051665 A1 Mar. 20, 2003

Related U.S. Application Data

(63) Continuation-in-part of application No. 08/800,096, filed on Feb. 12, 1997, now Pat. No. 5,968,379.

(51) Int. Cl.[7] .............................................. C23C 16/00
(52) U.S. Cl. .................................. 118/723; 156/345.47
(58) Field of Search .................. 156/345.47; 118/723 E

(56) References Cited

U.S. PATENT DOCUMENTS 5,231,690 A * 7/1993 Soma et al. ................. 392/416
5,356,476 A   10/1994 Foster et al.
5,571,010 A   11/1996 Okase
5,633,073 A    5/1997 Cheung et al. ............. 428/209
5,688,331 A * 11/1997 Aruga et al. ................ 118/725
5,730,803 A *  3/1998 Steger et al. ............... 118/725

FOREIGN PATENT DOCUMENTS

| EP | 0 628 644 A2 A3 | 12/1994 | .......... C23C/16/44 |
| EP | 0 680 075 A1 | 11/1995 | |
| JP | 01005012 | 1/1989 | |
| JP | 9-213455 | 8/1997 | ............ H05B/3/08 |
| WO | WO 95/23428 | 8/1995 | |

* cited by examiner

Primary Examiner—John F. Niebling
Assistant Examiner—Stacy Whitmore
(74) Attorney, Agent, or Firm—Townsend and Townsend and Crew

(57) ABSTRACT

The present invention provides techniques for coupling radio-frequency (RF) power to a metal plate in a ceramic pedestal. Perforations in the metal plate allow ceramic-to-ceramic bonding through the metal plate. The power from an RF power feed is distributed to the perforated metal plate via several electrodes that are spaced away from the centerline of the RF power feed, thus splitting power distribution. A ceramic bonding disk between the metal plate and the RF power feed provides mechanical support for the metal plate and a ceramic body to bond to through the perforations, thus reducing cracking of the metal plate and the surrounding ceramic material.

19 Claims, 31 Drawing Sheets

HIGH TEMPERATURE CERAMIC HEATER ASSEMBLY WITH RF CAPABILITY

CROSS REFERENCE TO RELATED APPLICATIONS

This is a continuation-in-part of application Ser. No. 08/800,096, filed Feb. 12, 1997, now U.S. Pat. No. 5,968, 379 commonly assigned and entitled "A HIGH TEMPERATURE CERAMIC HEATER ASSEMBLY WITH RF CAPABILITY AND RELATED METHODS" and having listed as inventors Jun Zhao, Charles Domfest, Talex Sajoto, Leonid Selyutin, Stefan Wolff, Lee Luo, Harold Mortenson, and Richard Palicka. The disclosure of application Ser. No. 08/800,096 is hereby incorporated by reference for all purposes.

BACKGROUND OF THE INVENTION

The present invention relates to semiconductor processing. More specifically, the invention relates to methods and apparatus for forming films at temperatures greater than about 400° C. in a corrosive environment with a plasma. In some specific embodiments, the invention is useful for forming titanium-containing films such as titanium, titanium nitride, and titanium disilicide at temperatures of up to about 625° C. or greater. Such films may be used as patterned conductive layers, plugs between conductive layers, diffusion barrier layers, adhesion layers, and as a precursor layer to silicide formation. In addition, other embodiments of the present invention may be used, for example, to deposit other types of metal films, to alloy substrate materials, and to anneal substrate materials.

One of the primary steps in fabricating modern semiconductor devices is forming various layers, including dielectric layers and metal layers, on a semiconductor substrate. As is well known, these layers can be deposited by chemical vapor deposition (CVD) or physical vapor deposition (PVD). In a conventional thermal CVD process, reactive gases are supplied to the substrate surface where heat-induced chemical reactions (homogeneous or heterogeneous) take place to produce a desired film. In a conventional plasma CVD process, a controlled plasma is formed to decompose and/or energize reactive species to produce the desired film. In general, reaction rates in thermal and plasma processes may be controlled by controlling one or more of the following: temperature, pressure, plasma density, reactant gas flow rate, power frequency, power levels, chamber physical geometry, and others. In an exemplary PVD system, a target (a plate of the material that is to be deposited) is connected to a negative voltage supply (direct current (DC) or radio frequency (RF)) while a substrate holder facing the target is either grounded, floating, biased, heated, cooled, or some combination thereof. A gas, such as argon, is introduced into the PVD system, typically maintained at a pressure between a few millitorr (mtorr) and about 100 mtorr, to provide a medium in which a glow discharge can be initiated and maintained. When the glow discharge is started, positive ions strike the target, and target atoms are removed by momentum transfer. These target atoms subsequently condense into a thin film on the substrate, which is on the substrate holder.

Semiconductor device geometries have dramatically decreased in size since such devices were first introduced several decades ago. Since then, integrated circuits have generally followed the two-year/half-size rule (often called "Moore's law") which means that the number of devices which will fit on a chip doubles every two years. Today's wafer fabrication plants are routinely producing 0.35 μm feature size devices, and tomorrow's plants soon will be producing devices having even smaller feature sizes. As device feature sizes become smaller and integration density increases, issues not previously considered crucial by the industry are becoming of greater concern. For example, devices with increasingly high integration density have features with high aspect ratios (for example, about 6:1 or greater for 0.35 μm feature size devices). (Aspect ratio is defined as the height-to-spacing ratio of two adjacent steps.) High aspect ratio features, such as gaps, need to be adequately filled with a deposited layer in many applications.

Increasingly stringent requirements for fabricating these high integration devices are needed and conventional substrate processing systems are becoming inadequate to meet these requirements. Additionally, as device designs evolve, more advanced capabilities are required in substrate processing systems used to deposit films made of materials needed to implement these devices. For example, the use of titanium is increasingly being incorporated into integrated circuit fabrication processes. Titanium has many desirable characteristics for use in a semiconductor device. Titanium can act as a diffusion barrier between, for example, a gold bonding pad and a semiconductor, to prevent migration of one atomic species into the next. Also, titanium can be used to improve the adhesion between two layers, such as between silicon and aluminum. Further, use of titanium, which forms titanium disilicide (silicide) when alloyed with silicon, can enable, for example, formation of ohmic contacts. A common type of deposition system used for depositing such a titanium film is a titanium sputtering deposition system which is often inadequate for forming devices with higher processing and manufacturing requirements. Specifically, sputtering may result in damaged devices which suffer from performance problems. Also, titanium sputtering systems may be unable to deposit uniform conformal layers in high aspect ratio gaps because of shadowing effects that occur with sputtering.

In contrast to sputtering systems, a plasma-enhanced chemical vapor deposition (PECVD) system may be more suitable for forming a titanium film on substrates with high aspect ratio gaps. As is well known, a plasma, which is a mixture of ions and gas molecules, may be formed by applying energy, such as radio frequency (RF) energy, to a process gas in the deposition chamber under the appropriate conditions, for example, chamber pressure, temperature, RF power, and others. The plasma reaches a threshold density to form a self-sustaining condition, known as forming a glow discharge (often referred to as "striking" or "igniting" the plasma). This RF energy raises the energy state of molecules in the process gas and forms ionic species from the molecules. Both the energized molecules and ionic species are typically more reactive than the process gas, and hence more likely to form the desired film. Advantageously, the plasma also enhances the mobility of reactive species across the surface of the substrate as the titanium film forms, and results in films exhibiting good gap filling capability.

However, conventional PECVD systems which use aluminum heaters may experience some limitations when used for certain processes, such as forming a titanium film from a vapor of, for example, titanium tetrachloride ($TiCl_4$). Aluminum corrosion, temperature limitations, unwanted deposition, and manufacturing efficiency are some of the problems with such conventional PECVD systems that may be used to deposit a film such as titanium.

In the exemplary process, titanium tetrachloride, which is a liquid at room temperature, and a carrier gas, such as helium, bubbled through this liquid generates vapor that can be carried to a deposition chamber. At a substrate temperature of about 600° C., this process deposits a layer of titanium at about 100 Å/min. It is desireable to increase the deposition rate, and one way to do this is by increasing the temperature of the substrate.

However, when the titanium tetrachloride disassociates to form the titanium film, chlorine is released into the chamber. The plasma, which enhances the titanium film deposition, forms chlorine atoms and ions that undesirably tend to corrode aluminum heaters. Furthermore, aluminum corrosion may lead to processing degradation issues relating to metal contamination in the devices.

Not only is an aluminum heater susceptible to corrosion from chlorine, it is generally limited to operating temperatures less than about 480° C., which may therefore limit the film deposition rates that can be achieved. Aluminum is an inappropriate material for heaters operating at high temperature, because at temperatures greater than about 480° C. aluminum heaters experience softening, possibly resulting in warpage of and/or damage to the heater. Additional problems arise when aluminum heaters are used above about 480° C. in the presence of a plasma. In such an environment, the aluminum may backsputter, contaminating the substrate and chamber components. Furthermore, aluminum heaters (and other parts of the chamber such as the faceplate), which tend to be incompatible even at lower temperatures with some of the chemical species associated with some deposition processes (such as the chlorine compounds produced in a titanium deposition process), experience greatly increased attack at higher temperatures. Chemical species, such as chlorine, used in dry clean processes also attack the aluminum heaters. At temperatures higher than about 480° C., these chemical species may more aggressively attack and corrode aluminum heaters than at lower temperatures, thereby reducing the operational lifetime of the heater and undesirably requiring more frequent heater replacement. Heater replacement is expensive not only because of the cost of the heater, but also because the productive use of the deposition chamber is lost for the time the heater is being replaced. During such dry clean processes, a dummy wafer is often loaded onto the aluminum heater to try to minimize the attack on the heater. However, loading and unloading of the dummy wafer consumes time and decreases wafer throughput. Also, some dummy wafers, which get attacked by the dry clean chemistries, are expensive and may need periodic replacement, which adds to the overall maintenance costs.

In addition to aluminum corrosion, heater softening, and temperature limitations, other concerns with metal depositions in a PECVD processing system include unwanted metal deposition and related manufacturing efficiency problems. While the greatest film deposition generally occurs in places where the temperature is the highest, some deposition will occur at lower temperatures, even in the absence of a plasma. Unwanted metal depositions can cause multiple problems, such as uneven deposition, arcing, degraded operation of chamber components, and/or device defects. Besides occurring on chamber wall and bottom surfaces, unwanted metal deposition may occur on non-conductive components, such as ceramic spacers and liners within the deposition chamber or chamber exhaust path, which then become conductive. This undesired conductive metal deposition can disrupt the shape of the glow discharge, resulting in uneven deposition across the substrate. It can also cause arcing, which may damage the substrate and parts of the chamber such as the faceplate. Further, titanium may build up on parts of the heater, in gas or vacuum apertures to undesirably restrict the flow therethrough, or on mechanical parts having close tolerances to interfere with their operation. Unwanted deposits that have bonded poorly to the underlying chamber component or that have built up on the heater may result in flakes and other particles that fall onto the substrate and cause defects on the substrate, thus reducing substrate yield. For these and other reasons, the chamber must periodically be cleaned with dry clean processes, which do not require opening of the chamber, and a preventive maintenance clean, which requires at least partially disassembling the chamber and wiping it down. The chamber may be cleaned in various ways. A "dry" cleaning process may use reactive gas or plasma species to etch unwanted deposits from the chamber components, or may physically bombard particles with plasma species to knock them loose, to be removed by the exhaust system. A "wet" cleaning process may be done in addition or as an alternative to a dry clean. A wet clean typically involves at least partial disassembly of the chamber, which is then wiped down with solvents.

Subsequently, the chamber must be reassembled and may be "seasoned", i.e., a number of deposition cycles must be performed until consistent layers are obtained. Both procedures take the deposition system out of productive operation, which is inefficient and uneconomic, but wet cleans usually decrease throughput more than dry cleans. Therefore, it is desirable to have an efficient dry clean process to minimize the frequency of wet cleans so that more wafers may be produced between cleans. It is also desirable to minimize the areas in the chamber upon which unwanted depositions may form. In some deposition processes, particularly metal depositions such as tungsten or titanium, the time required for cleaning the chamber becomes a major factor affecting the deposition system's wafer output.

Although ceramic heaters have been proposed as an alternative to using aluminum heaters for deposition systems operating at or above about 400° C., fabricating ceramic heaters and using them in deposition processes introduces several challenges. Such ceramic heaters advantageously may be used in the presence of plasma and corrosive plasma species, such as chlorine-containing species found in a titanium PECVD process and associated cleaning processes. Ceramic heaters typically have an electric heating element within a ceramic heater body, made of materials such as alumina ($Al_2O_3$) or aluminum nitride (AlN), which protects the heating element from the corrosive environment of the deposition chamber while transmitting heat from the heating element to the substrate. Typically harder and more brittle than metals, ceramic materials may be difficult to machine, thereby requiring a simple mechanical design. Being somewhat brittle, ceramic may crack from thermal shock if repeatedly subjected to a sufficient thermal gradient. Cracking may also arise from the differential thermal expansion at the transition from the ceramic heater assembly to a material with a different thermal expansion coefficient. Even joining ceramic parts fabricated from the same material is a challenge because many assembly methods and devices used to assemble metal parts, such as welding, bolting, brazing and screwing, may be unreasonably difficult or unreliable when attempted with ceramic parts.

In light of the above, improved methods, systems and apparatus are needed for efficient plasma-enhanced deposition of films in a high temperature (at least about 400° C.), corrosive environment. Optimally, these improved methods and apparatus will require less chamber cleaning and result in higher substrate output. In particular, these systems and methods should be designed to be compatible with processing requirements for forming devices with high aspect ratio features.

SUMMARY OF THE INVENTION

The present invention provides techniques for processing substrates in a plasma-enhanced chemical vapor deposition (PECVD) chamber in high temperature (above about 400° C.) and/or corrosive environments. Embodiments of the present invention include a ceramic substrate support structure with an integral RF plane. The ceramic substrate support structure may further include a resistive heating element.

In accordance with one embodiment, the present invention provides a structure in which a perforated metal layer is incorporated into a ceramic assembly. A ceramic-to-ceramic bond is formed through the perforation in the metal layer during the assembly process. The perforations allow ceramic on one side of the metal layer to support and bond with ceramic on the other side of the metal layer and thus reduce warping and cracking of the ceramic layer. Electrodes are connected to the perforated metal layer to provide electrical contact to the metal layer. Whereas a single large electrode might cover up some of the perforations and reduce the ceramic-to-ceramic bonding, providing several smaller electrodes improves the bonding by not covering as many perforations. The electrodes, connected to an electrode base, extend through a ceramic bonding disk to contact the metal plane. The upper ceramic layer of the assembly is bonded to the ceramic bonding disk through the perforations in the metal layer. By sizing and aligning the electrodes, it is possible to provide sufficient electrode contact area to the metal plane to carry the anticipated electric current with minimal coverage of perforations in the metal layer.

In another embodiment, a metal "spider" is used to laterally space the electrodes from the electrode base. The metal spider is relatively thin compared to the electrodes and has at least two legs. The legs of the spider may be perforated to allow ceramic-to-ceramic bonding through the perforations of the spider legs in a further embodiment.

In still another embodiment, a heating element is incorporated into the assembly. In a specific embodiment, the electric heating element has a series of concentric partial rows of metal ribbon with each partial row folding back on itself in a "seamless" manner.

These and other embodiments of the present invention, as well as its advantages and features, are described in more detail in conjunction with the description below and attached figures.

DETAILED DESCRIPTION OF THE SPECIFIC EMBODIMENTS

I. CVD Reactor Systems

A. Overview of an Exemplary CVD Reactor

Embodiments of the present invention are systems, methods and apparatus used for depositing films (such as a titanium film) and related cleaning processes in a corrosive plasma environment at temperatures greater than about 400° C. Of course, such systems, methods and apparatus, as described below, may be used to deposit other films such as titanium silicide, titanium nitride, barium strontium titanate (BST), lead zirconate titanate (PZT), polysilicon, metal suicides, metal nitride barriers such as tungsten nitride, or other films, in addition to a titanium film. Such films may be used to form metal layers, adhesion layers, via plugs, or other layers.

Figure 1A:
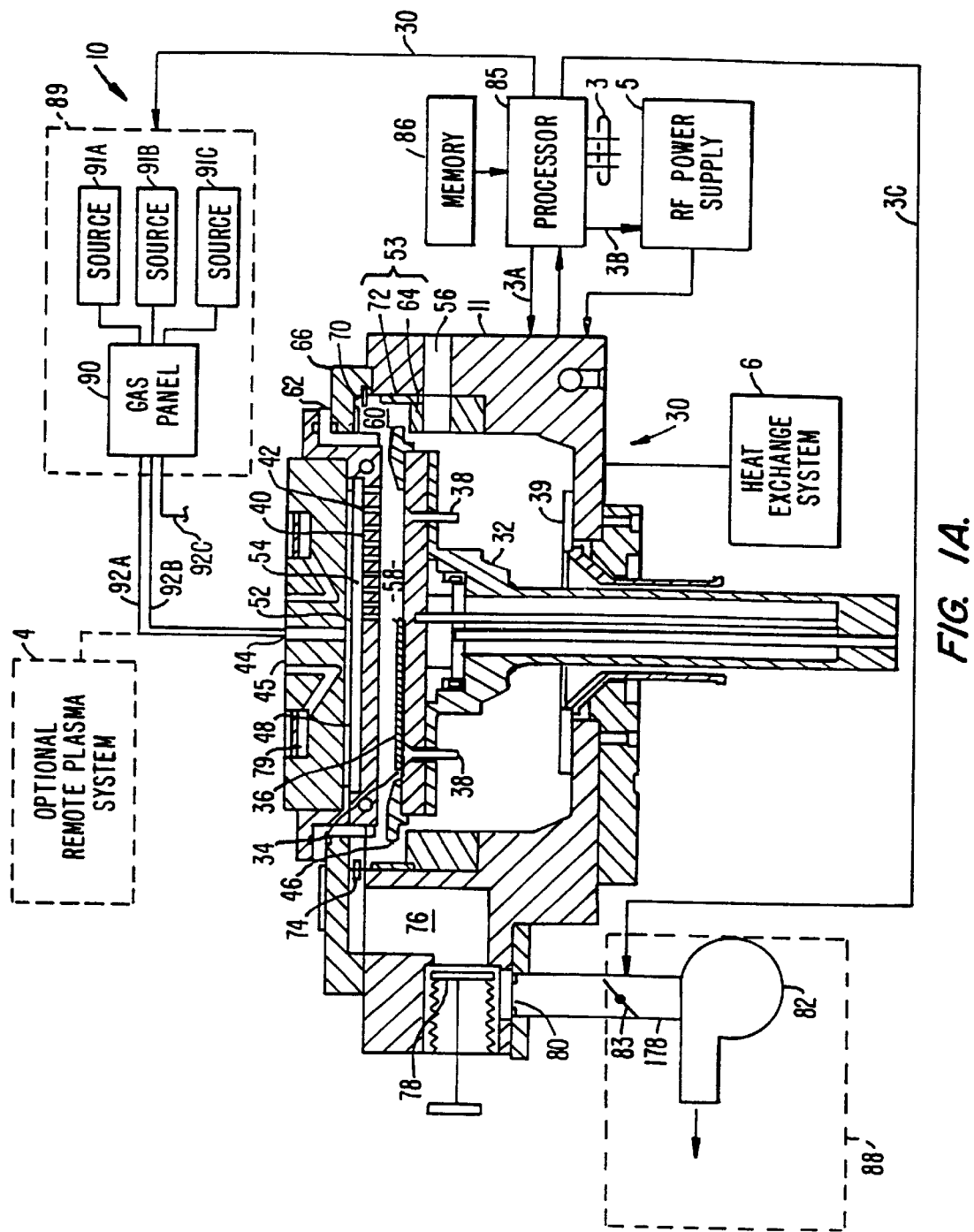
FIG. 1A is a block diagram of one embodiment of a deposition system according to the present invention, including a simplified cross-sectional view of the deposition chamber.

Referring to FIG. 1A, the CVD system 10 includes reactor chamber 30, which receives gases from a gas delivery system 89 via gas lines 92A–C (other lines may be present but not shown). A vacuum system 88 is used to maintain a specified pressure in the chamber and removes gaseous byproducts and spent gases from the chamber. An RF power supply 5 provides radio-frequency power to the chamber for plasma-enhanced processes. A liquid heat exchange system 6 employs a liquid heat exchange medium, such as water or a water-glycol mixture, to remove heat from the reactor chamber and maintain certain portions of the chamber at a suitable temperature for stable process temperatures. A processor 85 controls the operation of the chamber and subsystems via control lines 3, 3A, 3B, 3C, and 3D (and other control lines that are not shown) according to instructions stored in memory 86.

Processor 85 executes system control software, which is a computer program stored in a memory 86 coupled to processor 85. Preferably, memory 86 may be a hard disk drive, but of course memory 86 may be other kinds of memory. In addition to a hard disk drive (e.g., memory 86), CVD apparatus 10 in a preferred embodiment includes a floppy disk drive and a card rack. Processor 85 operates under the control of the system control software, which includes sets of instructions that dictate the timing, mixture of gases, gas flow, chamber pressure, chamber temperature, RF power levels, heater pedestal position, heater temperature and other parameters of a particular process. Other computer programs such as those stored on other memory including, for example, a floppy disk or other computer program product inserted in a disk drive or other appropriate drive, may also be used to operate processor 85. System control software will be discussed in detail below. The card rack contains a single-board computer, analog and digital input/output boards, interface boards and stepper motor controller boards. Various parts of CVD apparatus 10 conform to the Versa Modular European (VME) standard which defines board, card cage, and connector dimensions and types. The VME standard also defines the bus structure having a 16-bit data bus and 24-bit address bus.

Figure 1B:
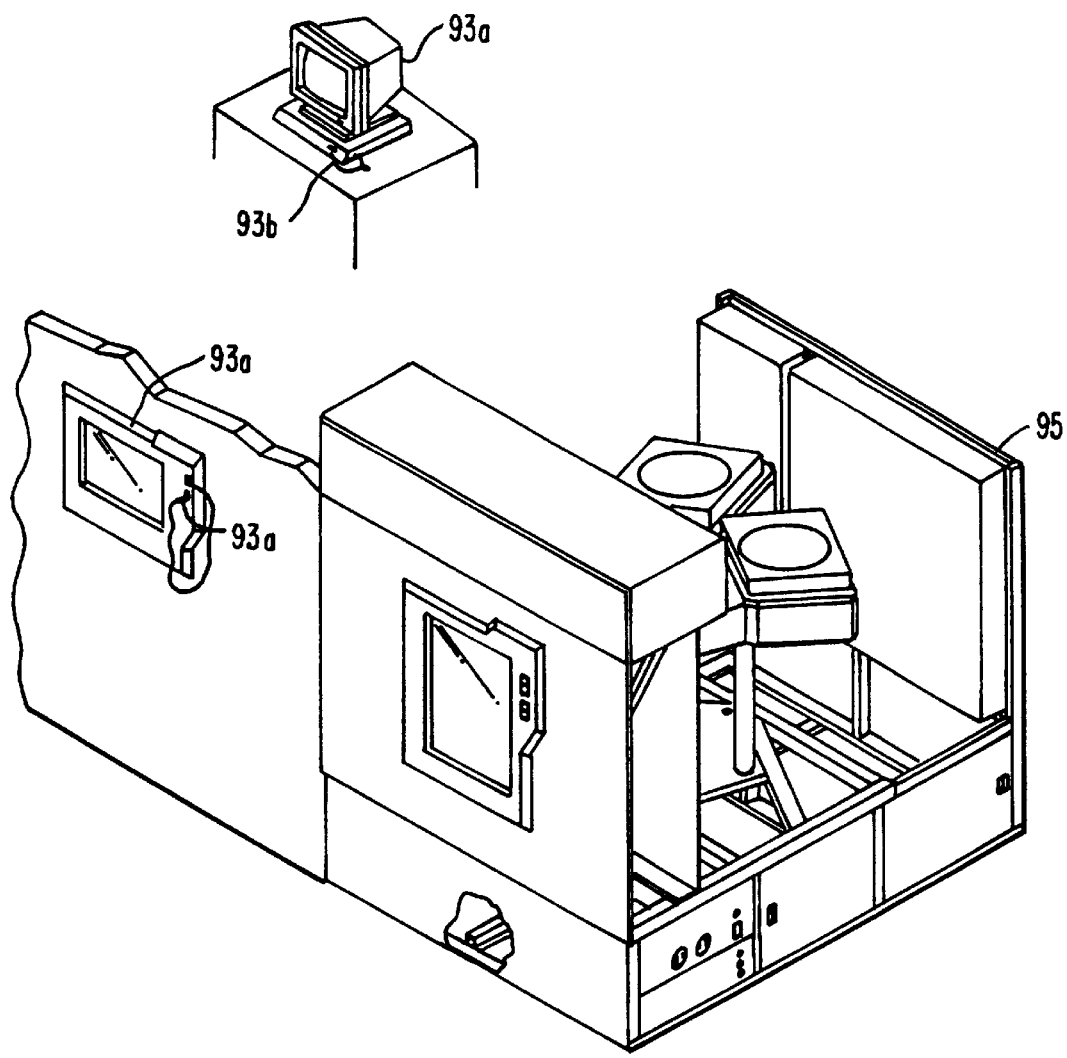
FIG. 1B shows an interface between a user and a processor that can control the deposition system of the present invention.

The interface between a user and processor 85 is via a CRT monitor 93a and a light pen 93b, shown in FIG. 1B which is a simplified diagram of the system monitor and CVD apparatus 10, illustrated as one of the chambers in a multichamber system. CVD apparatus 10 is preferably attached to a mainframe unit 95 which contains and provides electrical, plumbing and other support functions for the apparatus 10. Exemplary mainframe units compatible with the illustrative embodiment of CVD apparatus 10 are currently commercially available as the PRECISION 5000™ and the CENTURA 5200™ systems from Applied Materials, Inc. of Santa Clara, Calif. The multichamber system has the capability to transfer a wafer between its chambers without breaking the vacuum and without having to expose the wafer to moisture or other contaminants outside the multichamber system. An advantage of the multichamber system is that different chambers in the multichamber system may be used for different purposes in the entire process. For example, one chamber may be used for deposition of a metal film, another may be used for rapid thermal processing, and yet another may be used for depositing an anti-reflective layer. The process may proceed uninterrupted within the multichamber system, thereby preventing contamination of wafers that often occurs when transferring wafers between various separate individual chambers (not in a multichamber system) for different parts of a process.

In the preferred embodiment two monitors 93a are used, one mounted in the clean room wall for the operators and the other behind the wall for the service technicians. Both monitors 93a simultaneously display the same information, but only one light pen 93b is enabled. The light pen 93b detects light emitted by CRT display with a light sensor in the tip of the pen. To select a particular screen or function, the operator touches a designated area of the display screen and pushes the button on the pen 93b. The touched area changes its highlighted color, or a new menu or screen is displayed, confirming communication between the light pen and the display screen. Of course, other devices, such as a keyboard, mouse, or other pointing or communication device, may be used instead of or in addition to light pen 93b to allow the user to communicate with processor 85.

Referring again to FIG. 1A, gas delivery system 89 includes gas supply panel 90 and gas or liquid or solid sources 91A–C (additional sources may be added if desired), containing gases or liquids (such as $TiCl_4$) or solids (such as $TiI_3$) that may vary depending on the desired processes used for a particular application. Generally, the supply line for each of the process gases includes a shut-off valve (not shown) that can be used to automatically or manually shut off the flow of process gas, as well as a mass flow controller (not shown) that measures the flow of gas or liquid through each of the supply lines. The rate at which the process and carrier gases including, for example, titanium tetrachloride ($TiCl_4$) vapor, helium (He), argon, and nitrogen ($N_2$) and/or other dopant or reactant sources, are supplied to reaction chamber 30 also is controlled by temperature-based liquid or gas mass flow controllers (MFCs) (not shown) and/or by valves (not shown). Of course, it is recognized that other compounds may be used as deposition and clean sources. In alternative embodiments, the rate at which the process and carrier gases are supplied to reaction chamber 30 also may be controlled by a pressure-based fixed or variable aperture. When toxic gases (for example, ozone or halogenated gas) are used in the process, the several shut-off valves may be positioned on each gas supply line in conventional configurations. Gas supply panel 90 has a mixing system which receives the deposition process and carrier gases (or vaporized liquids) from the sources 91A–C for mixing and sending to a central gas inlet 44 in a gas feed cover plate 45 via supply lines 92A–C. In the specific embodiment, the mixing system, the input manifold to the mixing system, and the output manifold from the mixing system to the central inlet 44 may be made of nickel or of a material such as aluminum plated with nickel.

When a liquid source is used, there are many different ways to introduce a source gas using a liquid source in a CVD system. One way is to confine and heat the liquid in an ampule so that the vapor pressure provides a stable flow of the vaporized source that is sufficient for the deposition process. The ampule is typically not filled with liquid, but has a "head space" over the liquid, acting as a vapor reservoir. Because the vapor pressure depends on the temperature of the liquid, precise temperature control of the liquid source is important. A mass flow controller (MFC) may be used to control the output of the source gas to the chamber.

Another way to introduce a source gas using a liquid source is to bubble a carrier gas, such as helium, through the liquid. The carrier gas provides a head pressure over the liquid and carries the vapor downstream to the chamber. The liquid may be temperature-controlled to maintain a constant vapor partial pressure. It is desirable to heat the liquid above the highest expected ambient temperature of the environment in which the ampule is located, so that a constant temperature may be maintained using only a heater. As discussed above, a MFC may be used to control the carrier gas/vapor mixture to the chamber. As an alternative to using an MFC, which operates on a principle of thermal mass transfer and is typically calibrated to a particular gas, a pressure-regulating device may be used to control the output of the source gas to the chamber. One such device is an aperture, or orifice, that acts to throttle the gas flow and hence allows a higher pressure to be maintained on one side of the orifice than the other. By controlling the chamber (output) pressure, bubbler gas flow, and liquid temperature, a fixed orifice may maintain a constant pressure over the liquid and hence a constant vapor concentration in the source gas. As a variation of this technique, an additional gas source, such as argon, that provides relatively small volumes of gas to the head space over the liquid may be utilized to maintain the head pressure despite other changes, such as the temperature of the liquid, for example. This pressurizing gas may be used with sources incorporating either an MFC or orifice on the source output.

In other embodiments, the gas mixing system may include a liquid injection system.to provide a source gas from a vaporized liquid source into the chamber. A liquid injection system Vaporizes a measured quantity of liquid into a carrier gas stream. Because this type of system does not depend on the vapor pressure of the liquid for operation, the liquid does not need to be heated. A liquid injection system is preferred in some instances as it provides greater control of the volume of reactant liquid introduced into the gas mixing system compared to bubbler-type sources.

Liquid heat exchange system 6 delivers liquid to various components of chamber 30 to maintain these components at a suitable temperature during the high temperature processing. This system 6 acts to decrease the temperature of some of these chamber components in order to minimize undesired deposition onto these components due to the high temperature processes. As seen in FIG. 1A, heat exchange passages 79 within gas feed cover plate 45 allow the heat exchange liquid to circulate through gas feed cover plate 45, thus maintaining the temperature of gas feed cover plate 45 and adjacent components. Liquid heat exchange system 6 includes connections (not shown) that supply the liquid (such as water) through a heat exchange liquid manifold (not shown) for delivering the liquid to the gas distribution system including faceplate 40 (discussed below). A water flow detector detects the water flow from a heat exchanger (not shown) to enclosure assembly.

Figure 2:
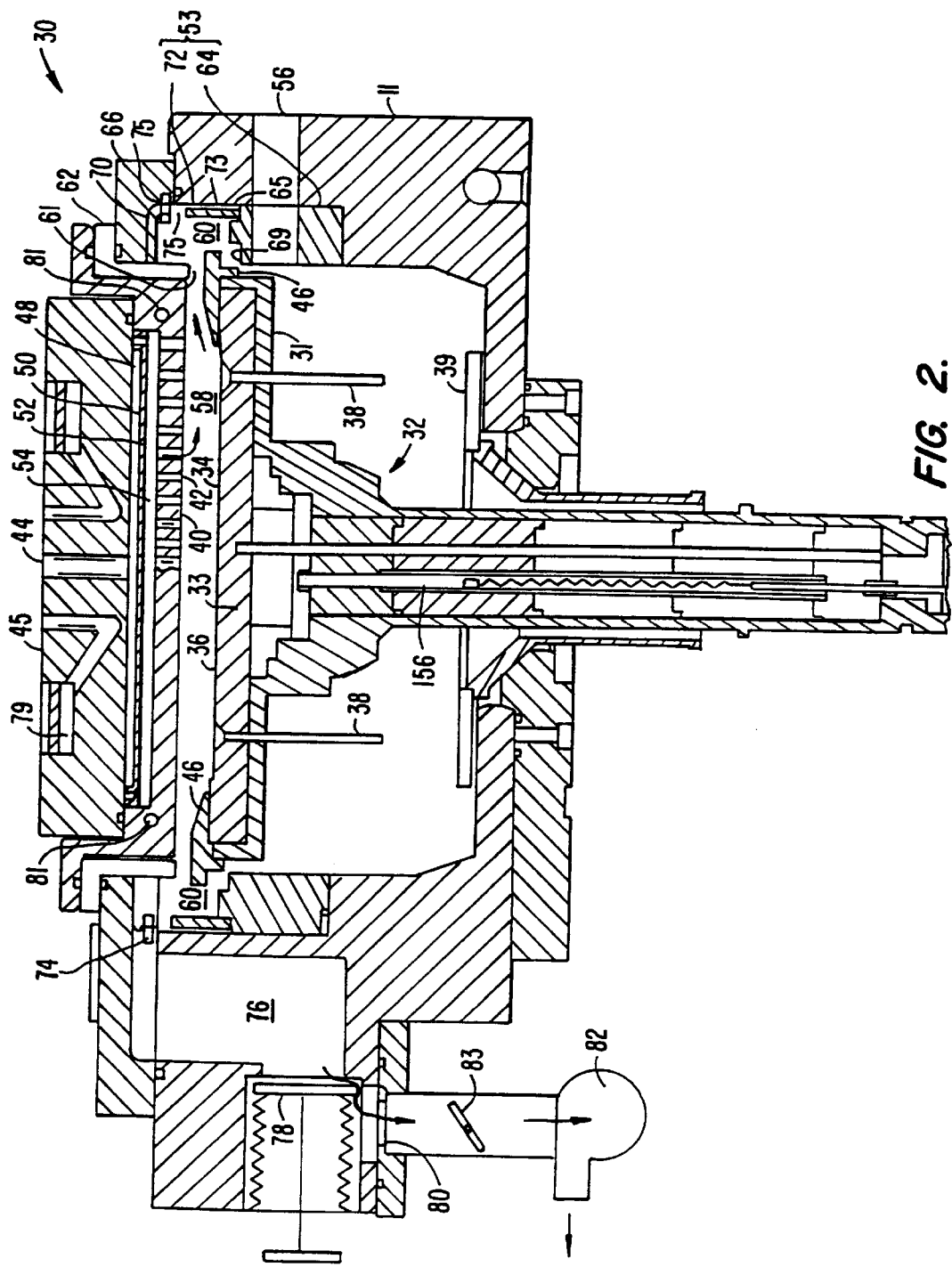
FIG. 2 is a simplified cross-sectional view of the deposition chamber, according to an embodiment of the present invention.

FIG. 2 is a cross-sectional view showing additional features of the chamber 30. A resistively-heated pedestal 32 supports wafer 36 in a wafer pocket 34. Pedestal 32 may be moved vertically between processing positions (for example, as shown in FIG. 2) and a lower loading position using a self-adjusting lift mechanism, described in detail in commonly-assigned U.S. patent application Ser. No. 08/892, 612, (filed on Jul. 14, 1997 and having inventors Talex Sajoto, Leonid Selyutin, and Jun Zhao), entitled "Improved Self-Aligning Lift Mechanism," (Attorney Docket No. AM 2137) the disclosure of which is herein incorporated by reference. Lift pins 38 are slidable within pedestal 32 but are kept from falling out by conical heads on their upper ends. The lower ends of lift pins 38 may be engaged with a vertically movable lifting ring 39 and thus can be lifted above the pedestal's surface. With pedestal 32 in the lower loading position (slightly lower than an insertion/removal opening 56), a robot blade (not shown) in cooperation with the lift pins and the lifting ring transfers wafer 36 in and out of chamber 30 through insertion/removal opening 56, which can be vacuum-sealed to prevent the flow of gas into or out of the chamber through insertion/removal opening 56. Lift pins 38 raise an inserted wafer (not shown) off the robot blade, and then the pedestal rises to raise the wafer off the lift pins onto the wafer pocket on the upper surface of the pedestal. A suitable robotic transfer assembly is described in commonly-assigned U.S. Pat. No. 4,951,601, issued to Maydan, the complete disclosure of which is incorporated herein by reference.

Through the use of the self-aligning lift mechanism, pedestal 32 then further raises wafer 36 into the processing position, which is in close proximity to a gas distribution faceplate (hereinafter "showerhead") 40. The process gas is injected into reactor 30 through central gas inlet 44 in gas-feed cover plate 45 to a first disk-shaped space 48 and from thence through passageways 50 in a baffle plate (or gas blocker plate) 52 to a second disk-shaped space 54 to showerhead 40. Showerhead 40 includes a large number of holes or passageways 42 for jetting the process gas into process zone 58.

As indicated by the arrows, the process gas jets from holes 42 in showerhead 40 into processing zone 58 between the showerhead and the pedestal, so as to react at the surface of wafer 36. The process gas byproducts then flow radially outward across the edge of wafer 36 and a flow restrictor ring 46 (described in more detail below), which is disposed on the upper periphery of pedestal 32 when pedestal 32 is in the processing position. From thence, the process gas flows through choke aperture 61 formed between the bottom of annular isolator 62 and the top of chamber wall liner assembly 53 into pumping channel 60. Upon entering pumping channel 60, the exhaust gas is routed around the perimeter of the process chamber, to be evacuated by the vacuum pump 82. Pumping channel 60 is connected through exhaust aperture 74 to pumping plenum 76. As discussed in greater detail below, exhaust aperture 74 restricts the flow between the pumping channel and the pumping plenum. Valve 78 gates the exhaust through exhaust vent 80 to vacuum pump 82. Throttle valve 83 is controlled by the system controller (not shown in this view) according to a pressure control program stored in memory (not shown) which compares a measured signal from a pressure sensor (not shown), such as a manometer, against a desired value which is stored in memory or generated according to the control program.

The sides of annular pumping channel 60 generally are defined by ceramic ring 64, a chamber lid liner 70, a chamber wall liner 72, and an isolator 62. Ceramic chamber liners of themselves are well known, for example, as described in commonly-assigned U.S. Pat. No. 5,366,585, issued to Robertson et al., the disclosure of which is hereby incorporated by reference. Chamber lid liner 70 is placed on the side of pumping channel 60 facing a lid rim 66 and conforms to the shape of the lid. Chamber wall liner 72 is placed on the side of pumping channel 60 facing main chamber body 11. Both liners are preferably made of a metal, such as aluminum, and may be bead blasted to increase the adhesion of any film deposited thereon. Lid and wall chamber liners 70 and 72 are sized as a set. Chamber lid liner 70 is detachably fixed to lid rim 66 by a plurality of pins 75 that also electrically connect the lid liner to the lid rim. However, chamber wall liner 72 is supported on a ledge 65 formed on the outer top of ceramic ring 64 and is precisely formed to have a diameter such that radial gap 73 is formed between chamber wall liner 72 and main chamber body 11, and so that axial gap 75 is formed between the lid and chamber liners. Choke aperture 61, which is fully (unbroken) annular, is formed between isolator 62 and flow restrictor ring 46.

Choke aperture 61 has a substantially smaller width than the depth of processing zone 58 between showerhead 40 and wafer 36, and is substantially smaller than the minimum lateral dimensions of circumferential pumping channel 60, for example by at least a factor of five. The width of the choke aperture 61 is made small enough, and its length long enough, so as to create sufficient aerodynamic resistance at the operating pressure and gas flow so that the pressure drop across choke aperture 61 is substantially larger than any pressure drops across the radius of the wafer or around the circumference of the annular pumping channel. In practice, it is not untypical that choke aperture 61 introduces enough aerodynamic impedance so that the pressure drop from the middle of the wafer to within the pumping channel is no more than 10% of the circumferential pressure drop within the pumping channel. The constricted exhaust aperture performs a function similar to that of the choke aperture by creating an aerodynamic impedance, creating a nearly uniform pressure around circumferential pumping channel 60.

Motors and optical sensors (not shown) are used to move and determine the position of movable mechanical assemblies such as throttle valve 83 and pedestal 32. Bellows (not shown) attached to the bottom of pedestal 32 and chamber body 11 form a movable gas-tight seal around the pedestal. The pedestal lift system, motors, gate valve, plasma system, including an optional remote plasma system 4 (which may be used to provide chamber clean capability using a remote plasma formed using, for example, a microwave source), and other system components are controlled by processor 85 over control lines 3 and 3A–D, of which only some are shown.

Figure 3:
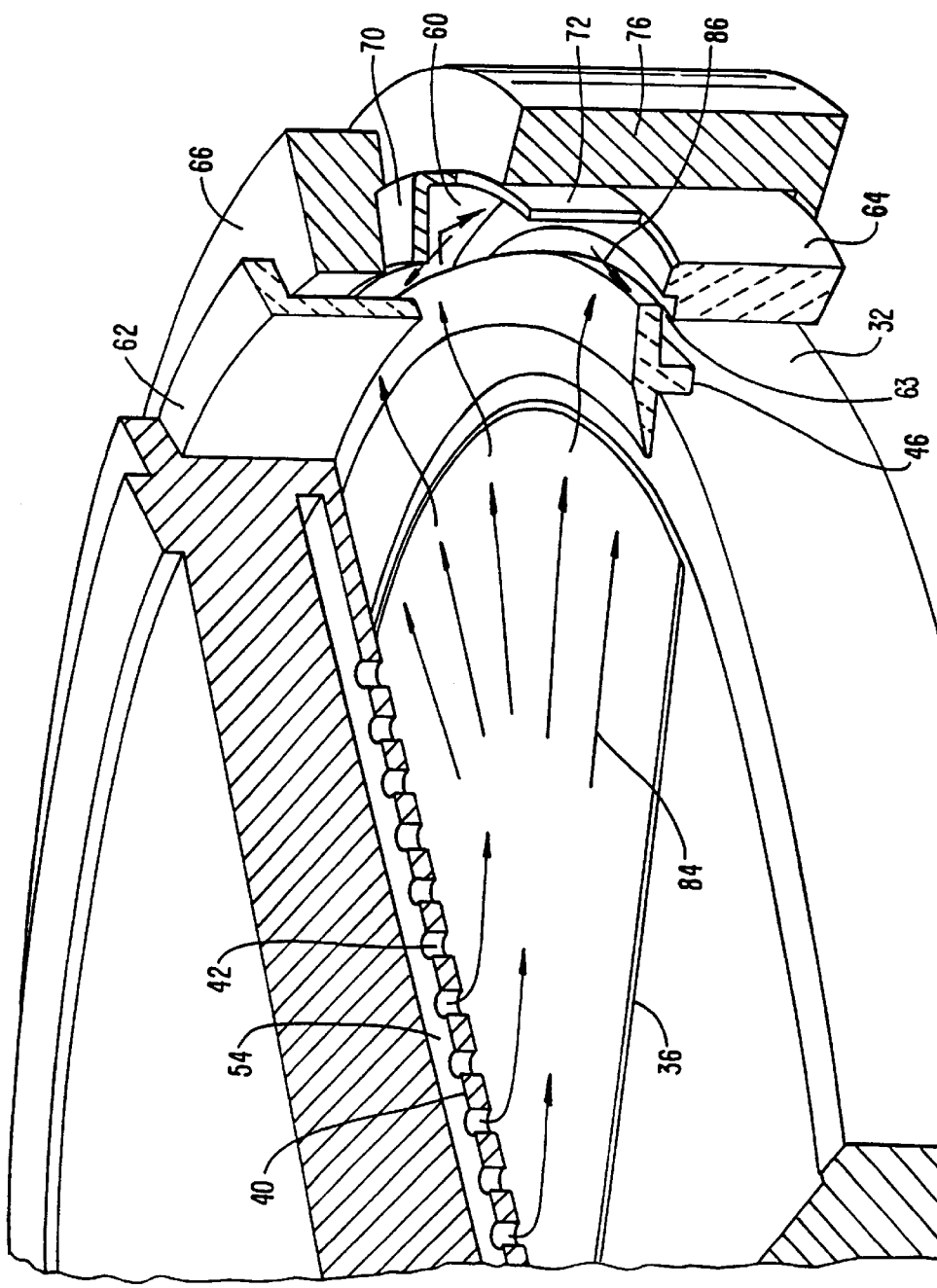
FIG. 3 shows a simplified, partially-sectioned perspective view of the flow of gas across a wafer and into the exhaust system, according to an embodiment of the present invention.

FIG. 3 is a simplified, partially-sectioned, perspective view of pedestal 32, liners 70 and 72, isolator 62, ring 64, and pumping channel 60. This figure shows the flow of processing gas out of nozzles 42 in showerhead 40 towards wafer 36, then radially outward flow 84 over wafer 36. Thereafter, the gas flow is deflected upwardly over the top of restrictor ring 46 into pumping channel 60. In pumping channel 60, the gas flows along circumferential path 86 towards the vacuum pump.

Pumping channel 60 and its components are designed to minimize the effects of unwanted film deposition by directing the process gas and byproducts into the exhaust system. One approach to reducing unwanted depositions uses purge gas to blanket critical areas, such as ceramic parts and the heater edge and backside. Another approach is to design the exhaust system to direct the flow of reactive gas away from critical areas. The exhaust flow may form "dead zones", where little gas movement occurs. These dead zones approximate a purge gas blanket in that they displace reactive gases in that area and reduce unwanted depositions.

The present invention inhibits unwanted deposition on the pedestal and other parts of the chamber in other ways. Specifically, the present invention utilizes flow restrictor ring 46 to minimize gas flow beyond the pedestal to the bottom of the chamber. In accordance with embodiments of the present invention, deposition of titanium using titanium tetrachloride (as described in further detail below) has flow rates significantly higher than conventional methods used in conventional deposition systems for forming other films having titanium. For example, a titanium deposition process may require a flow rate of about 15 liters/minute whereas depositing a titanium nitride layer from tetrakis-dimethylamido-titanium, for example, in a similar PECVD system may require a flow rate of about 5 liters/minute. In various embodiments, the restrictor ring covers portions of the top and edge of the pedestal, so that any undesired films deposit on the ring, instead of on the pedestal or on the bottom of the chamber. In other embodiments, the flow restrictor ring may also serve as an edge or shadow ring by extending slightly over the edge of the wafer to prevent deposition on the edge of the wafer. Advantageously, the flow restrictor ring minimizes the risk of unwanted deposition (with its associated problems) that might otherwise occur with this higher flow rate, which may alter the purge gas flow and dead zone patterns. Chamber lid 66 may be easily removed for cleaning, enabling access to the relatively inexpensive restrictor ring, which may then be lifted out and thoroughly cleaned using chemical and/or mechanical processes.

Flow restrictor ring 46 also forms a gas aperture with ceramic ring 64, similar to the choke and exhaust apertures discussed above. Channel 63 is formed between flow restrictor ring 46 and ceramic ring 64. The communication of gas between the portions of the chamber volume above and below the wafer pedestal may be controlled by varying the length and width of channel 63.

Flow restrictor ring 46 may be made of any of several materials, depending on the particular process and its related deposition and cleaning chemistries. The ring should be made of a material that is compatible with the chemistries involved. Another consideration is the thermal conductivity of the ring, which may be chosen to increase or decrease the thermal loss from the edge of the pedestal and wafer. In plasma-enhanced processes, an electrically-conductive ring may alter the plasma shape, or may allow arcing to other chamber components or the wafer. In one embodiment suitable for titanium deposition, flow restrictor ring 46 is made of fused silica because this material has relatively low thermal conductivity and because it is not electrically conductive. In another embodiment, the flow restrictor ring may be made of titanium for a deposition process for a titanium-containing layer because the ring material will not contaminate the deposited layer.

Referring again to FIG. 1A, flow restrictor ring 46 is supported by pedestal 32 during processing, as mentioned above. When the pedestal is lowered for wafer unloading and loading, the restrictor ring sits on ceramic ring 64 in ledge 69. As the pedestal supporting the next wafer is raised into processing position, it picks up the flow restrictor ring. At the pressures used in the chamber for the titanium processes according to embodiments of the invention, gravity is sufficient to hold both the wafer (disposed in the wafer pocket) and the restrictor ring on the pedestal.

Figure 4A:
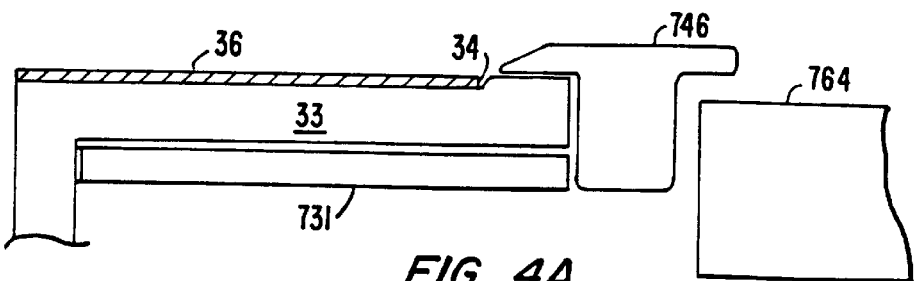
FIGS. 4A–4E illustrate various embodiments of flow restrictor rings in relation to heat shields and ceramic liners.
Figure 4B:
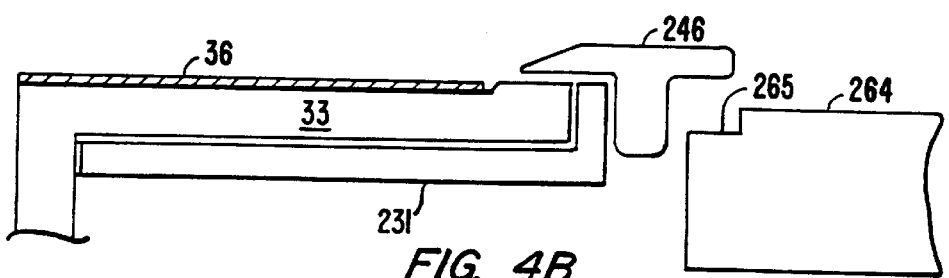
Figure 4C:
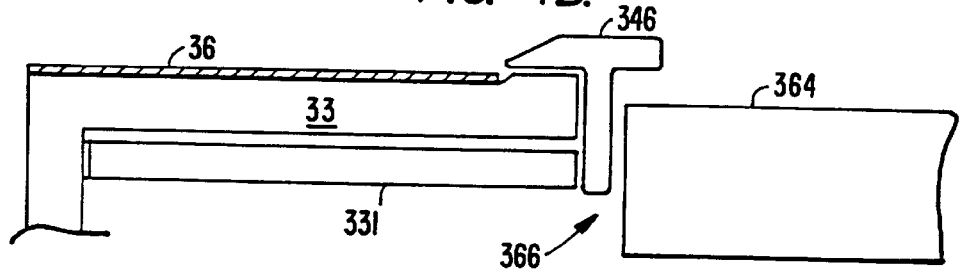
Figure 4D:
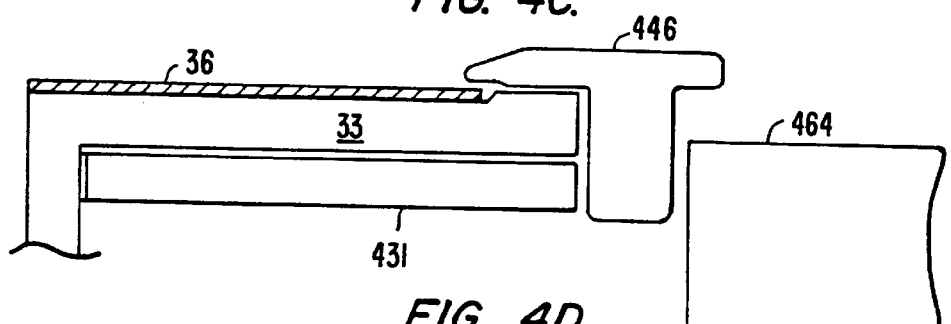
Figure 4E:
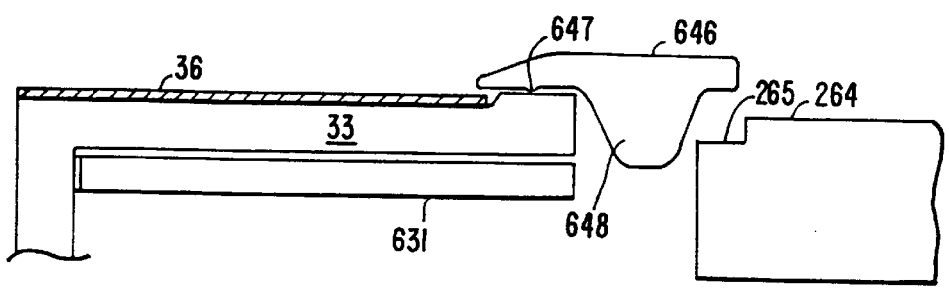

FIGS. 4A–4E show some of the various embodiments of this aspect of the invention. The various features shown in FIGS. 4A–4E may be combined or used separately, according to different embodiments. FIG. 4A shows an embodiment where restrictor ring 746 substantially fills the gap between heater assembly 33 and ceramic liner 764, covering the edge of heater assembly 33 and heat shield 731. FIG. 4B shows another embodiment where heat shield 231 wraps around the edge of heater assembly 33. In another aspect of this embodiment, ceramic liner 264 has a ledge 265 to receive restrictor ring 246 when pedestal 33 is lowered. In contrast to the embodiment shown in FIG. 4B, FIG. 4C shows another embodiment in which ceramic ring liner 364 is thicker and extends further toward the edge of the heater assembly, thereby reducing the gap 366 between the heater assembly and the ceramic liner. Flow restrictor ring 346 occupies additional volume in gap 366, and extends to cover the edge of heater assembly 33 and fused silica heat shield 331. The inner diameter of ring 346 of FIG. 4C also extends to abut the edge of the wafer pocket to shield the pedestal edge outside the pocket, thereby minimizing deposition on the pedestal edge. FIG. 4D shows an embodiment where the inner diameter of restrictor ring 446 overlaps the outer diameter of wafer 36. Purge gas passageways (not shown) may be incorporated into restrictor ring 446 to convey purge gas originating below heater assembly 33 to the edge of wafer 36. Similarly to the embodiment of FIG. 4D, FIG. 4E illustrates an embodiment where the inner diameter of restrictor ring 646 extends to overlap the outer edge of wafer 36 to act as an edge or shadow ring, as well as a flow restrictor. The distance that the inner diameter of restrictor ring 646 extends to overlap the outer edge of wafer 36 may vary with different embodiments. Additionally, ring 646 may have multiple, such as three, bosses 647 (that may be relatively evenly spaced to provide stability) to provide space between the wafer/pedestal and ring 646 such that a substantial portion of ring 646 does not contact the heater pedestal 33. Alternatively, bosses 647 may be replaced with an annular boss to provide the space between the wafer pedestal and ring 646. Thus, ring 646 does not become overly hot due to contact with the heater pedestal, minimizing deposition on ring 646. Another aspect of this embodiment is the tapered bottom portion 648 of ring 646 which facilitates alignment and seating of the ring 646 between pedestal 33 and chamber liner 264. Each tapered side of tapered bottom portion 648 also protects pedestal 33 and liner 264, respectively, from breakage due to impact during seating. In some embodiments, only one or both sides may be tapered.

The flow restrictor ring in accordance with the specific embodiments shown in FIGS. 4A–4E also provides the benefit of reducing the overall chamber volume, and hence reducing the total area in the chamber to be cleaned and reducing the residence time of the gas. Further, the flow restrictor ring also minimizes the likelihood of gas flowing from the processing zone into the chamber volume below the pedestal at the bottom of the chamber, thereby reducing unwanted depositions in this area to improve the dry clean efficiency.

Some aspects of the CVD apparatus discussed above are common to an exemplary CVD chamber, as may be described in detail in commonly-assigned U.S. patent application Ser. No. 08/348,273 (filed on Nov. 30, 1994 and having inventors Zhao et al.), the disclosure of which is incorporated herein by reference. Other aspects of CVD apparatus 10 in accordance with the present invention are described in further detail below.

B. System Control

The processes for depositing the film and for dry cleaning the chamber can be implemented using a computer program product that is executed by processor 85. The computer program code can be written in any conventional computer readable programming language such as, for example, 68000 assembly language, C, C++, Pascal, Fortran, or other language. Suitable program code is entered into a single file, or multiple files, using a conventional text editor and is stored or embodied in a computer-usable medium, such as a memory system of the computer. If the entered code text is in a high-level language, the code is compiled, and the resultant compiler code is then linked with an object code of precompiled WINDOWS™ library routines. To execute the linked compiled object code, the system user invokes the object code, causing the computer system to load the code in memory, from which the CPU reads and executes the code to perform the tasks identified in the program.

Figure 5:
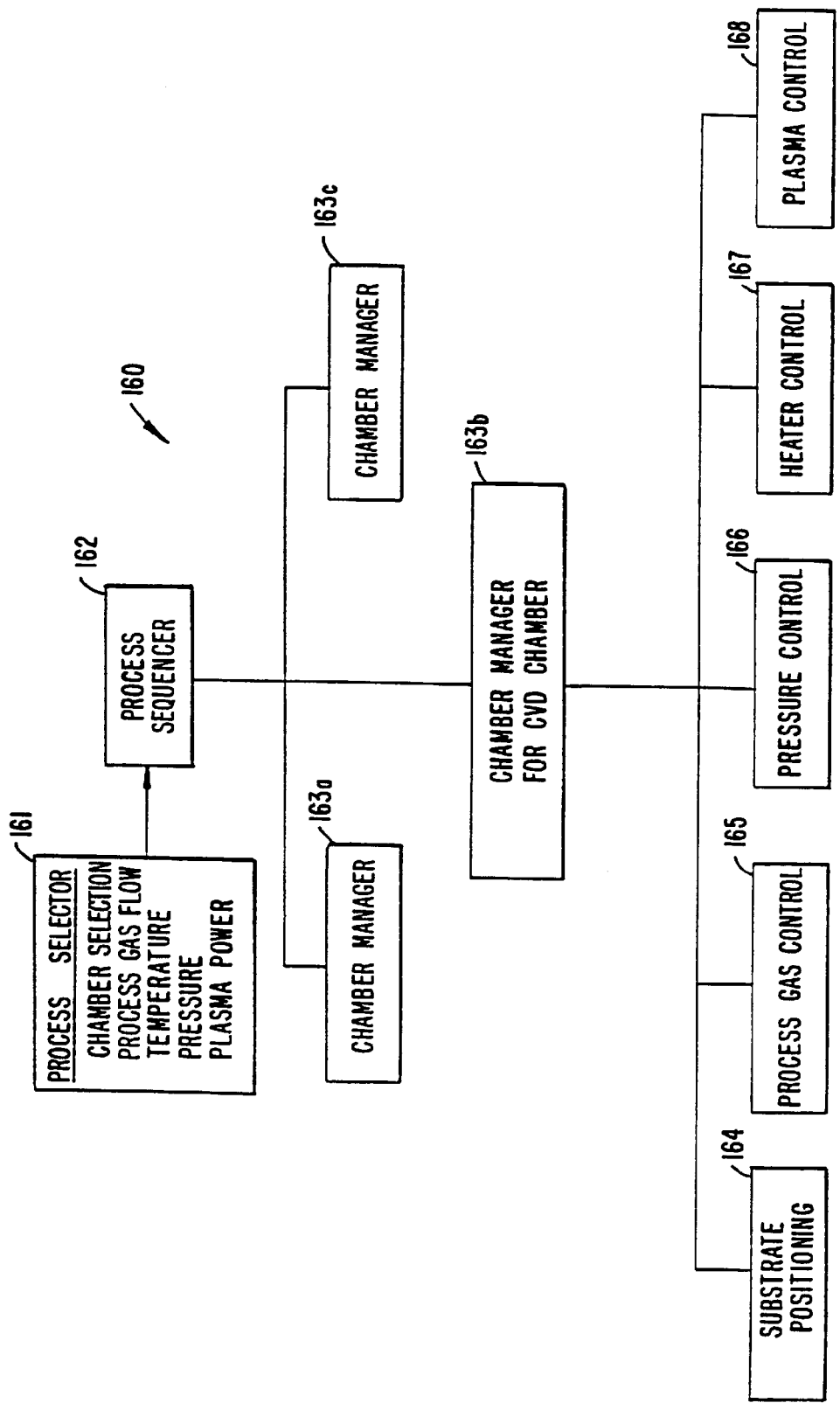
FIG. 5 shows an illustrative block diagram of the hierarchical control structure of the system control software, according to an embodiment of the present invention.

FIG. 5 is an illustrative block diagram of the hierarchical control structure of the system control software, computer program 160, according to a specific embodiment. Using a light pen interface, a user enters a process set number and process chamber number into a process selector subroutine 161 in response to menus or screens displayed on the CRT monitor. The process sets, which are predetermined sets of process parameters necessary to carry out specified processes, are identified by predefined set numbers. Process selector subroutine 161 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as high- and low-frequency RF power levels and the high-frequency and low-frequency RF frequencies, (and in addition, microwave generator power levels for embodiments equipped with remote microwave plasma systems) cooling gas pressure, and chamber wall temperature. Process selector subroutine 161 controls what type of process (deposition, wafer cleaning, chamber cleaning, chamber gettering, reflowing) is performed at a certain time in chamber 30. In some embodiments, there may be more than one process selector subroutine. The process parameters are provided to the user in the form of a recipe and may be entered utilizing the light pen/CRT monitor interface.

The signals for monitoring the process are provided by the analog input board and digital input board of the system controller, and the signals for controlling the process are output on the analog output board and digital output board of CVD system 10.

A process sequencer subroutine 162 comprises program code for accepting the identified process chamber and set of process parameters from process selector subroutine 161, and for controlling operation of the various process chambers. Multiple users can enter process set numbers and process chamber numbers, or a single user can enter multiple process set numbers and process chamber numbers, so sequencer subroutine 162 operates to schedule the selected processes in the desired sequence. Preferably, sequencer subroutine 162 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out. Conventional methods of monitoring the process chambers can be used, such as polling. When scheduling which process is to be executed, sequencer subroutine 162 can be designed to take into consideration the present condition of the process chamber being used in comparison with the desired process conditions for a selected process, or the "age" of each particular user-entered request, or any other relevant factor a system programmer desires to include for determining scheduling priorities.

Once sequencer subroutine 162 determines which process chamber and process set combination is going to be executed next, the sequencer subroutine 162 initiates execution of the process set by passing the particular process set parameters to a chamber manager subroutine 163a–c which controls multiple processing tasks in a process chamber 30 according to the process set determined by sequencer subroutine 162. For example, the chamber manager subroutine 163b comprises program code for controlling CVD operations in process chamber 30. Chamber manager subroutine 163b also controls execution of various chamber component subroutines which control operation of the chamber components necessary to carry out the selected process set. Examples of chamber component subroutines are substrate positioning subroutine 164, process gas control subroutine 165, pressure control subroutine 166, heater control subroutine 167, and plasma control subroutine 168. Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in process chamber 30. In operation, chamber manager subroutine 163b selectively schedules or calls the process component subroutines in accordance with the particular process set being executed. Chamber manager subroutine 163b schedules the process component subroutines much like sequencer subroutine 162 schedules which process chamber 30 and process set are to be executed next. Typically, chamber manager subroutine 163b includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIG. 5. Substrate positioning subroutine 164 comprises program code for controlling chamber components that are used to load the substrate onto pedestal 32 and, optionally, to lift the substrate to a desired height in chamber 30 to control the spacing between the substrate and showerhead 40. When a substrate is loaded into process chamber 30, heater assembly 33 is lowered to receive the substrate in wafer pocket 34, and then is raised to the desired height. In operation, substrate positioning subroutine 164 controls movement of pedestal 32 in response to process set parameters related to the support height that are transferred from chamber manager subroutine 163b.

Process gas control subroutine 165 has program code for controlling process gas composition and flow rates. Process gas control subroutine 165 controls the open/close position of the safety shut-off valves, and also ramps up/down the mass flow controllers to obtain the desired gas flow rate. Process gas control subroutine 165 is invoked by the chamber manager subroutine 163b, as are all chamber component subroutines, and receives subroutine process parameters related to the desired gas flow rates from the chamber manager. Typically, process gas control subroutine 165 operates by opening the gas supply lines and repeatedly (i) reading the necessary mass flow controllers, (ii) comparing the readings to the desired flow rates received from chamber manager subroutine 163b, and (iii) adjusting the flow rates of the gas supply lines as necessary. Furthermore, process gas control subroutine 163 includes steps for monitoring the gas flow rates for unsafe rates, and activating the safety shut-off valves when an unsafe condition is detected. Process gas control subroutine 165 also controls the gas composition and flow rates for clean gases as well as for deposition gases, depending on the desired process (clean or deposition or other) that is selected. Alternative embodiments could have more than one process gas control subroutine, each subroutine controlling a specific type of process or specific sets of gas lines.

In some processes, an inert gas such as nitrogen or argon is flowed into chamber 30 to stabilize the pressure in the chamber before reactive process gases are introduced. For these processes, process gas control subroutine 165 is programmed to include steps for flowing the inert gas into chamber 30 for an amount of time necessary to stabilize the pressure in the chamber, and then the steps described above would be carried out. Additionally, when a process gas is to be vaporized from a liquid precursor, for example $TiCl_4$, process gas control subroutine 165 would be written to include steps for bubbling a delivery gas, such as helium, through the liquid precursor in a bubbler assembly, or for introducing a carrier gas, such as helium, to a liquid injection system. When a bubbler is used for this type of process, process gas control subroutine 165 regulates the flow of the delivery gas, the pressure in the bubbler, and the bubbler temperature in order to obtain the desired process gas flow rates. As discussed above, the desired process gas flow rates are transferred to process gas control subroutine 165 as process parameters. Furthermore, process gas control subroutine 165 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 166 comprises program code for controlling the pressure in the chamber 30 by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When pressure control subroutine 166 is invoked, the desired or target pressure level is received as a parameter from chamber manager subroutine 163b. The pressure control subroutine 166 measures the pressure in chamber 30 by reading one or more conventional pressure manometers connected to the chamber, compares the measure value(s) to the target pressure, obtains PID (proportional, integral, and differential) values corresponding to the target pressure from a stored pressure table, and adjusts the throttle valve according to the PID values obtained from the pressure table. Alternatively, pressure control subroutine 166 can be written to open or close the throttle valve to a particular aperture size to regulate the pumping capacity in chamber 30 to the desired level.

Heater control subroutine 167 comprises program code for controlling the temperature of a heater element 107 used to resistively heat pedestal 32 (and any substrate thereon). The heater control subroutine 167 is also invoked by the chamber manager subroutine and receives a target, or set-point, temperature parameter. The heater control subroutine measures the temperature by measuring voltage output of a thermocouple located in pedestal 32, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 32, heater control subroutine 167 gradually controls a ramp up/down of current applied to the loop. Additionally, a built-in fail-safe mode can be included to detect process safety compliance, and can shut down operation of the heating unit if the process chamber 30 is not properly set up. An alternative method of heater control which may be used utilizes a ramp control algorithm, which is described in the co-pending and commonly-assigned U.S. patent application Ser. No. 08/746657, entitled "Systems and Methods for Controlling the Temperature of a Vapor Deposition Apparatus," listing Jonathan Frankel as inventor, filed on Nov. 13, 1996 (Attorney Docket No. AM1680-8/T16301-170), the disclosure of which is hereby incorporated by reference.

In an alternative embodiment, the heater element resistance may be used as an alternative to using a thermocouple, thus potentially eliminating the thermocouple from the heater assembly. By characterizing the resistance of a particular heater element versus temperature, and measuring the current drawn through the heater element at an operating voltage, the temperature of the. heater element during operation may be determined. Preferably, a test wafer with temperature sensors is used-to correlate the heater element temperature to the temperature present on the surface of a wafer. Measuring the voltage at an operating current would provide similar information. In either instance, the controller would use the heater element voltage-current data in lieu of the thermocouple voltage output.

A plasma control subroutine 168 comprises program code for setting low- and high-frequency RF power levels applied to the process electrodes in chamber 30 and heater assembly 32, and for setting the low and high RF frequency employed. Like the previously described chamber component subroutines, plasma control subroutine 168 is invoked by chamber manager subroutine 163b. For embodiments including remote plasma generator 4, plasma control subroutine 168 would also include program code for controlling the remote plasma generator.

C. A Ceramic Heater Assembly

Figure 6:
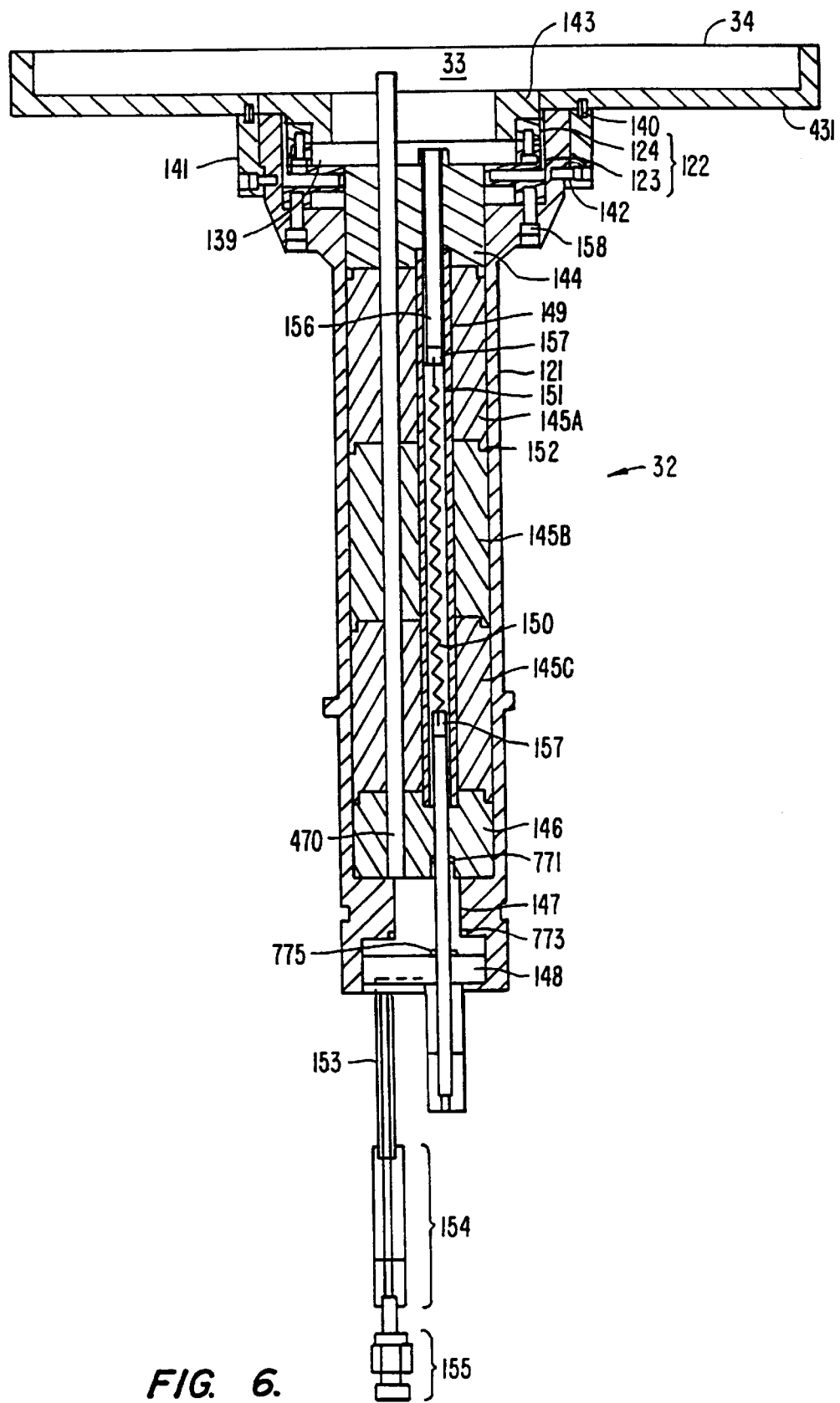
FIG. 6 shows a cross-sectional view of a ceramic pedestal coupled to a metal support shaft, according to an embodiment of the present invention.

FIG. 6 is a simplified cross-sectional view of the pedestal and shaft. Pedestal 32 includes heater assembly 33. Pedestal 32 may be made of materials compatible with use at temperatures of at least about 400° C. and greater in the presence of a corrosive, plasma environment. For example, in some embodiments, stainless steel, nickel, HASTELLOY™-series alloys, HAYNES™ 242 alloy, or ceramic may be used.

In accordance with a specific embodiment, a ceramic heater may provide a lower thermal mass than a similar heater fabricated from metal. This allows faster response time to changes in power from a temperature controller. Because it stores less heat, a ceramic heater will cool faster, for example, when the chamber needs to be disassembled for maintenance purposes. In some applications, it may be useful that the ceramic heater can respond quickly to thermal transient conditions occurring in the processes (e.g., wafer transfer, or changing gas flow and pressure).

Figure 7A:
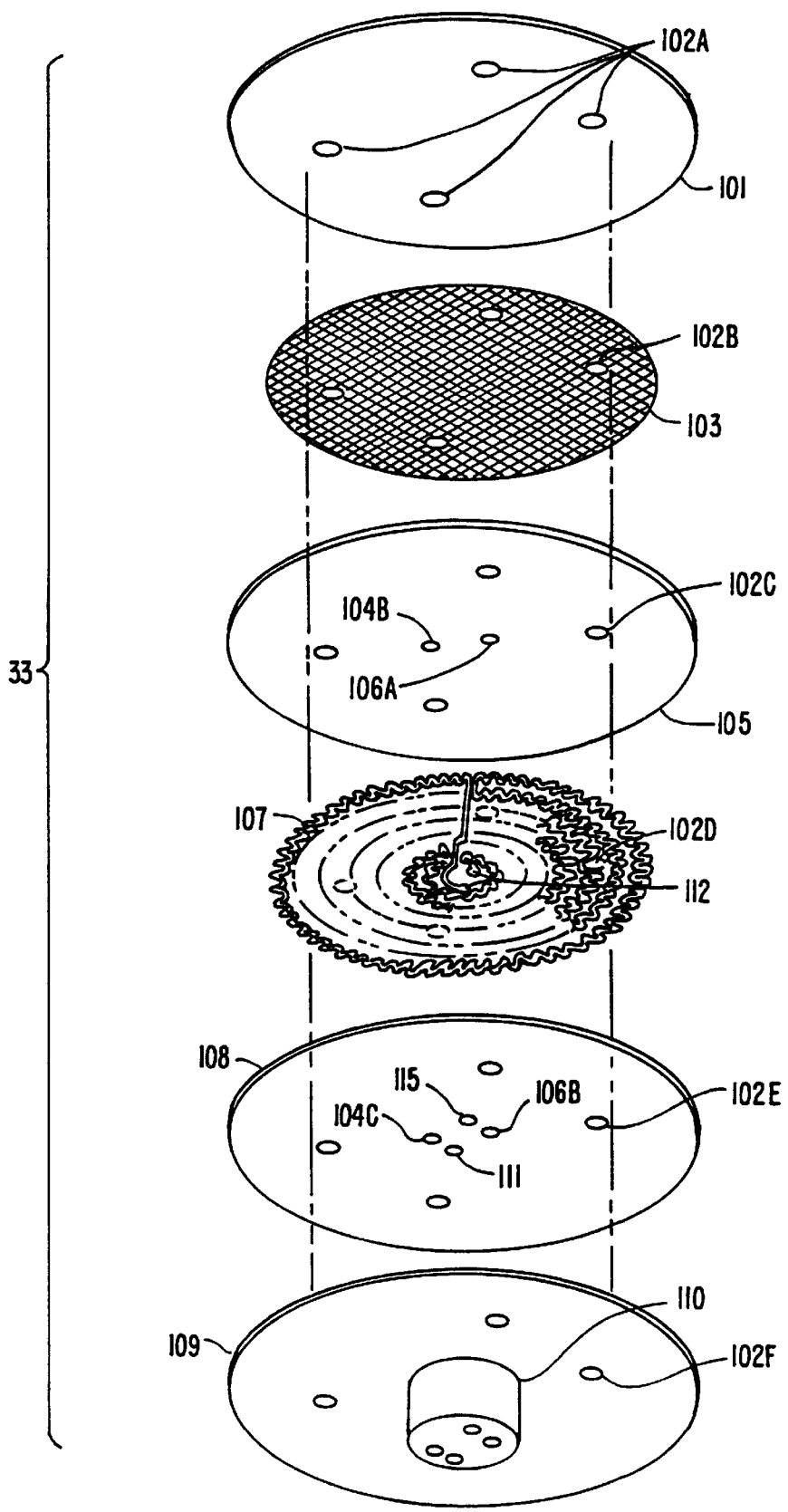
FIG. 7A shows a simplified exploded view of a heater assembly, according to an embodiment of the present invention.
Figure 7B:
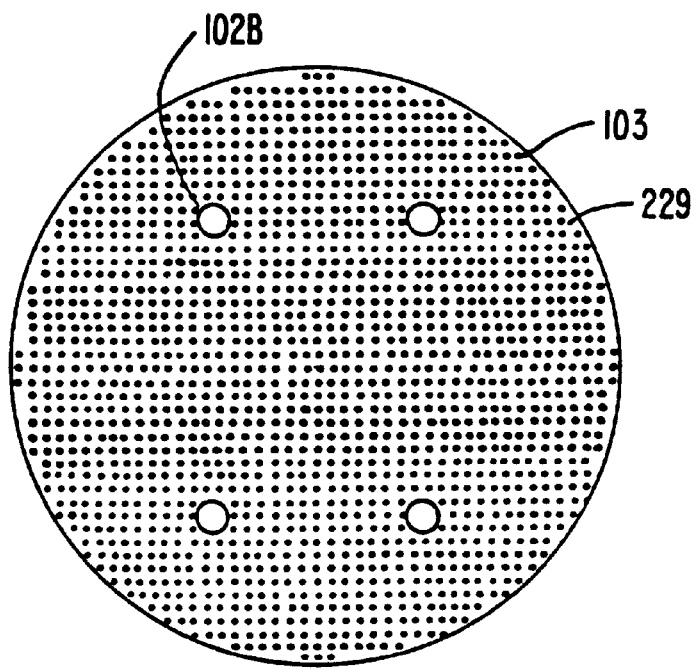
FIG. 7B is a top view of an RF plane in the heater assembly, according to an embodiment of the present invention.

FIG. 7A is a simplified exploded view of heater assembly 33, in accordance with a specific embodiment of the invention. Top plate 101 is a ceramic, such as AlN in preferred embodiments, and is fabricated to include the wafer pocket (not shown) on its upper surface, approximately 0.029 inch deep, as well as wafer lift pin holes 102A. RF plane 103 lies below top plate 101 and includes multiple wafer lift pin holes 102B. At least three lift pins should be used with a corresponding number of lift pin holes. FIG. 7B is a top view of RF plane 103 showing the location of wafer lift pin holes 102B and perforations 229. RF plane 103 may be fabricated out of any suitable conductive material, consistent with the conductivity and power requirements of the RF field generation, assembly fabrication process, and relative thermal expansion of the RF plane and ceramic plates. In this embodiment, RF plane 103 is fabricated out of molybdenum sheet stock approximately 5 mil thick and is perforated with 125 mil diameter holes on a 200 mil center-to-center spacing. RF plane 103 has an outer diameter that is preferably about 0–2 inches larger than the wafer diameter. The perforations are formed using a laser, including a computer-aided design (CAD) or computer-numeric control (CNC) laser; chemical etch, including photo lithographic etching techniques, electronic discharge machining (EDM), or other suitable techniques. Tungsten or other refractory materials could be used to fabricate the RF plane. Molybdenum is preferred over tungsten, for example, because molybdenum has a thermal expansion coefficient which more closely matches that of AlN. Also, molybdenum is more ductile, more resistant to corrosion in preferred deposition chamber environments, and easier to fabricate into thin sheets than tungsten. In particular, the thermal expansion coefficient of AlN is about $5.5 \times 10^{-6}/°$ C., very close to the thermal expansion coefficient of molybdenum which is about $5.55 \times$ $10^{-6}/°$ C., while the thermal expansion coefficient of tungsten is about $5.6 \times 10^{-6}/°$ C.

The perforations in RF plane 103 allow the top AlN plate to bond directly with second AlN plate 105, avoiding ceramic-to-metal bonds. The choice of diameter and spacing of the holes in RF plane 103 is optimized by balancing the requirements of the inter-ceramic bonding process (discussed below) with those of the RF field uniformity. It is important to provide sufficient total perforation area to obtain a reliable inter-ceramic bond, and in a preferred embodiment the total area of the perforations equals about 40% of the area of the RF plane. Area equivalent to the preferred embodiment described above may be accomplished by decreasing the number of holes and increasing their diameter, or increasing the number of holes and decreasing their diameter; however, for a given total bonding area it is desirable to provide a larger number of smaller holes, rather than a smaller number of larger holes, as the former configuration provides better RF uniformity and better bonding. The thickness of RF plane 103 is selected according to the material of plane 103 and inter-ceramic bonding process, such that the thermal expansion of the RF plane does not crack the inter-ceramic bonds within the perforations. In accordance with specific embodiments, an upper limit of thickness for a molybdenum plane may be around 15 mil, while the lower limit of thickness may be about 3 mil. This range of thicknesses provide suitably low electrical resistance to establish a uniform field at the operating RF power level while still being able to carry a suitable level of RF power.

A perforated sheet is preferred to a mesh in many applications because localized "hot spots" in the sheet result in localized higher resistance, which may be spread throughout the sheet. However, similar hot spots in a mesh tend to heat individual wire strands, which tend to spread the heat along the strand, as the wire strand crossover points approximate point contacts and have poor thermal transfer when compared to a sheet. This often results in the mesh strands overheating, damaging the strand and reducing the operating life of the RF mesh electrode. Additionally, these overheated or damaged strands in a mesh can cause non-uniforrnities in the RF field. A perforated sheet tends to self-limit damage in this respect, and provides a superior RF field pattern. Another advantage of using a sheet compared to using a mesh is that as the wire size in the mesh increases, the spacing between the wires also increases. This limits the effective RF sheet resistivity of the mesh. For example, a molybdenum sheet about 4–5 mil thick has a sheet resistivity roughly equivalent to a minimum sheet resistivity of a molybdenum mesh with a peak-to-peak thickness much greater than 5 mil. Additionally, an RF electrode made from sheet stock is flatter than a mesh electrode, thereby allowing a thinner layer of ceramic between the wafer and the RF electrode and allowing more uniform plasma-enhanced treatment during deposition. In the specific embodiment, the distance between RF plane 103 and the wafer is preferably less than about 50 mil, ranging between about 38–42 mil. In other embodiments, this distance may vary.

Figure 7C:
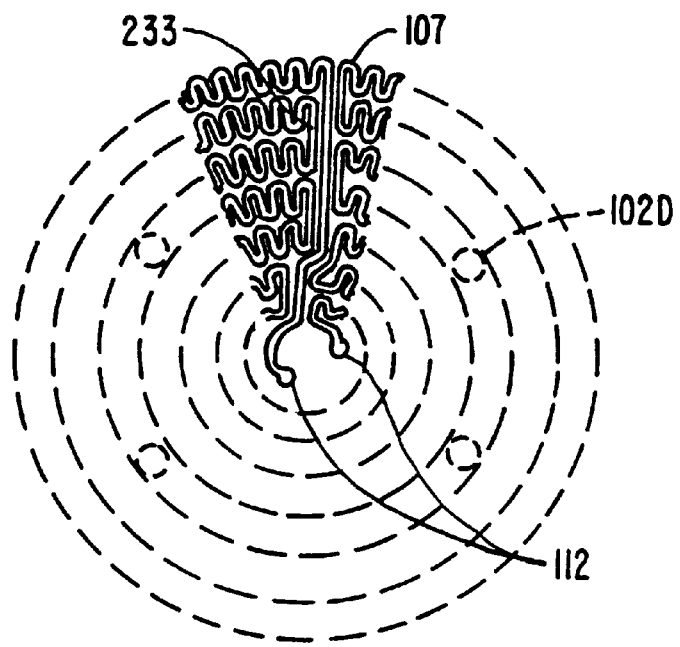
FIG. 7C is a simplified partial top view of a flat ribbon heating element in the heater assembly, according to an embodiment of the present invention.

Referring again to FIG. 7A, second AlN plate 105 isolates RF plane 103 from heating element 107. Heating element 107 is fabricated from molybdenum, but other similar materials, such as tungsten, could be used. The heating element is cut from molybdenum sheet stock approximately 5 mil thick using a laser, including a CAD or CNC laser, chemical etch, including photo lithographic etching techniques, EDM, or other suitable techniques. FIG. 7C is a simplified top view of heater element 107. The thickness chosen for heater element 107 should preferably be within the constraints of the ceramic assembly process, as discussed above. The width and length of heater element 107 is chosen to match the compliance of the voltage supply, as is well known in the art, to achieve suitable power output from the heater, and to provide adequate inter-heater spacing for ceramic-ceramic bonding. For example, a 5 mil thick heater element that is about 90 mil wide and about 325 inches long will have a resistance between about 2.25–3.25 ohms ($\Omega$), preferably about 2.5 $\Omega$ at room temperature and can produce up to about 4 kilowatts (kW). It is important to account for the change in resistivity of the heater element over its intended operating range. For example, the resistance of a molybdenum heater element may increase about 4.3 times when heated from room temperature to about 700° C.

Preferably, the element is cut in a sinuous pattern within the plane of the heater element, as shown in FIG. 7C, rather than simple arcs (not shown) because arcs with a sinuous pattern are stiffer and therefore easier to align during manufacturing. Current flow changes direction as each arc folds back 233 on the adjacent arc of the element, thereby minimizing magnetic fields that may be generated by the heater current, and that may cause a non-uniform deposition by altering the plasma characteristics. A similar cancellation of magnetic fields occurs between the sinusoids within an arc. Fabricating the heater element out of sheet stock rather than using a wire or wire coil provides a heating element with a greater ratio of surface area to cross-section area. This provides a heater element that transfers heat more effectively to the wafer, providing the same heat to the wafer at a lower element temperature than with a similar wire design. This in turn minimizes heater element breakage, thus prolonging heater element lifetime. In addition, the width of heating element 107 may be varied according to a desired thermal profile, or the inter-element spacing may be altered to adjust the element density by adjusting the CNC laser program, for example. This may produce a heater assembly with superior temperature uniformity, or a heater assembly with a particular thermal profile.

Figure 7D:
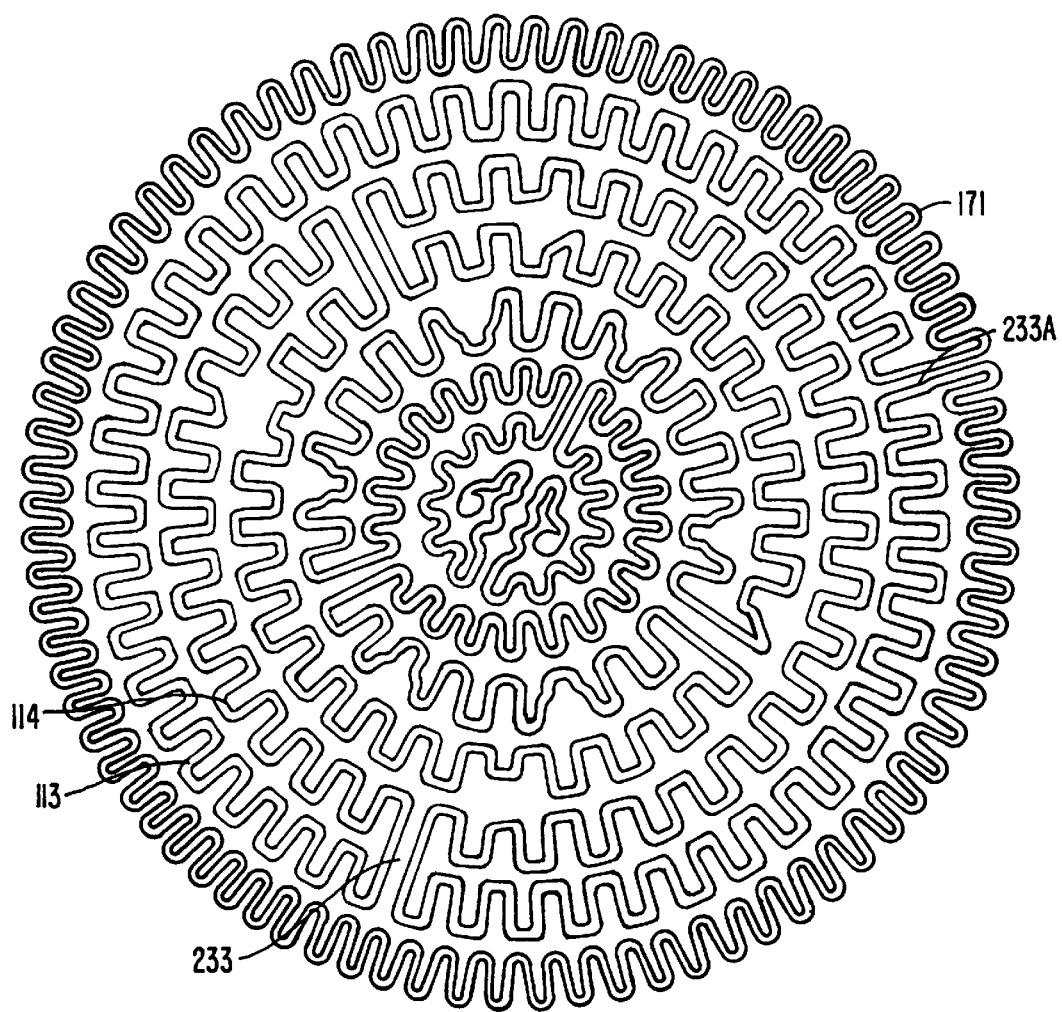
FIG. 7D is a simplified top view of a seamless flat ribbon heating element, according to another embodiment of the present invention.

In contrast to the heater element 107 of FIG. 7C, which shows arc foldbacks 233 located substantially along one radius of the heater to form a "seam" of aligned foldbacks, FIG. 7D illustrates a preferred embodiment of a heater element configuration in which the radial seams between rows of the heater elements resulting from folding back the arcs of each row of the element are offset. For example, the fold back 233 between the second row 113 (from the edge) and the third row 114 is offset from the fold back 233A between the second row 113 and the first row 171, as seen in FIG. 7D. This configuration avoids creating the seam of aligned fold backs, occurring in the configuration shown in FIG. 7C. The seamless configuration of the preferred embodiment improves the heating characteristic of the heater element and thus of the ceramic heater. A specific advantage is that the seamless configuration avoids formation of a cold spot, which may occur with an aligned seam. Such a cold spot can lead to thermal stress and hence to cracking of the ceramic, and can also adversely affect the temperature uniformity of the heater during substrate processing. Temperature uniformity during a deposition process or similar process, such as an etch process, may be an important factor in obtaining suitable process uniformity across a wafer or other substrate heated by the ceramic heater.

FIG. 7D also shows that the trace density of the first row 171 may be increased, relative to the trace density of the second row 113. Varying the trace density (i.e. the density of the sinuous pattern in an arc of the heater element) can compensate for heat lost, for example, from the edge or center of the heater. Heat may be lost from the edge the heater by radiation to the relatively cold walls of the chamber, by convection via the deposition and exhaust gases, or by conduction from the center of the heater down the pedestal shaft. By increasing the trace density, and increasing the resistivity of a row in the heater element, and thus the power generated per unit length of the trace, the length of the trace per unit arc of the row is increased and a non-uniform heat generation is obtained to compensate for heat loss.

Table 1 demonstrates power (Watts) and heat generated (power per unit area per unit length (Watts/inch$^2$ per inch) for each ring in an eight-ring heater element, according to one possible configuration (not shown in a figure). As seen in Table 1, each ring generates the same power per unit area per inch. Such a design should produce a uniform heating pattern. A uniform heating pattern may be appropriate in situations where relatively little heat is lost from the edge or center of the heater. Such a situation may include a BST deposition process in which the chamber wall is maintained at a relatively high temperature of about 250° C.

TABLE 1

Uniform Heat Generation Configuration of a 2147 Watt Heater Element

| Heater Ring | Heat Generated W/in$^2$/in | Power W |
|---|---|---|
| 0 | 9920 | 22 |
| 1 | 9920 | 47 |
| 2 | 9920 | 135 |
| 3 | 9920 | 241 |
| 4 | 9920 | 327 |
| 5 | 9920 | 411 |
| 6 | 9920 | 495 |
| 7 | 9920 | 470 |

Table 2 illustrates the heat generated (power per unit area (Watts/inch$^2$ per inch) for each ring in another possible configuration of an eight-ring heater element, as seen in FIG. 7D. As seen in Table 2, the different rings in this configuration generate different amounts of power per unit area per inch, with relatively more power being generated at the center and edge of the heater element. Non-uniform heat production can compensate for heat lost from the edge and center of the heater, as discussed above. Non-uniform heat production may be more appropriate in situations where relatively more heat is lost from the edge or center of the heater. Such a situation may include a titanium metal deposition process in which the chamber wall is maintained at a relatively low temperature of about 65° C. The heat generation per unit area per inch may be controlled by varying the width of the element in situations where it is more practical to vary the width, such as when the heater element is laser-cut from a thin sheet of metal. In other embodiments, the thickness of the element could also be varied to control the heat generation pattern. Local heat generation may be increased by reducing the width of a portion of the element, which reduces the cross-sectional area of that portion of the element and locally increases the resistance of the element. Reducing the width of the element to increase the resistance also reduces the surface area of the element. Hence, the heat generation is normalized for surface area.

TABLE 2

Non-Uniform Heat Generation Configuration of a 2147 Watt Heater Element

| Heater Ring | Heat Generated W/in$^2$/in | Power W |
|---|---|---|
| 0 | 44150 | 98 |
| 1 | 44150 | 208 |
| 2 | 29250 | 398 |
| 3 | 2660 | 65 |
| 4 | 2660 | 88 |
| 5 | 2660 | 110 |
| 6 | 1170 | 584 |
| 7 | 14680 | 695 |

Referring again to FIG. 7A, second AlN plate 105 has RF feedthrough hole 106A and thermocouple hole 104B, in addition to four lift pin holes 102C, in accordance with a specific embodiment. Heater element 107 provides the paths for lift pin holes 102D, for the RF feedthrough, and for thermocouple 470 in FIG. 6 near the center of the heater element. At each end of heater element 107 are heater contacts 112, as seen in FIG. 7C. Third AlN plate 108 lies between heater element 107, and bottom layer 109, to which AlN heater stub 110 is attached. Bottom layer 109 is formed during the pressure bonding process discussed below. In a preferred embodiment, the resulting stack (without the stub) is about 0.546 inch thick, resulting in a heater with a low thermal mass. The entire assembly may be shorter or longer with the outer diameter being smaller or larger, depending on the design constraints of the particular application. In this embodiment, a thickness of about 2.25 inches provides sufficient room between the flange on the stub and the bottom plate to fit a coupler clamp (discussed below) and a fused silica heat shield (also discussed below). A thinner heat shield or clamp would allow a shorter stub. The stub is preferably short to reduce the thermal gradient across the ceramic heater assembly and also so that the coupler does not interfere with the lowering of the pedestal.

In a preferred embodiment, top AlN plate 101, second AlN plate 105, third AlN plate 108, and AlN stub 110 are formed from hot-pressed AlN. The plates are ground flat and parallel, if necessary, and ground to receive the heater and RF plane electrodes (described below). Alignment holes (not shown) are drilled through top AlN plate 101, second AlN plate 105, and third AlN plate 108 approximately along the center lines of the lift pin holes. Top AlN plate 101, second AlN plate 105, third AlN plate 108, and AlN stub 110 are sand or bead blasted to roughen their surface. RF plane 103 is laid-up on top AlN plate 101 using AlN tape (not shown). That is, a tape cast from a powder of the same AlN material stock used to form the hot-pressed AlN plates and an organic binder is placed over RF plane 103, which is laying on top AlN plate 101. The AlN tape is approximately 10–20 mil thick and one or two layers may be used, resulting in a thin, uniform layer of AlN over RF plane 103. Alternatively, the AlN tape may be laid-up over a template, such as a MYLAR™ template, so that the alignment holes may be cleared, before transferring the AlN tape to RF plane 103. Second AlN plate 105 is then placed over the laid-up assembly of top AlN plate 101, RF plane 103, and the AlN tape. Next, heater element 107 is placed on second AlN plate 105 and laid-up with AlN tape, similarly to RF plane 103 and top AlN plate 101. Third AlN plate is then placed over the laid-up heater element (not shown). Alignment pins, which may be made of graphite, for example, may be placed through the alignment holes to facilitate alignment of top AlN plate 101, RF plane 103, second AlN plate 105, heater element 107, and third AlN plate 108. Heater and RF electrodes are placed in their previously-ground locations (discussed in further detail below). This stack of top AlN plate 101, RF plane 103, AlN tape, second AlN plate 105, heater element 107, AlN tape, and third AlN plate is then placed in a pressure-bonding die with top AlN plate 101 at one end of the die, leaving a surface of third AlN plate 108 exposed at the other end of the die. The pressure-bonding die (not shown) provides a cavity to receive the stack described in the preceding sentence. The pressure-bonding die may be made of graphite, for example, and is capable of confining the stack so that essentially unilateral pressure may be applied approximately orthogonal to the major surfaces of the stack. A layer of AlN powder is then applied to the exposed surface (not shown) of third plate 108 and a first pressure-bonding plate (not shown), made of graphite, for example, is placed on this layer of AlN powder. The first pressure-bonding plate has a hole approximately the size of heater stub 110, through which heater stub 110 is placed. A second pressure-bonding plate is placed over the first pressure-bonding plate and heater stub 110.

A hydraulic press (not shown) applies pressure of about 2500 psi between the second pressure-bonding plate and the pressure-bonding die. Simultaneously, the stack and heater stub 110 is heated to a temperature of about 1700° C. These conditions are maintained for between about 30–90 minutes, preferably for about 60 minutes. Under these conditions the AlN tape becomes plastic and flows to fill the perforations in RF plane 103 and inter-element spaces of heater element 107, and bonds the AlN plates together. During pressure-bonding, the AlN tape densifies to approximately half of its original thickness. Additionally, the AlN powder previously applied as the third AlN plate becomes plastic, forming bottom layer 109, and more uniformly distributing the pressure applied to third AlN plate 108 from the first pressure-bonding plate. After pressure-bonding, other operations including grinding and drilling, may be performed to modify the shape of the ceramic components. For example, the alignment holes may be drilled out to become lift pin holes and the heater stub may be grinded to form a flange on its lower portion.

Several sets of pressure-bonding dies, stacks, and pressure-bonding plates may be arranged in a single press, so that several heater assemblies may be formed simultaneously. For a given press size, a shorter overall heater assembly height will allow a greater number of similarly shorter heater assemblies to be pressure-bonded in a single operation. Therefore, heater designs with shorter stubs allow a greater number of heater assemblies to be pressure-bonded than designs with longer stubs. Besides being more robust, ceramic heaters with short ceramic stubs are thus more easily and efficiently manufactured than heaters with long ceramic shafts.

In another embodiment, sub-assemblies of a first AlN plate, an RF plane, a second AlN plate, a heater element, and a third AlN plate may be pressure-bonded as described above, but without the heater stub. The heater stub may be subsequently attached to the sub-assembly in a separate operation. This is especially desirable if the heater stub is long, as discussed in the preceding paragraph.

Figure 8A:
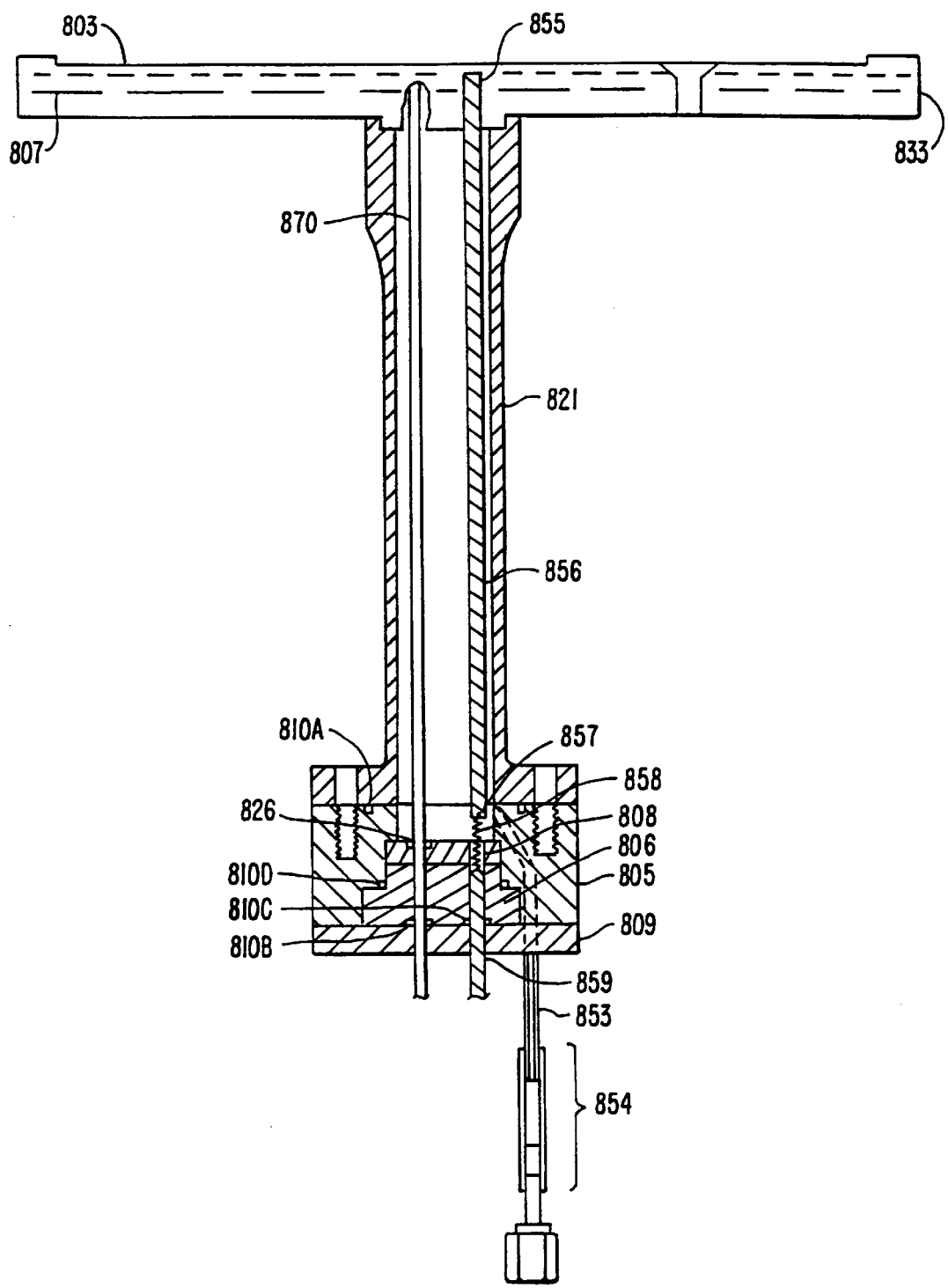
FIG. 8A shows a cross-sectional view of a ceramic pedestal having a long ceramic support shaft that is sealed for use with a purge gas, according to an embodiment of the present invention.

In an alternative embodiment, shown in FIG. 8A, a ceramic support shaft 821 may be attached to heater assembly 833 as described above for attaching a stub. This eliminates the need for a heat choke because the bottom of the shaft is relatively cool, and allows for use of gas-tight O-ring seals 810A, 810B, 810C and 810D to seal the bottom of the shaft. Providing a short shaft end 805 (fabricated out of a good thermal conductor, such as aluminum) and providing for heat exchange passages (not shown) through which may flow water or other liquid, further cools the O-ring seals. Alternatively, a cooled plate (not shown) may be connected to shaft end 805 to provide cooling. O-ring seal 810A seals ceramic shaft 821 to shaft end 805. O-ring seal 810B forms a seal around the spring-loaded, encased thermocouple 870, and O-ring seal 810C seals the RF electrode 859. Similar O-ring seals (not shown) seal the heater element electrodes (not shown), and O-ring seal 810D seals VESPEL™ plug 806 to shaft end 805.

RF standoff rod 856 extends beyond the lower edge of ceramic shaft 821 so that a flexible connector 858, such as a wire coil, may be crimped to RF rod 856 and RF electrode 859. The flexible connector 858 may also be in the form of a z-fold or fan fold in wire, mesh, or strap. In a preferred embodiment, RF rod 856, RF electrode 859, and flexible connector 858 are made of nickel. RF rod 856 can be a solid rod or tubing, as can be portions of the heater rods. Flexible connector 858 provides strain relief to reduce the chance of breaking heater assembly 833 or brazed joint 855 during assembly or thermal cycling. Similar flexible connectors (not shown) connect the heater rods (not shown) to their respective heater electrodes (not shown). Although RF standoff rod 856, encased thermocouple 870, and the heater standoff rods (not shown) are fairly rigid, an insulative plug 808, such as a VESPEL™ plug, may be included to provide electrical isolation to prevent wiring from shorting together. C-ring clips 826, used with each electrode, are used to prevent the bottom electrodes from being pushed in or pulled out. End cap 809 may be bolted to shaft end 805 to compress O-rings 810B–D.

Thermocouple 870 extends beyond heater element 807 to just below RF plane 803. This places the thermocouple between heater element 807 and the substrate (not shown), further within the thermal mass of the heater assembly than would a shallow thermocouple, and allows for better temperature control.

Purge line 853 allows ceramic shaft 821 to be pressurized above chamber pressure with a purge gas, such as nitrogen, argon, or other gas. The purge gas protects components within the shaft, such as brazed joint 855 from oxidation or corrosion, especially at elevated temperatures. Brazed joint 855 joins RF plane 803, which may be molybdenum or tungsten, for example, to RF standoff rod 856. Similar brazed joints (not shown) may connect the heater element and heater standoff rods. Pressurizing ceramic shaft 821 also suppresses RF arcing between RF standoff rod 821 and other components. Purge line 853 may incorporate an aluminum-to-stainless steel transition 854, as described above. Brazed joints discussed above also may be in situ eutectic alloy bonded, as discussed below.

Figure 8B:
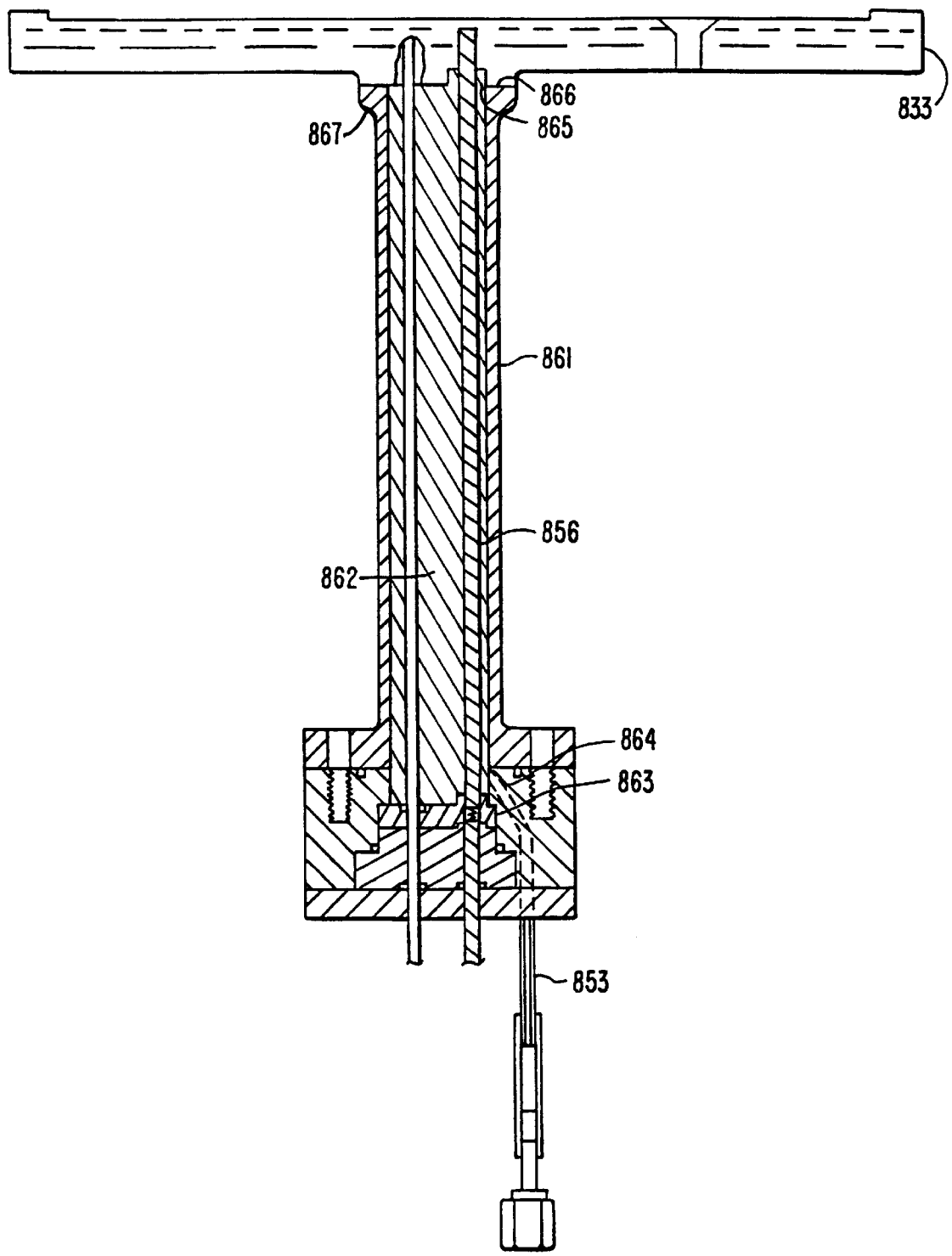
FIG. 8B shows a cross-sectional view of a ceramic pedestal having a long, straight ceramic support shaft that is sealed for evacuation, according to an embodiment of the present invention.

FIG. 8B is another embodiment of a ceramic shaft 861 that may be purged or evacuated through purge line 853. As with the metal shaft assembly shown in FIG. 6, this assembly is filled with a quartz or ceramic plug 862 or plugs. The ceramic plug suppresses arcing between the RF electrode rod 856 and other conductors, such as a heater electrode rod (not shown), when the shaft is evacuated. Evacuating the shaft may provide greater protection against electrode oxidation or corrosion. The use of a clean purge gas may also alleviate oxidation and corrosion of the electrodes, as compared to the case where the electrodes inside the shaft are exposed to the ambient atmosphere inside the processing chamber. Protecting the electrodes from oxidation is more critical for high-temperature processes, such as the. titanium deposition described above.

The ceramic plug 862 is mated to the insulative plug 863 with a counterbore and post 864 to form a complete overlap at the top of the mating joint. It is understood that providing a post on the ceramic plug and a counterbore on the insulative plug is an alternative embodiment of this configuration. This configuration helps to reduce the chance of arcing by eliminating a "line-of-sight" path between the RF rod 856 and other conductors. The ceramic shaft 861 is mated to the heater assembly 833 with an inset 865 and a flange 866, which is radiused to the diameter of the ceramic shaft 861, but could be tapered as an alternative. The inset 865 and flange 866 provide mechanical support between the heater assembly 833 and the ceramic shaft 861 for alignment during assembly and provide greater bonding area, and hence strength, in the bonded joint. The radius 867 between the flange and the shaft distributes stresses more evenly than an square configuration, thus reducing the potential for breakage.

Figure 8C:
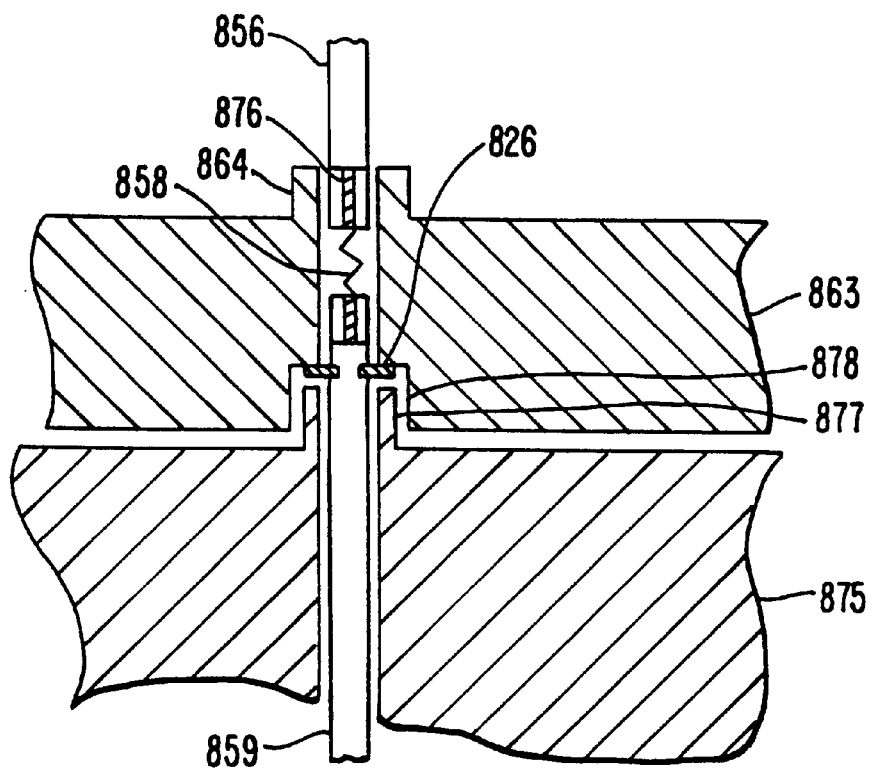
FIG. 8C shows a simplified cross-sectional view of details of a post-and-counterbore joint for an electrical feedthrough.

FIG. 8C is a detailed simplified cross section of the overlap between adjacent plugs provided by a post and counterbore, in accordance with an embodiment of the invention. The insulated plug 863 is mated to a lower plug 875 using a post 877 and a counterbore 878. It is understood that a post could extend from the insulated plug 863 to mate with a counterbore in the lower plug. The flexible connector 858 simplifies assembly and disassembly of the pedestal components and electrodes and the C-clip 826 keeps the electrode 859 and the flexible connector from being displaced or broken if the electrode experiences an externally applied force, such as being pushed or pulled.

Figure 9A:
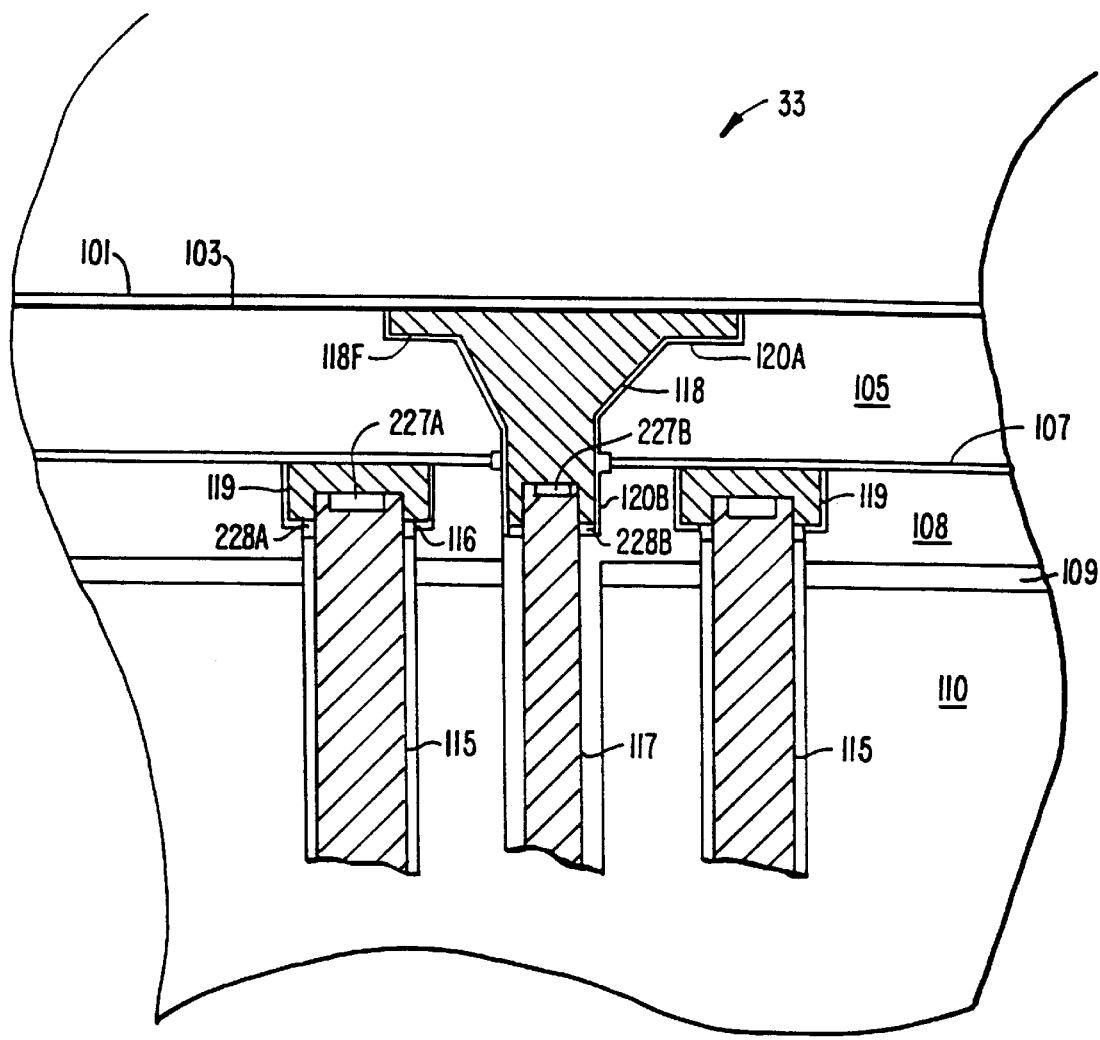
FIG. 9A shows a simplified cross-sectional view of details of electrical connections to the RF plane and to the heater element within the heater assembly, according to an embodiment of the present invention.

FIG. 9A is a simplified partial cross-sectional view of heater assembly 33 showing one embodiment of electrical connections to the RF plane and heating element. There are four holes in the heater stub orthogonal to the major face of the heater assembly. Two of these holes contain heater standoffs 115. A third hole contains RF standoff 117. The fourth hole contains thermocouple assembly (470 in FIG. 6, not shown in FIG. 9A). Thermocouple assembly is a double-sheathed thermocouple, which is spring-loaded so that it is pressed against the top of a blind hole (not shown) in top AlN plate 101, and provides a control signal for the heater controller (not shown).

Molybdenum heater element electrodes 119 and RF electrode 118 are placed in heater electrode pockets 116 and RF electrode pockets 120A and 120B, respectively, prior to pressure-bonding the stack, as discussed above. It is preferred that the electrodes contact the RF plane at a solid surface of the RF plane, and not at a perforation. If the electrodes contact the RF plane at a perforation, the area available for ceramic bonding is reduced, and the-electrical contact area is also reduced, which could form a hot spot during operation. Careful alignment of the electrodes to the RF plane prior to bonding can insure complete metal-to-metal contact.

Heater electrode pockets 116 and RF electrode pockets 120A and 120B are shown larger than heater electrodes 119 and RF electrode 118 for purposes of illustration only. It is likely that the metal electrodes are in intimate contact with the surrounding ceramic material after the pressure-bonding process, as molybdenum becomes ductile under the pressure-bonding conditions. Likewise, molybdenum RF electrode 118 essentially welds to molybdenum RF plane 103 during the pressure-bonding process, as do heater electrodes 119 with heater element 107. Although the electrodes are shown as being formed of a single piece, it is understood that similar electrodes may be formed from multiple pieces. Furthermore, the shape of the electrodes may be altered. For example, RF electrode 118 may be formed without RF electrode flange 118F. Furthermore, RF electrode 118 is shown extending beyond heater element 107, as is preferred, but could be shorter, so that nickel RF standoff rod 117 extends closer to RF plane 103.

Figure 9B:
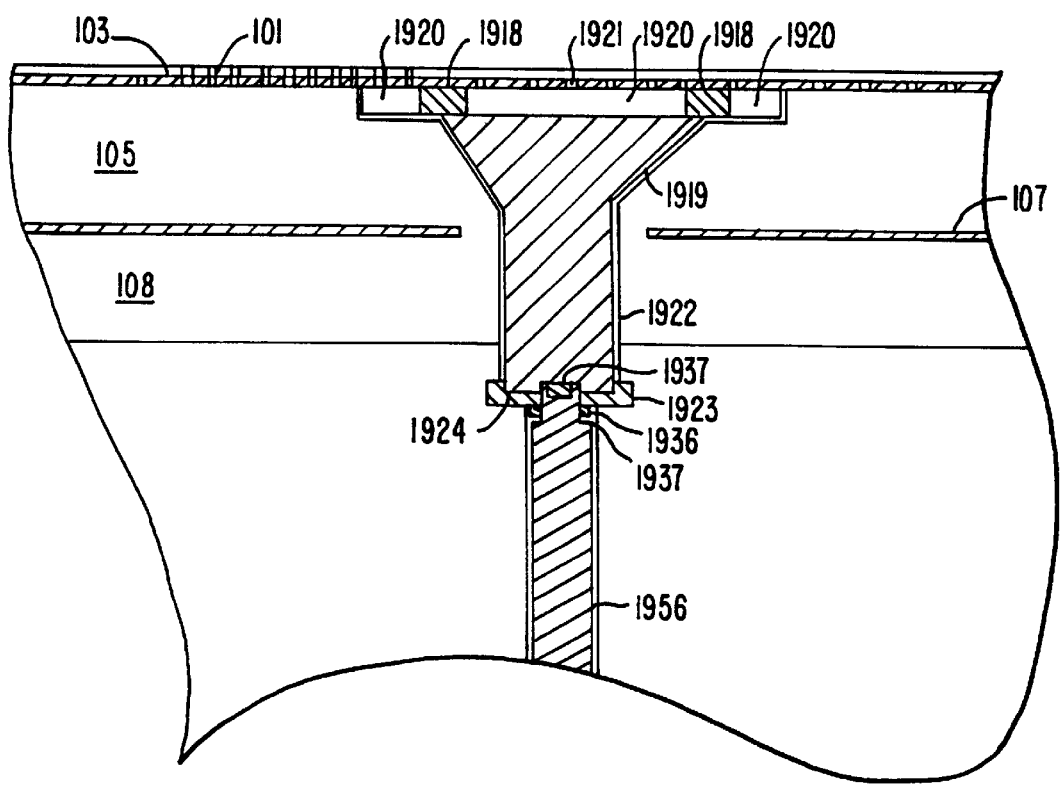
FIG. 9B shows a simplified cross-sectional view of details of electrical connections to the RF plane through a bonding disk, according to an embodiment of the present invention.

FIG. 9B shows a simplified cross-sectional view of details of electrical connections to the RF plane 103 according to another preferred embodiment of the invention. Instead of a single, large electrode contacting the RF plane 103, several smaller electrodes 1918 provide RP power to the RF plane 103. In a specific embodiment, four cylindrical molybdenum electrodes 1918, or legs, each about 0.031–0.250 inches in diameter, but preferably about 0.125 inches in diameter and about 0.075 inches long, extend from an electrode base 1919 (which may be conical in some embodiments), through corresponding holes in a ceramic (e.g. AlN) bonding disk 1920, to the RF plane 103.

The ceramic bonding disk 1920 provides a ceramic surface for bonding with the top plate 101 through the perforations 1921 in the RF plane 103. Perforations in the RF plane that do not have ceramic on both sides do not bond with the top plate 101. Without ceramic on both sides of the perforation, no bonding of ceramic through the perforation can occur and a stress riser may be created that makes the ceramic material near the stress riser susceptible to cracking. A stress riser is nonuniformity or configuration in a structure that concentrates stress in a localized region. For example, a notch in a surface under tension concentrates, or raises, the stress at the apex of the notch, promoting the formation of a crack in that region to relieve the stress. By providing several smaller electrodes to the RF plane, rather than one large electrode, the number of perforations bonding the top plate is increased, thus reducing the potential for cracking in the top plate 101. Additionally, the maximum distance between unbonded perforations is reduced, correspondingly reducing the length of any unbonded span in the top plate, which further reduces cracking. Furthermore, providing several smaller electrodes 1918 allows the RF rod 1956 to be brought up the center of the heater support shaft (not shown), without covering perforations in the RF plane at the center of the top plate.

The RF electrode pocket 1922 extends through the third plate 108 and has a molybdenum ring 1923 that has a counterbore 1924 to accept the electrode base 1919. The molybdenum ring 1923 has a through-hole (not shown) that will later serve as a pilot hole when the ring is drilled out to accept the RF rod 1956.

Figure 9C:
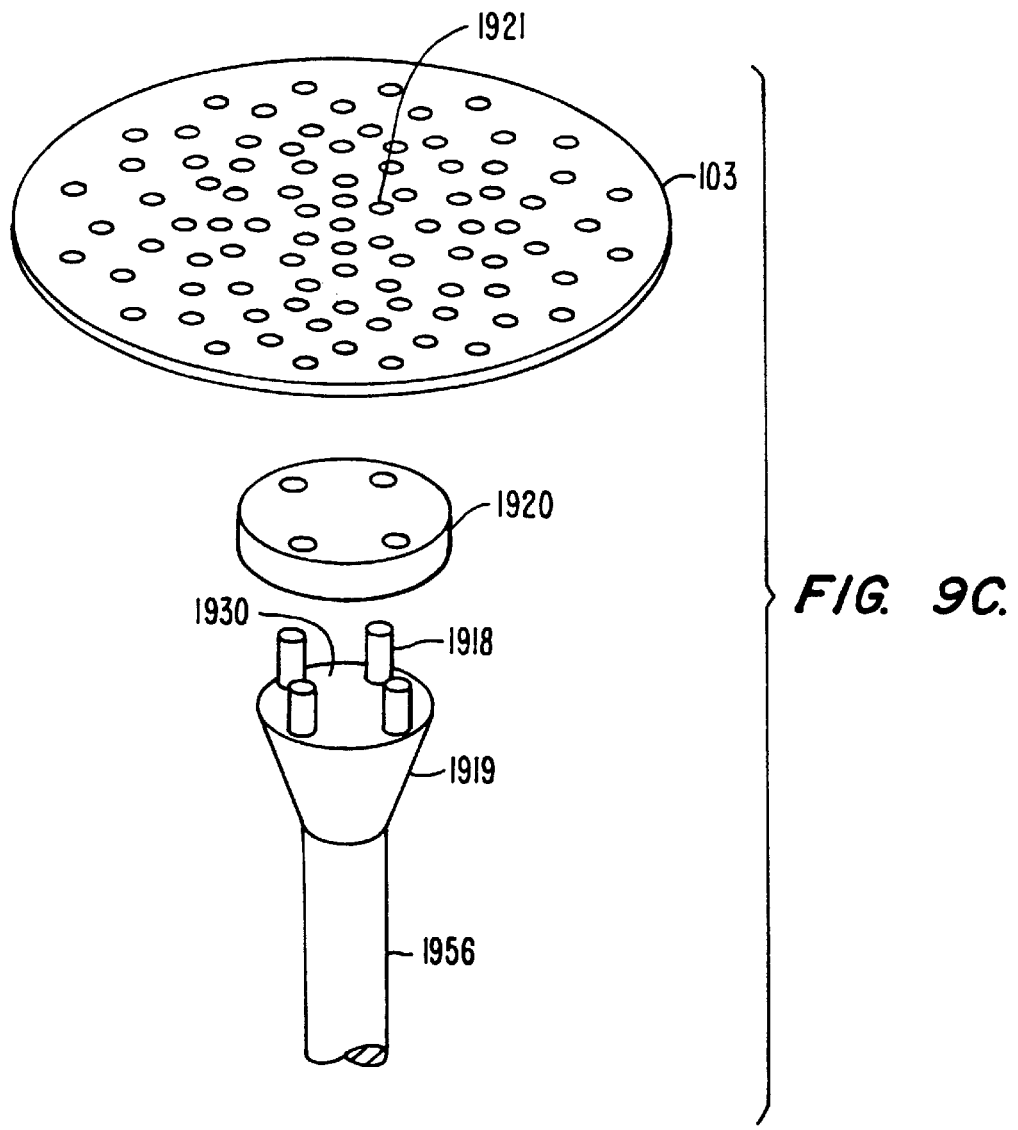
FIG. 9C shows an exploded view of a simplified ceramic assembly incorporating a bonding disk, according to an embodiment of the present invention.

FIG. 9C shows a simplified exploded view of a portion of a ceramic heater assembly in which four electrode legs 1918 extend from electrode base 1919, in accordance with a specific embodiment. The electrode legs are arranged around the periphery of the electrode base 1919, allowing the center of the top plate (not shown) to bond to the ceramic bonding disk 1920 through perforations 1921 in the RF plane 103. The electrode legs are positioned so that they contact a solid region of the RF plane, rather than overlapping a perforation. This configuration alleviates the stresses associated with thermal cycling, especially if the center area is not bonded. These stresses may arise not only from the differential thermal expansion of various materials in the assembly, but also from a thermal gradient across the assembly. For example, as the assembly cools from a uniform temperature, the edge will lose heat faster than the center and will shrink in relation to the center, creating tensile stress in the surface layer that can cause cracking. As previously mentioned, the present embodiment minimizes the potential for cracking in the ceramic top plate 101.

The potential for cracking in the vicinity of the RF electrode contacts is further reduced because each smaller-diameter electrode produces less thermal-cycle stress than a single, large electrode. As shown in FIG. 9C, the four electrode legs 1918 are distributed across the face 1930 of the electrode base 1919. This serves to distribute forces arising from thermal cycling across four relatively compliant legs, as opposed to a single relatively stiff electrode. Additionally, the center spot of the top plate 101 is now bonded to the ceramic bonding disk, thus reducing the potential for cracking.

Figure 9D:
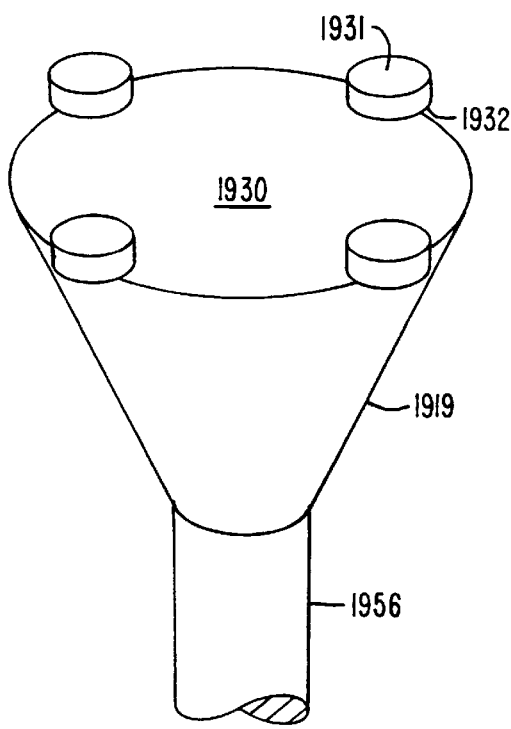
FIG. 9D shows an embodiment of electrodes partially overhanging an electrode base, according to the present invention.

In accordance with another specific embodiment, FIG. 9D shows electrodes 1918 arranged on a conical electrode base 1919 such that a portion 1932 of each electrode 1931 overhangs the face 1930 of the electrode base 1919. This configuration provides a greater contact radius for the electrode legs to the RF plane without increasing the radius of the electrode base. In a specific embodiment, approximately half of the surface area of each electrode 1931 overhangs the electrode base. The diameter and number of the legs are chosen to provide sufficient current-carrying capacity to the RF plane. In the specific embodiment, the RF rod 1956 is about 0.187 inches in diameter, as is each leg. With half the area of each leg overhanging the electrode base, the four electrode legs have a contact area to the electrode base approximately double that of the electrode rod to the electrode base, and a contact area to the RF plane approximately four times that of the electrode rod. This configuration advantageously distributes the electric current, as well as mechanical stresses, to the RF plane.

According to various embodiments, the electrode base 1919 may be drilled to accept the electrode legs 1931; the legs may be spot-welded or otherwise attached to the electrode base, by brazing or eutectic bonding, for example; or the electrode base and assembly may be formed from a single piece. As discussed above, the pressure bonding process mechanically and electrically joins the electrode components to each other and to the RF plane. It is understood that more or fewer electrode legs with different diameters, current-carrying capacity, and stiffness, could be used to join the electrode base to the RF plane in different specific embodiments. For example, more or less than four legs of smaller or larger diameter could be used, according to the principles discussed above, and other shapes and dimensions could be used for the electrode base or the legs, as shown in FIG. 9E.

Figure 9E:
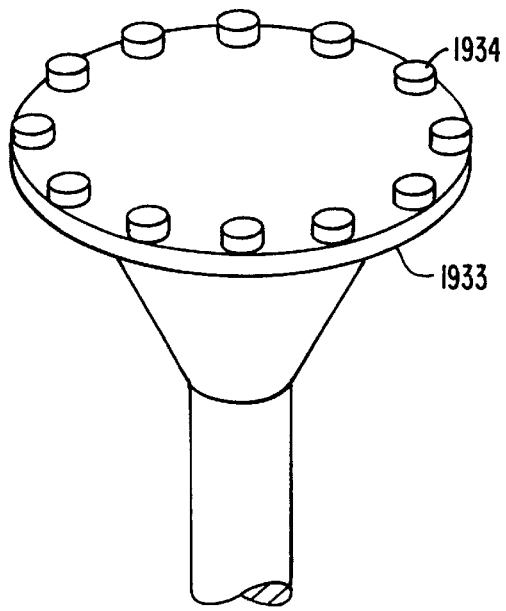
FIG. 9E shows an embodiment of a flanged electrode base, according to the present invention.

FIG. 9E shows an alternative shape for the electrode base that includes a shelf 1933 that provides a circular perimeter and that contacts the entire surface of each leg 1934. The shelf may be machined into the electrode base, or may be a separate piece, such as a washer or shim. This configuration provides support to each leg and eliminates overhang.

Figure 9F:
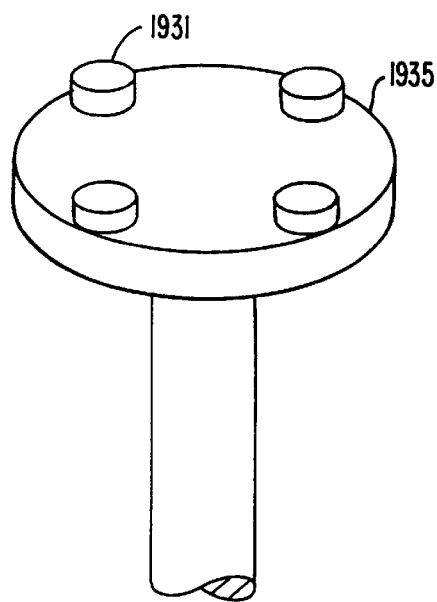
FIG. 9F shows an embodiment of electrodes arranged on a disk-shaped electrode base, according to the present invention.

According to another embodiment, FIG. 9F shows a disk-shaped, rather than conical, electrode base 1935. The disk shape mates to a counter-bored hole in the underlying ceramic plate (105 in FIGS. 9A and 9B), rather than a countersunk hole as with the conical electrode base. The disk-shaped electrode base is advantageously easy to manufacture. With this embodiment, the right angle in the corresponding ceramic material may result in cracks in the ceramic material 105 due to the potential of having a sharp corner that acts as a stress riser. Therefore, embodiments with a conical shape may be preferred.

Figure 9G:
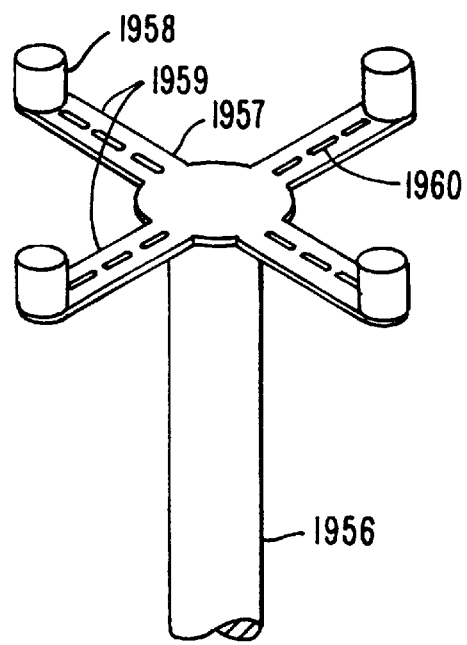
FIG. 9G shows an embodiment of electrodes arranged on a metal "spider" having a cross-hair pattern and through-holes, in accordance with the present invention.

FIG. 9G shows an embodiment where a metal "spider" 1957 with electrodes 1958 on arms 1959 that convey electric power from the RF rod 1956 to the RF plane (not shown). The metal spider and the electrodes may be made from tungsten or molybdenum sheet, for example, and allows wide spacing of the electrodes from the center of the RF rod while allowing ceramic-ceramic bonding between the arms of the spider. The wide spacing of the electrodes at a distance from the center helps to spread the current to the RF plane, and thus avoid hot spots which could crack the heater or degrade process uniformity. Additionally, the arms of the spider are relatively thin, for example 5 mil thick, and flexible and thus are less likely to develop or support a stress that might crack the surrounding ceramic, the RF plane, or the joints between the electrodes and the RF plane. The electrodes 1958 may also be made relatively thin to reduce the stress conveyed to the RF plane and to increase the ceramic bonding area. For example, the electrodes 1958 may be fabricated from 90 mil wire or rod stock. If a heater element is included in the assembly, the spider may be placed on either side of the heater with respect to the RF plane.

A symmetrical, four-arm "cross-hair" configuration is shown in FIG. 9G, each arm being 125 mil wide, but it is understood that more or fewer arms may be used, that the angle between the arms may be varied, and/or that the arms need not be the same length or pattern. Ceramic-to-ceramic bonding may be increased by perforating the arms to define through-holes 1960, which increases the available bonding area, but such through-holes are not required. The spider and electrode leg assembly could be formed as a single piece, or assembled from multiple pieces.

Figure 9H:
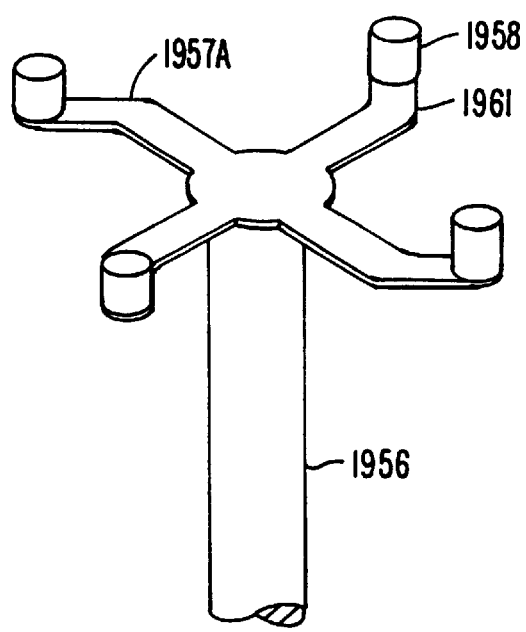
FIG. 9H shows an embodiment of electrodes arranged on a metal "spider" with bent arms, in accordance with the present invention.

FIG. 9H shows another embodiment of a metal spider 1957A with bent or "dog-leg" arms 1961. Bending the arms allows the electrodes 1958 to be placed on a radial line with the lift pin holes (not shown) that are formed through the heater assembly and accept lift pins that lift the wafer off the heater surface for removal from the chamber. The arms are bent to avoid interference with the lift pin holes, the thermocouple, or the heating element rods. Such a configuration is especially beneficial when the connections come through a center pedestal, which tends to crowd the center area of the heater with features. As above, more or fewer arms could be used, and the assembly could be fabricated as a single piece, or from multiple pieces.

Figure 9I:
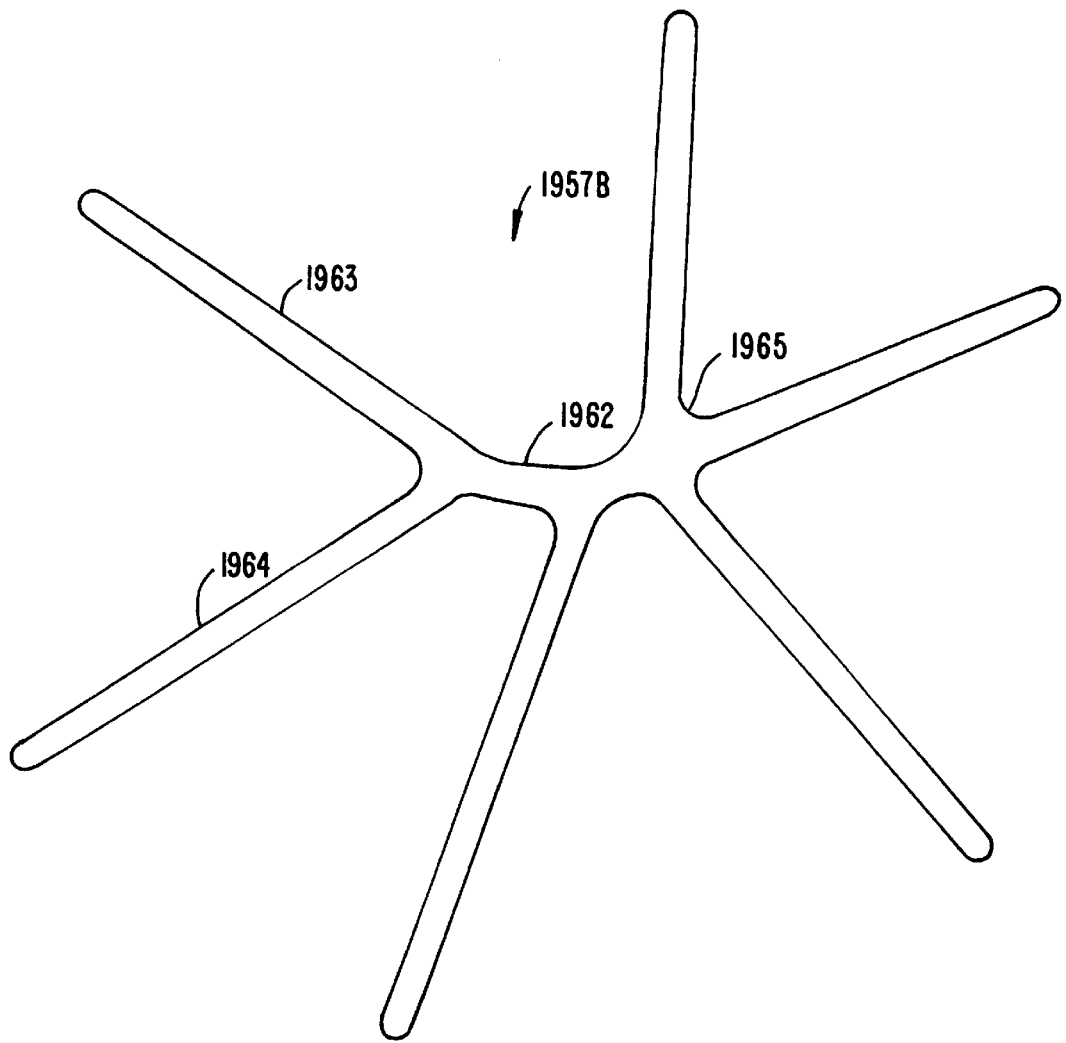
FIG. 9I shows an embodiment of metal "spider" in which an arm branches.

FIG. 9I shows another embodiment of a metal spider 1957B in which an arm 1962 branches into two sub-arms 1963, 1964. The location of the arms and branch may be are chosen so that the arms and sub-arms do not interfere with the lift pin holes or other features of the heater assembly. The RF connection may be made to the body 1965 of the spider, or other suitable location.

Referring to FIG. 9A, holes are drilled through the heater stub 110 and other ceramic material overlying RF electrode 118 to expose the molybdenum electrodes after the pressure bonding process. Nickel heater standoff rods 115 and nickel RF standoff rod 117 are counter-bored to accept tungsten slugs 227A and 227B, respectively. Nickel heater standoff rods 115 and nickel RF standoff rod 117, with tungsten slugs 227A and 227B, are then inserted into heater electrodes 119 and RF electrode 118, respectively. In an alternative embodiment, tungsten rings 228A and 228B may additionally be placed into the drilled holes prior to inserting heater rods 115 and RF rod 117. As shown in FIG. 9, the contacts between rods 115 and 117, and electrodes 119 and 118 are essentially co-planar and are on the side of heater element 107 opposite from RF plane 103, but do not necessarily require these conditions. It is desirable, however, to move the nickel-molybdenum transition away from RF plane 103 to avoid thermal stress on the RF plane.

In the case of FIG. 9B, the molybdenum ring 1923 next to the molybdenum electrode base 1922 provides a pilot hole (not shown), as discussed above, for drilling out the molybdenum to accept the nickel RF rod 1956. The molybdenum ring 1923 provides a larger target surface area for this operation, and hence the post pressure-bonding machining operations are simplified. In this embodiment, the RF rod 1956 is counter bored to accept a tungsten slug 1937, as above, and is inset to provide a space for a tungsten ring 1936. Providing an inset 1937, or step, on the RF rod 1956 for the tungsten ring 1936 allows the hole a closer fit between the RF rod 1956 and the ceramic body. This helps to confine the resultant eutectic, as discussed below, to the perimeter of the electrode rod-electrode base joint.

The entire assembly is then heated to a temperature sufficient to form a molten eutectic. If pure nickel and pure molybdenum were used, a nickel-molybdenum eutectic would form at a temperature of 1315° C.; however, if commercially-available nickel 200 were used, a multi-element eutectic would form at a temperature slightly below 1315° C. It is only necessary to form a small bit of eutectic, and therefore process time is preferably kept to a minimum. Ten minutes at the process temperature is sufficient to join the molybdenum and nickel components. The nickel-molybdenum system is particularly desirable because of the excellent corrosion resistance the eutectic, which is similar to HAYNES™ 242 alloy, has in the presence of halogen species, which are common in some deposition environments, as discussed above. Tungsten slugs 227A and 227B provide a tungsten source that limits the extent of formation of the nickel-molybdenum eutectic by partially dissolving into the molten eutectic and essentially solidifying the resulting alloy. Tungsten rings 228A and 228B, if present, further limit the extent of formation of the nickel-molybdenum eutectic phase. Particularly, they inhibit wicking of the molten eutectic up. the nickel rods, and away from the joint.

D. Heat Choke and Coupler

Figure 10:
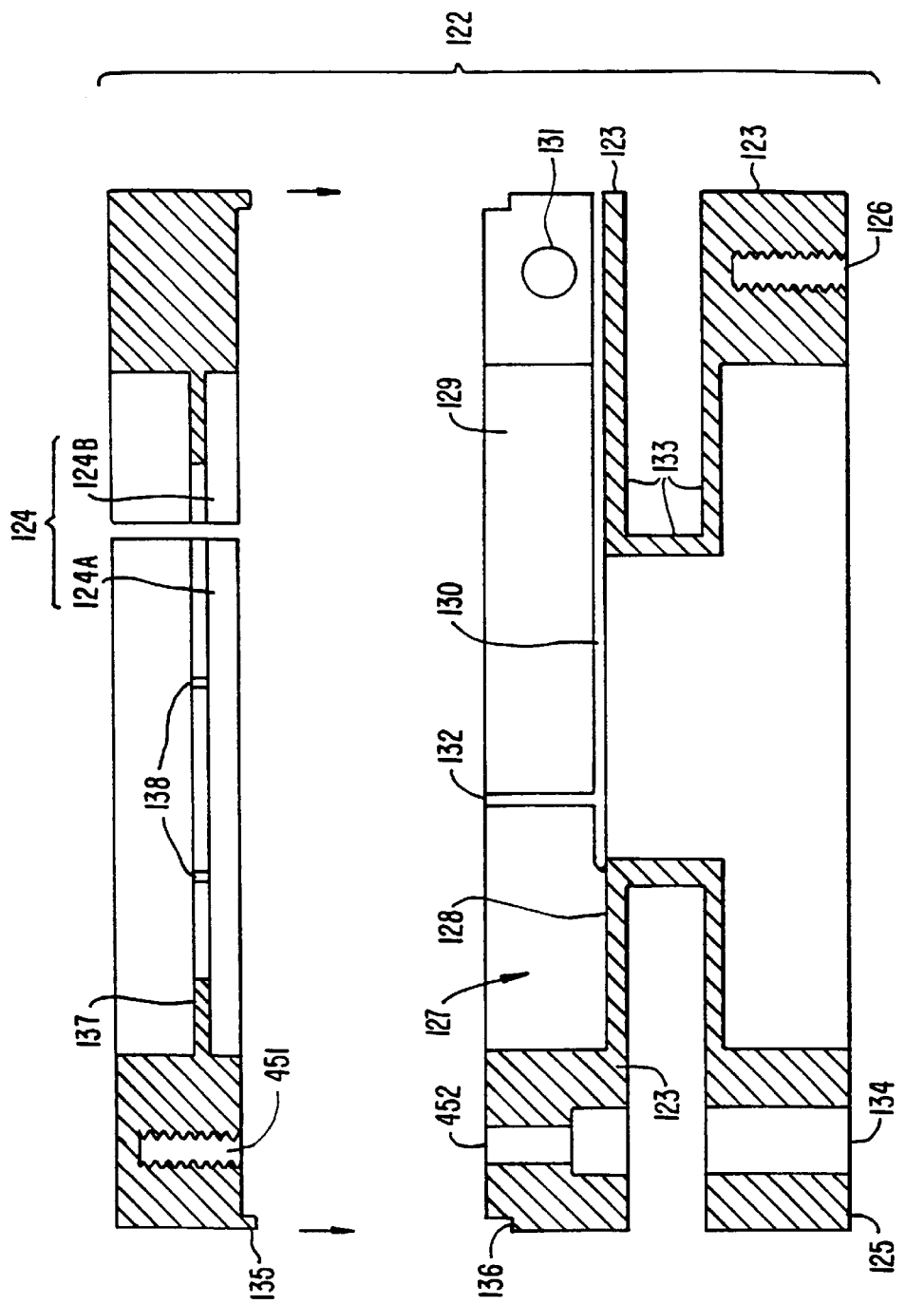
FIG. 10 shows a simplified cross-sectional view of a coupler, which includes a heat choked coupler and clamp, according to an embodiment of the present invention.
Figure 11:
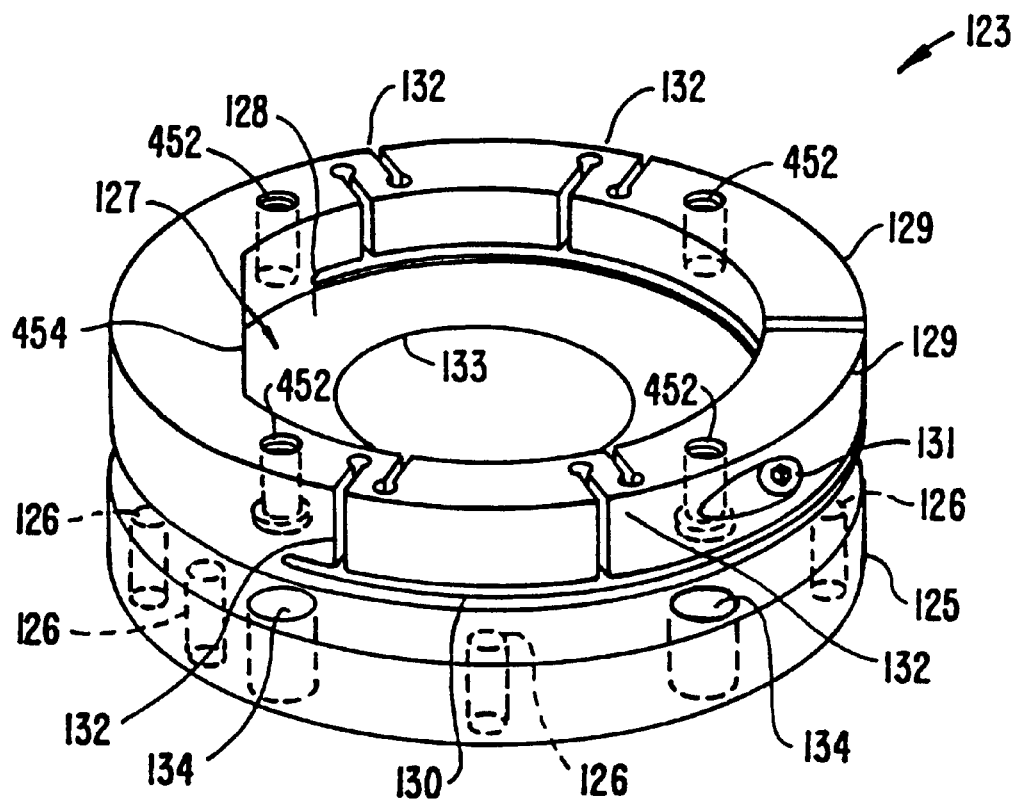
FIG. 11 shows a simplified isometric view of one embodiment of a heat choked coupler according to the present invention, according to an embodiment of the present invention.

According to a specific embodiment, heater assembly 33, as seen in FIG. 6, is attached to support shaft 121 using coupler 122. Coupler 122, which is made from stainless steel or other similar metal, is used to secure the ceramic heater assembly to the metal shaft. FIG. 10 shows a simplified, cross-sectional view of coupler 122, which includes heat choked coupler 123 and 2-piece upper clamp 124. FIG. 11 shows a simplified isometric view of heat choked coupler 123, the bottom part of FIG. 10. Lower flange 125 of heat choked coupler 123 has threaded blind holes 126 so that the coupler may be screwed to the support shaft. Upper pocket 127 accepts heater stub flange (not shown), which sits on pocket face 128, secured by upper clamp (124 in FIG. 10), and is also circumferentially held by tensioning arms 129. Referring again to FIG. 10, upper pocket 127 has an alignment flat (454 in FIG. 11) corresponding to a flat on the circumference of the heater stub flange. Of course, upper pocket 127 should correspond to the shape of the heater stub flange and other alignment mechanisms may be used. Upper clamp 124 includes two "C" shaped halves, 124A and 124B, which are brought together around the heater stub flange before they are attached to the heat choked coupler. Slit 130 is cut substantially co-planar to pocket face 128, leaving an un-cut cord opposite tensioning screw 131, such that tension from tightening screw 131 draws tensioning arms 129 together to hold the flange on the heater stub. A spacer (not shown) with a shape similar to slit 130, may be inserted in slit 130 to support tensioning arms 129 and reduce gas flow through slit 130. Pairs of strain relief slots 132 are machined into tensioning arms 129 (each slot in a pair of strain relief slots is machined from opposite sides of arms 129) to increase the available strain resulting from the stress applied by tensioning screw 131, and to allow the tensioning arms to continue applying hoop tension as the assembly heats up, as the clamp, which is metal, will expand more than the ceramic heater stub flange. In this embodiment, four pairs of strain relief slots are shown, but this number may be adjusted according to the materials and design of the clamp. The strain relief slots are approximately 40 mil wide and are cut to within approximately 0.1 inch of the approximately 0.3 inch tensioning arm according to a specific embodiment. The end of the strain relief slots may be rounded to reduce stress concentration at the apex of the slot and to improve manufacturability, in some embodiments.

As shown in FIG. 10, heat choked coupler 123 is fabricated to leave a thin web 133 between upper pocket 127 and lower flange 125. This web, which ranges between about 20–100 mil thick, preferably about 40–60 mil thick, in specific embodiments, acts as a path of high thermal resistance between the heater assembly and the support shaft. The web has an effective length between about 0.6–1.0 inch with a height of the vertical web portion ranging between about 0.2–0.5 inch in specific embodiments. In the embodiment shown, about 25 Watts of power flow between a heater assembly operating at a temperature of about 625° C. and the support shaft, whose lower end has a temperature of about 50° C. Other embodiments of coupler 122 may be used at even higher temperatures either with the total length of web 133 being longer for higher temperature applications for a given web thickness, or with the web thickness being reduced for a given length. The web should be sufficiently mechanically rigid but also thin enough to provide the heat choke. Use of coupler 122 allows the heater assembly to thermally "float" above the shaft, thereby allowing a wider selection of materials for use in the shaft, and reducing the power delivered to the heating element required to maintain the wafer temperature with improved temperature uniformity in a non-compensated heater element design. Because less heat flows from the heater through the pedestal and down the shaft, there is less chance of forming a cold spot above this potential heat conduit, thereby improving wafer temperature conformity. Also, use of coupler 122 reduces the thermal gradient produced across the ceramic heater assembly, which reduces heater assembly cracking, thereby increasing the operating lifetime of the heater assembly. Use of coupler 122 also results in a shorter, more compact heater assembly, that is easier to fabricate than heater assemblies with longer ceramic stubs or ceramic support shafts.

Upper clamp 124 is connected to heat choked coupler 123 with clamping screws (not shown in this view) disposed through holes 451 in upper clamp 124 and holes 452 in heat choked coupler 123. Holes 451 are blind holes in upper claim 124. Lower flange 125 has access holes 134, which are larger than the clamping screws, allowing assembly from below. In this version, access holes 134 are offset from threaded holes 126 in lower flange 125, but could be co-axial if the threaded holes were sufficiently large to allow access to the upper clamp screws. According to some embodiments, outer alignment lip 135 on the upper clamp sits in outer alignment ledge 136 of the heat choked coupler to form a relatively smooth surface along the outer diameter of the clamp (see FIGS. 10 and 13). In other embodiments, outer lip 135 on the upper clamp may sit and hang over the solid upper edge (with no ledge 136 formed therein) of heat choked coupler 123 such that the outer diameter of the upper clamp 124 is slightly larger than the outer diameter of heat choked coupler 123. Cantilevered washer 137 is machined as part of the upper clamp 124, and screws disposed through holes 451 in upper clamp 124 and holes 452 in heat choked coupler 123 apply compression to heater stub flange (not shown in this view) to securely hold it in the upper pocket of the heat choke. In the specific embodiment, the cantilevered washer is about 10–20 mil thick, and has strain relief slots 138 cut into it so that suitable pressure may be maintained on the ceramic heater stub without breaking it. The strain relief slots may be similar in general shape to those cut in the tensioning arms (discussed above).

Figure 12:
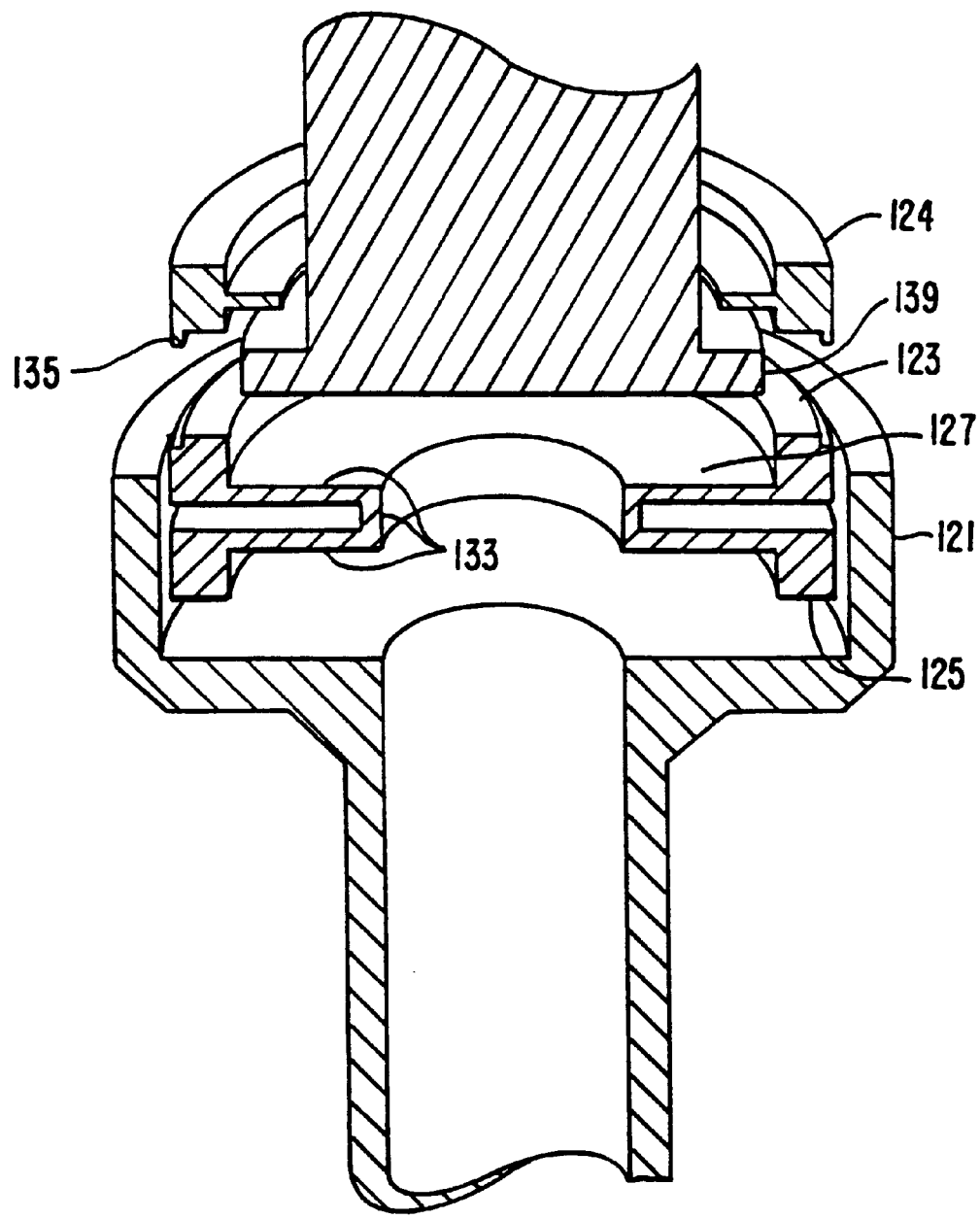
FIG. 12 shows a simplified cross-sectional exploded view illustrating the relationship between a support shaft, heat choked coupler with upper clamp, and heater assembly, according to an embodiment of the present invention.

FIG. 12 is a simplified cross-sectional isometric exploded view showing how upper clamp 124 (only one of two C-sections shown) holds heater stub flange 139 in upper pocket 127 of heat choked coupler 123, which is supported by shaft 121. In this embodiment, coupler 122 joins a ceramic heater assembly to a metal support shaft. One alternative embodiment would be to incorporate a heat choke and coupler into a support shaft, in order to couple and thermally isolate a heater assembly (secured using the coupler) from the shaft. An additional embodiment may incorporate a ceramic spacer between a metal heater and a support shaft in order to provide electrical isolation between the metal heater, which may be used as an RF electrode, and the grounded support shaft. A heated choked coupler could be used on one or both ends of the ceramic spacer, for example, to obtain either or both benefits of securely and reliably joining the ceramic member to the metal heater and/or to the support shaft, and reducing the heat flow from one member to the next.

E. Heater Pedestal Components

Referring again to FIG. 6, pedestal 32 will now be described in detail. The pedestal functions to lift the wafer into the processing position within vacuum chamber 30 and to heat the wafer during processing. Although the heater pedestal described herein is particularly useful for processes operating at temperatures at or greater than about 400° C. and up to about 750° C. and greater, the heater pedestal may be used for processes operating at lower temperatures as well. At the outset, it should be noted that pedestal 32 may be modified for use, or directly placed into, a variety of processing chambers other than the exemplary PECVD chamber described and shown herein. For example, heater/lift assembly 40 may be used in other CVD chambers or generally in other semiconductor processing chambers.

Additional features help to thermally isolate the heater assembly from the support shaft. Fused silica heat shield 431 reduces heat loss from the bottom of the heater assembly. The heat shield may reduce unwanted deposition on the heater surface and can be easily and separately cleaned and remounted, thereby increasing the time between cleans and prolonging the heater life span. As discussed above, and shown in FIGS. 4A–4E, the heat shield may be fabricated in various configurations. In one embodiment (not shown), purge gas is applied between the heat shield and the bottom plate of the heater assembly, which then flows between flow restrictor ring and the edge of the heater assembly to reduce deposition on the edge of the wafer.

Heat shield 431, made of fused silica, consists of one disk-shaped piece (optionally having a wall around the outer disk circumference to surround the side edges of the pedestal) with an inner diameter to accommodate the stub of the pedestal and holes for the wafer lift pins. Heat shield 431 has at least two holes disposed in its bottom surface at points at the inner diameter, so that shield 431 can be held in place by nickel alignment pins 140 in collar 141. Collar 141 is made of aluminum and is attached to support shaft 121 with screws 142. Fused silica isolator 143 further reduces radiative heat loss from the heater assembly to the support shaft by placement directly under the bottom plate of the heater assembly. Isolator 143 consists of two semi-circular pieces. Because it is confined by the bottom plate of the heater assembly, the heater stub, the support shaft, and the upper clamp, silica isolator 143 requires no fasteners. Both heat shield 431 and isolator 143 reduce heat loss from the heater pedestal, as well as reducing chamber volume and hence pumping time.

In one embodiment, support shaft 121 is filled with plugs 144, 145A–C, and 146, each with four through holes corresponding to the four holes in the heater stub. Taking up substantially all of the volume within the shaft, the solid plugs reduce the possibility of RF arcing, which might otherwise occur with hollow shafts, especially at vacuum. Fused silica plug 144 reduces conductive heat transfer, and ceramic plugs 145A–C and 146 not only provide a guide for insertion/extraction of the thermocouple but serve as electrical isolation between the electrodes. The plugs further reduce pumping volume compared to a hollow shaft, which would need to be evacuated at typical operating pressures. The solid plugs not only reduce necessary pumping, they also minimize the volume exchanged during pressure cycling, hence reducing the transport of contaminants and corrosive species between the chamber and the shaft. Uppermost fused silica plug 144 provides further thermal isolation between heater assembly 33 and the ceramic-plugged support shaft 121. Plugs 145A–C and 146 may be made of fused silica, ceramic, or polymer material, depending upon the maximum operating temperature. In this embodiment, plugs 145A–C and 146 are made of an alumina-based ceramic material. In other embodiments, plugs 145A–C and 146 may be replaced with a single, long plug; with fewer or more plugs; or with a filler material with high electrical resistivity, such as a ceramic filler material. Lower standoff 147 is made of VESPEL™. Lower endcap 148 is made of DELRIN™. These materials are chosen for their electrical insulation, machinability, and temperature resistance properties, but other similar material may be used. Both standoff 147 and endcap 148 have passages formed therein to accommodate wiring in the shaft. C-ring clips 771, used with each electrode, are used to prevent the bottom electrodes from being pushed in or pulled out. In addition, an O-ring 773 seals the end of shaft 121 and lower standoff 147, and O-rings 775 (used with each electrode) provides seals between lower standoff 147 and endcap 148. Accordingly, the shaft may be gas-tight for introduction of a purge gas in some embodiments.

Ceramic liner sections 149 provide additional protection from corrosion for heater wires 150 and RF feedthrough (not shown in this view) and suppress arcing, especially since liner joints 151 are offset from plug joints 152. Liner sections 149 may be replaced with a single long liner for each of the wiring, purge, and thermocouple passages. Purge gas may be applied, or a vacuum drawn, from inlet tube 153. Inlet tube 153 is made of aluminum and is welded to aluminum support shaft 121. Aluminum-to-stainless steel transition 154 joins stainless steel gas line fitting 155 to the aluminum inlet tube. The transitions are typically confined to the inside diameter of the support shaft, and therefore must be compact. Brazing and explosion bonding also are typically used to make aluminum-to-stainless steel transition joints.

Nickel rods 156 protruding from the stub of the heater assembly 33 may vary in length, as seen in FIG. 1A and in FIGS. 2 and 6. Rods 156 are short to facilitate manufacturing of heater assembly 33 and to facilitate assembly of plugs 145 A–C and isolator 144 with the heater assembly 33. Rods 156 extend preferably about 2–5 inches beyond the heater stub in some embodiments. Heater supply line 150 is attached to nickel rod 156 with crimp connection 157. The length of rods 156 determine where connection 157 are located in relation to the plugs and plug joints. Heater supply lines may be coiled inside of ceramic liner 149 to provide strain relief during assembly and high-temperature thermal cycling. The RF power supply line (not shown) is coiled similarly as the heater supply lines. All electrical lines inside the pedestal are coiled strap, however coiled wire could be used as an alternative. The coiled lines provide more than adequate amounts of wiring that are needed, and minimize heater breakage. Without use of these coiled lines, which relieve the strain caused by nickel rod expansion, the nickel rods might expand against the top ceramic plate of the pedestal and break the pedestal. Further, use of the coiled lines avoids the risk of pedestal breakage due to any upward forces caused by insertion of external connectors.

Figure 13:
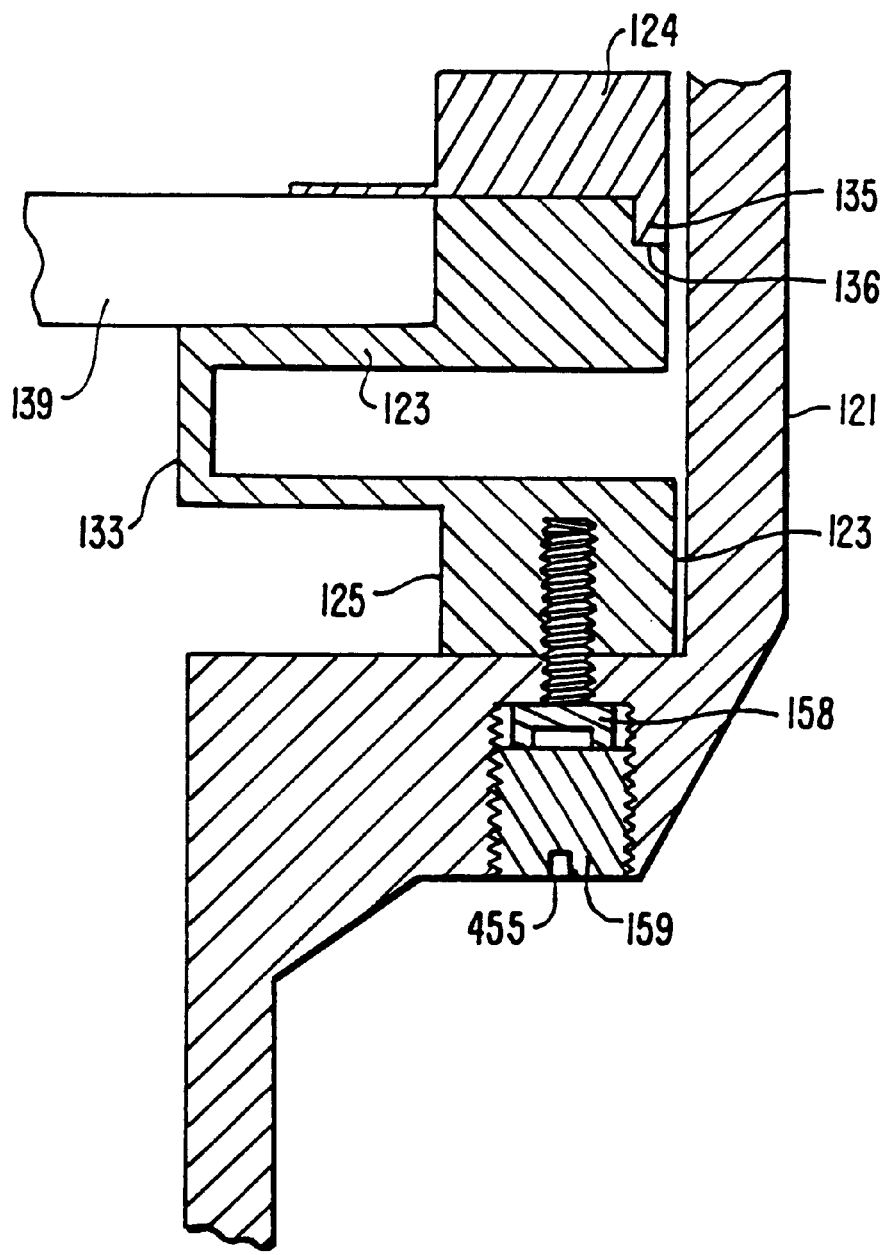
FIG. 13 shows a simplified cross-sectional view of a pedestal screw and cover plug, according to an embodiment of the present invention.

FIG. 13 shows a cross-sectional view of screw 158 joining support shaft 121 to thermal choked coupler 123 in relation to upper clamp 124. Cover plug or cap 159, which is screwed in (using a screwdriver that fits into slot 455) after screw 158 has been screwed in, protects screw 158 from the corrosive environment of the chamber. Acting as a plug for the hole in the support shaft surface, cover plug 159 is made from metal similar to that of support shaft, in this case aluminum alloy. The material used for plug 159 preferably has good corrosion properties. Using the same material for plug 159 and the shaft is desirable, because the material for both has the same expansion, and the risk of galvanic reaction from use of two different metals is reduced. Similar cover plugs (not shown) may be used to cover the screws joining the collar to the support shaft for similar purposes.

The embodiment shown in FIG. 13 has outer alignment ledge 136 formed in heat choked coupler 123 with upper clamp 124 seated thereon such that outer alignment lip 135 and heat choked coupler 123 form a flat surface separated from the inner surface of shaft 121. This gap prevents contact between shaft 121 and coupler 122. This gap should also be large enough to account for the difference in the thermal expansion coefficients as well as to provide thermal isolation to minimize heat loss from heater stub flange 139 to shaft 121. In embodiments where heat choked coupler 123 has no ledge 136 and upper clamp 124 has a larger outer diameter than heat choked coupler 123 such that lip 135 fits over the solid edge of heat choked coupler 123, the inner surface of the shaft 121 may be machined so that a space separates coupler 122 from shaft 121.

F. RF Supply System

Figure 14:
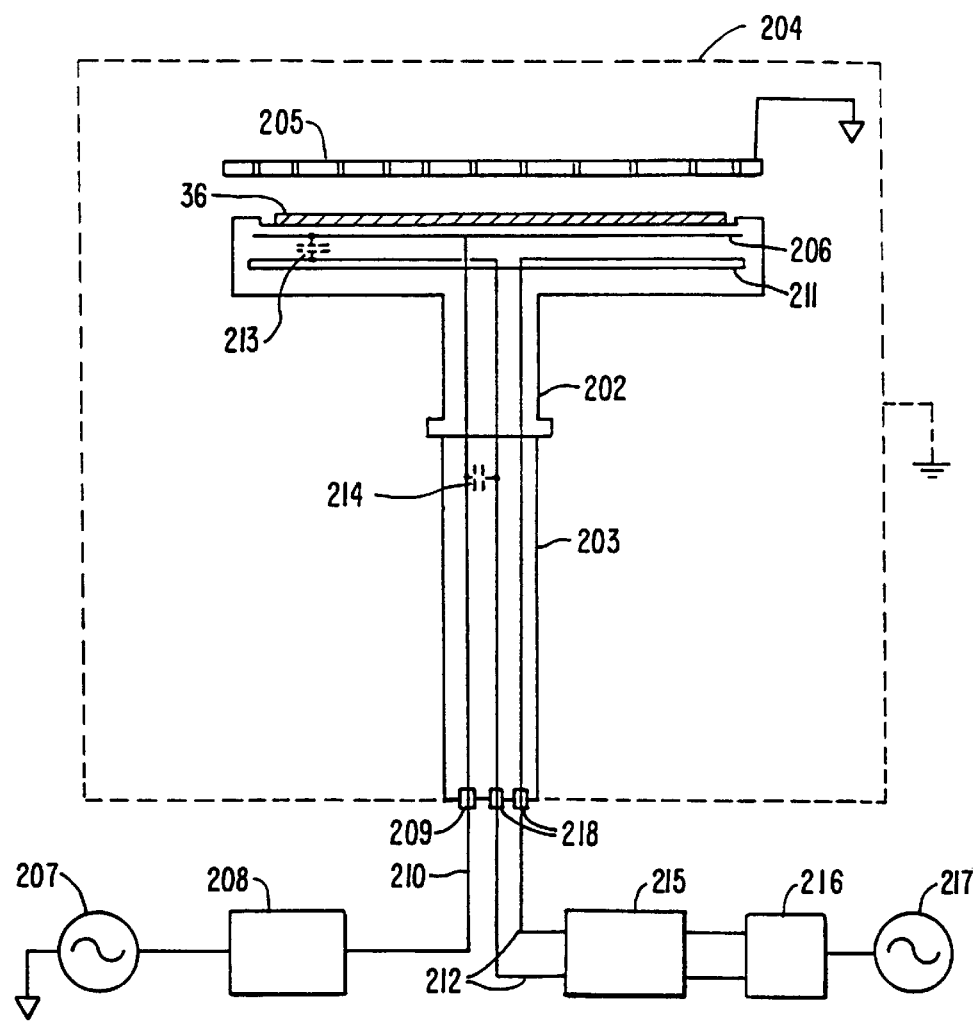
FIG. 14 is a simplified diagram of bottom-powered RF plane, within the heater assembly, according to an embodiment of the present invention.

FIG. 14 is a simplified diagram of the RF power supply system, including a simplified cross-sectional view of a heater assembly 202 and a support shaft 203. In the configuration shown, both the chamber 204 and the showerhead 205 are grounded, and the RF plane 206 is powered. In alternative configurations, showerhead 205 may be powered while RF plane 206 is grounded, or the power to showerhead 205 and RF plane 206 may be "split", that is, each may receive RF power, relative to chamber 204, which is at ground potential. In yet another configuration, one RF frequency may be applied to showerhead 205 while a different RF frequency is applied to RF plane 206. The configuration shown in FIG. 14 produces what is known as a "bottom powered" plasma. The alternative configuration, where the faceplate is powered and the RF plane is grounded, produces what is known as a "top powered" plasma, and is preferred in some applications. Additionally, this plasma system also may incorporate application of a DC bias voltage (in addition to the RF power) between RF plane 206 and showerhead 205 in order to optimize the deposition and characteristics of the film.

RF plane 206 lies within heater assembly 202, beneath wafer 36, as shown in FIG. 14. The RF generator 207 supplies RF power to RF plane 206 through the matching network 208. An RF feedthrough 209 isolates the RF supply line 210 from chamber 204. Heater feedthroughs 218, which may be the same or different from RF feedthrough 209, isolate heater lines 212 from chamber 204. Some RF energy capacitively couples from RF plane 206 to the heater element 211 and from RF supply line 210 to the heater supply lines 212 through parasitic capacitance, represented by elements 213 and 214, respectively. Therefore, both RF feedthrough 209 and heater feedthroughs 218 are high-voltage feedthroughs, to withstand the RF voltages produced. Parasitic capacitances 213 and 214, shown as capacitors merely for purposes of illustration, are not discrete capacitors, but rather represent capacitive coupling effects arising from the proximity of the respective conductors. Plugs (not shown) within support shaft 203, which may be made of solid ceramic, porous ceramic, or fused silica, as discussed above, provide DC isolation (or DC blocking) between RF line 210 and heater lines 212. Located as close as possible to the base of support shaft 203, the filter 215 blocks RF energy coupled onto heater supply lines, which may otherwise radiate and cause radio-frequency interference or electromagnetic interference with other system components, such as the controller. Filter 215 provides a high impedance at the RF frequency on both heater supply lines 212, and is optimized so that it has high impedance at the operating frequency or frequencies of the deposition system, while having low impedance at the frequency of heater power supply 216, which is generally a much lower frequency, such as about 60 Hz. Heater power supply 216 is powered by an alternating current (AC) supply 217. Filter 215 provides the functions of protecting heater supply 216, reducing electronic noise and interference, and of maintaining RF energy within the chamber. The high impedance to RF energy provided by filter 215 also allows more efficient transfer of RF energy from generator 207 to the plasma (not shown). A filter with a low impedance at RF might shunt sufficient RF energy through heater power supply 216 so that a plasma could not be struck (a glow discharge established). RF generator 207 may operate at any frequency between about 100 kHz and about 500 kHz, preferably about 400 kHz, or at a frequency of about 13.56 MHz or at other frequencies.

Figure 15:
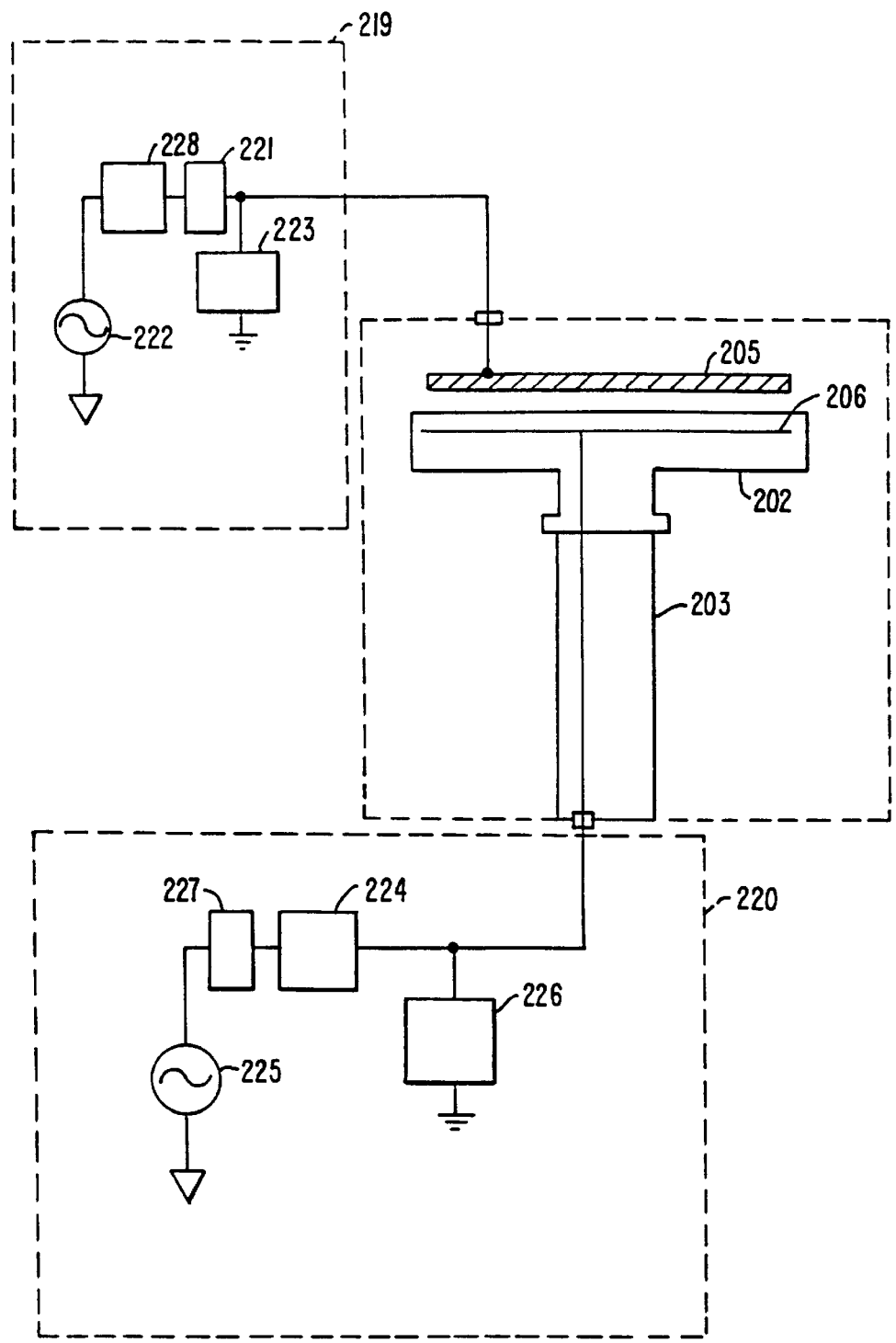
FIG. 15 is a simplified diagram of an RF system, according to an embodiment of the present invention.

FIG. 15 is a diagram of a deposition system according to the present invention utilizing two different RF systems, each supplying a different frequency. In this embodiment, the high frequency RF system 219 supplies power to showerhead 205 at a higher frequency, e.g. about 13.56 MHz, than the frequency supplied by low frequency RF system 220 to RF plane 206, e.g. 100–500 kHz. High frequency RF system 219 includes a high-pass through filter 221, which allows high frequency RF power to flow from the high frequency RF generator 222 to showerhead 205, while blocking low frequency RF energy from entering high frequency RF generator 222. The low-pass shunt filter 223 provides a path to ground for the low-frequency energy, thus enabling showerhead 205 to act as a complimentary (grounded) electrode to RF plane 206 at the lower RF frequency. The low-pass through filter 224 allows RF energy from low frequency RF generator 225 to flow to RF plane 206, while blocking high frequency RE energy from entering low frequency RF generator 225. The high-pass shunt filter 226 provides a path to ground for the high frequency RE energy so that RF plane 206 can act as a complimentary electrode to showerhead 205 at the high RF frequency. According to other embodiments, the high RF frequency may be supplied to RF plane 206 while the low RF frequency may be supplied to showerhead 205. In that instance, high frequency RF system 219 and low frequency RF system 220 would be transposed. Matching networks 227 and 228 may be added between each RF generator and its respective through filter to improve the power transfer from the generators to their loads. Matching networks 227 and 228 may be integrated with through filters 224 and 221, respectively.

G. Gas Distribution System

Figure 16A:
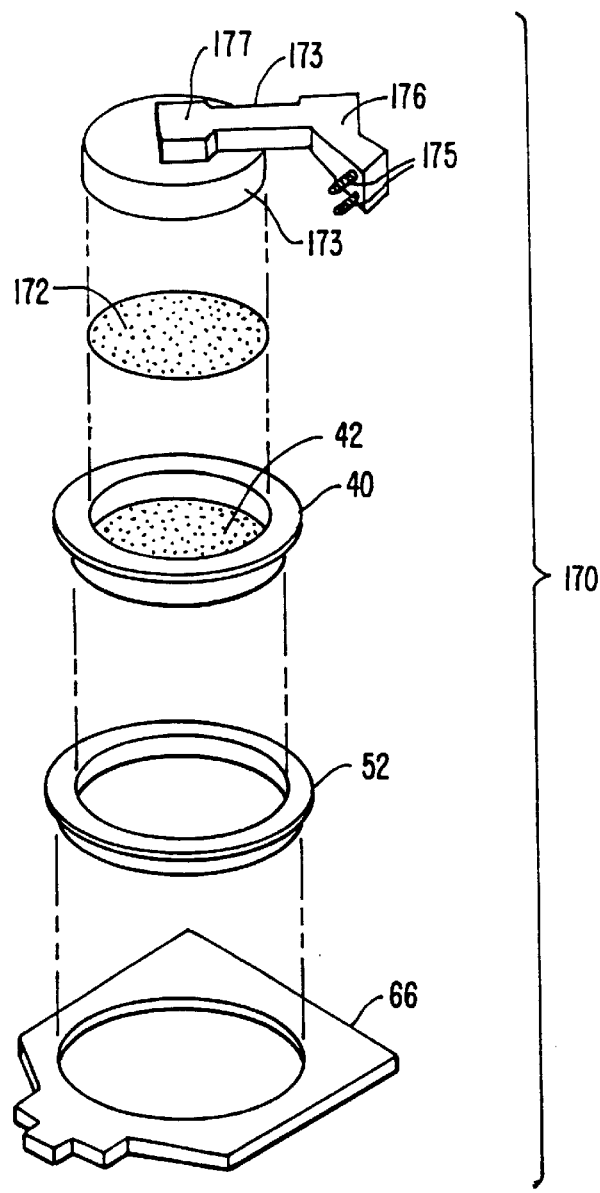
FIG. 16A shows a simplified exploded view of the inner lid assembly, according to an embodiment of the present invention.

FIG. 16A shows a simplified, exploded view of inner lid assembly 170. Inner lid assembly 170 includes gas box 173, gas dispersion plate (or gas blocker plate) 172, gas distribution plate 40, ceramic isolator ring 52, and chamber lid 66, with sealing members (not shown) such as O-rings disposed between various parts of assembly 170. Inner lid assembly 170 also includes a gas feed-through box 173, which houses gas passages 175 (partially shown) that extend from a gas input manifold 176 to a mixing area within gas output manifold 177 for use in gas box 173. Gas passages 175 deliver gases to the mixing area where the gases are mixed prior to delivery through inlet rube 44. Gas feed-through box 173, gas input manifold 176, and gas output manifold 177 are made of nickel or of a material such as alumina plated with nickel, in some specific embodiments. For plasma processes, gas feed-through box 173 also enables the application of high voltage RF power to gas box 173 without gas breakdown and without gas deposition in the gas distribution system. An exemplary gas feed-through box can be found in commonly-assigned U.S. Pat. No. 4,872,947 to Wang, the disclosure of which was previously incorporated by reference.

Gas dispersion plate 172 is a generally circular disk forming the lower surface of gas box 173. Gas blocker plate 172 includes a plurality of gas dispersion holes for dispersing the gas therethrough into space (54 in FIG. 2) formed between gas blocker plate 172 and showerhead 40. Another space (48 in FIG. 2) is present within gas box 173 on the side of gas blocker plate 172 opposite showerhead 40. The material selected for gas dispersion plate 172 must be consistent for the intended process. For example, while aluminum may be appropriate for low temperature non-corrosive depositions, a nickel-containing metal is more appropriate for a high temperature, chlorine environment. Dispersion holes (not shown) in gas blocker plate 172 will usually have a diameter of about 10–40 mil. Of course, it will be recognized by those skilled in the art that blocker plate 172 may be included in preferred embodiments of the invention.

As seen in FIG. 16A, the size and arrangement of gas distribution holes 42 in showerhead 40 will vary depending on the process characteristics. For example, the holes 42 may be uniformly spaced to provide a uniform distribution of gases onto the wafer. On the other hand, holes 42 may be non-uniformly spaced and arranged, if desired. Holes 42 will usually have a diameter in the range of about 5–100 mil and preferably in the range of about 10–50 mil. Additionally, while showerhead 40 is conventionally made of an aluminum alloy, anodizing or other surface treatment (such as a titanium coating, a silicon carbide coating, or a nickel plating) may be necessary to protect the showerhead from corrosive attack from chlorine species at elevated temperatures. In such an instance, holes 42 should be initially fabricated such that the diameter after surface treatment is the desired value. Alternatively, showerhead 40 may be made out of a corrosion-resistant conductive material such as nickel, titanium, or graphite, which also may be surface treated. Preferably, gas distribution holes 42 are designed to promote uniformity of deposition on the semiconductor wafer. The holes (as well as the showerhead temperature, discussed above) are also designed to avoid the formation of deposits on the faceplate's outer (bottom) surface and, in particular, to prevent the deposition of soft deposits on that surface which could flake off and drop onto the wafer during and after processing. In an exemplary embodiment, the hole array is one of generally concentric rings of holes 42. The distances between adjacent rings (ring-to-ring spacings) are approximately equal, and the hole-to-hole spacing within each ring is approximately equal. A more complete description of a suitable arrangement for the gas distribution holes is described in commonly-assigned U.S. Pat. No. 4,872,947 to Wang, the complete disclosure of which is hereby incorporated by reference.

FIG. 16A also shows ceramic isolator ring 52, which may electrically isolate the inner lid assembly from the lid rim. This allows RF power to be applied to the inner lid assembly, and not the lid rim, so that the RF fields emanate primarily from the inner lid assembly, particularly showerhead 40, to the complimentary RF electrode. Isolator ring 52 also allows a bias, such as a DC bias, to be applied to showerhead 40 independently of any bias associated with the chamber body or lid rim.

Inner lid assembly 170 is held together by a clamping bar (not shown) which presses against the top of gas input manifold 176 to hold the assembly against chamber lid 66. The dotted lines show how gas box 173 nests into showerhead 40, which nests into isolator ring 52, which nests into chamber lid 66. O-rings (not shown) form gas-tight seals between these inner lid components.

Figure 16B:
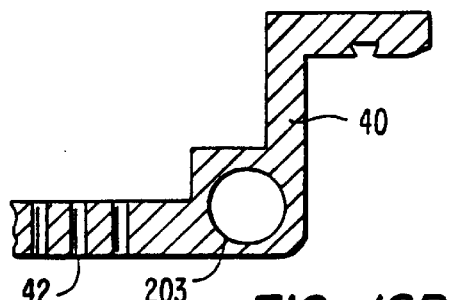
FIG. 16B is a simplified partial cross-section detail of the showerhead and heat exchange passage.

The temperature of the wafer is typically held above a minimum deposition temperature by heater assembly 33 so that the process gases will react together at the wafer surface and deposit a layer thereon. Specifically, an electric current is directed through conductor wires 150 to heater element 107 to heat the wafer to a temperature of about 200–800° C., according to specific embodiments. In the preferred embodiment, the temperature is controlled as described above for heater control subroutine 167. During this process, lid assembly 170 receives heat from various sources including the gases passing therethrough, the heated semiconductor wafer, and the wafer heating source. To maintain the components of lid assembly 170 below the minimum deposition temperature and thereby avoid gas reactions and deposition on these components, a heat exchange liquid is introduced into heat exchange channels (not shown in FIG. 16A), formed in gas box 173 and showerhead 40. As shown in FIG. 16B, showerhead 40 has a heat exchange passage 203 to reduce the temperature of the showerhead, which may heat up due to its proximity to the heater pedestal which may heat up to temperatures of at least 400° C. or greater. Vias (not shown) connect heat exchange passage 203 to the heat exchange channels in gas box 173. Undesired deposition and clogging of gas distribution holes 42 is minimized by reducing the showerhead temperature.

H. Exhaust System

Referring to FIG. 1A, a valve assembly (throttle valve system) includes an isolation valve 78 and a throttle valve 83 disposed along discharge line 178 for controlling the flow rate of the gases through pumping channel 60. The pressure within processing chamber 30 is monitored with capacitance manometers (not shown) and controlled by varying the flow cross-sectional area of conduit 178 with throttle valve 82. Preferably, processor 85 receives signals from the manometers that indicate the chamber pressure. Processor 85 compares the measured pressure value with set-point pressure values entered by operators (not shown), and determines the necessary adjustment of the throttle valve that is required to maintain the desired pressure within the chamber. Processor 85 relays an adjustment signal to a drive motor (not shown), which adjusts the throttle valve to a setting corresponding to the set-point pressure value. Suitable throttle valves for use with the present invention are described in commonly-assigned, co-pending application Ser. No. 08/672,891 entitled "Improved Apparatus and Methods for Controlling Process Chamber Pressure" (Attorney Docket No. 891/DCVD-II/MBE), filed Jun. 28, 1996, the complete disclosure of which is incorporated herein by reference. However, in processes requiring high gas flow rates, such as the deposition of titanium from $TiCl_4$, the capacity of the exhaust system must be increased. This includes increasing the cross-sectional area of exhaust port 80, as well as increasing the diameters of discharge line 178 and throttle valve 83. In one embodiment, in order to accommodate a gas flow of about 15 liters/minute at a chamber pressure of about 5 torr, exhaust port 80 was increased to a diameter of about 2 inches from a diameter of about 1.5 inch, which would be suitable for a 5 liter/minute process. In the same example, the throttle valve and discharge line diameters was similarly increased from about 1.5 inch to about 2 inches. These diameters may differ in other embodiments depending on the gas flow.

Isolation valve 78 may be used to isolate process chamber 30 from the vacuum pump 82 to minimize the reduction of chamber pressure due to the pumping action of the pump. Seen in FIG. 1A, isolation valve 78, together with throttle valve 83, may also be used to calibrate the mass flow controllers (not shown) of CVD apparatus 10. In some processes, a liquid source is vaporized, and then delivered into process chamber 30 along with a carrier gas. The mass flow controllers are used to monitor the flow rate of the gas or liquid into the chamber 30. During calibration of the MFCs, isolation valve 78 restricts or limits the gas flow to throttle valve 83 to maximize the pressure increase in chamber 30, which facilitates MFC calibration.

The CVD system description presented above is illustrative and should not necessarily be considered as limiting the scope of the present invention. The exemplary CVD system 10 is a single-wafer vacuum chamber system. However, other CVD systems that are multiple-wafer chamber systems may be used in other embodiments of the invention. It should be understood, however, that although certain features of the invention are shown and described as part of a CVD chamber in a multichamber processing system, the invention is not necessarily intended to be limited in this manner. That is, various aspects of the invention can be used in a variety of processing chambers, such as etch chambers, diffusion chambers or the like. Variations of the above described system such as variations in design, heater design, location of RF power connections, software operation and structure, specific algorithms used in some software subroutines, configuration of gas inlet lines and valves, and other modifications are possible. Further, the specific dimensions described above are provided for specific embodiments, but of course other embodiments may have different dimensions. Additionally, some embodiments of the invention may be used in other substrate processing apparatus, including CVD equipment such as electron cyclotron resonance (ECR) plasma CVD devices, induction coupled RF high density plasma CVD devices, or the like. The methods for forming layers, such as a titanium film, may not necessarily be limited to any specific apparatus or to any specific plasma excitation method.

II. High Temperature Multiple-Step Processes Using the CVD Reactor System

A. Exemplary Structures and Applications

Figure 17:
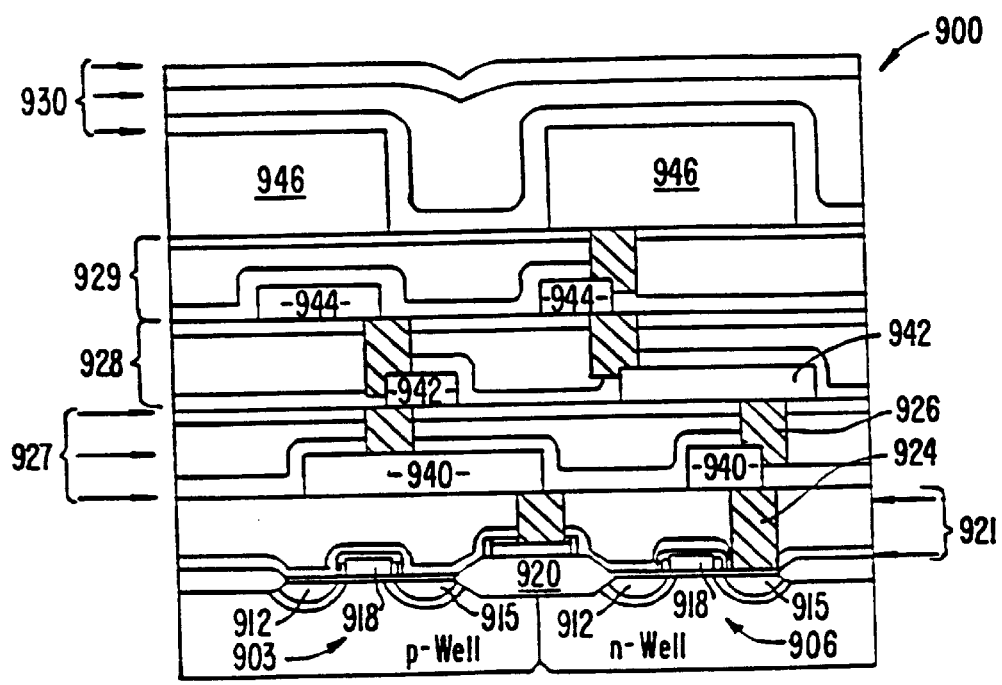
FIG. 17 shows a simplified cross-sectional view of a device fabricated according to one aspect of the present invention.

FIG. 17 illustrates a simplified cross-sectional view of an integrated circuit 900 according to the present invention. As shown, integrated circuit 900 includes NMOS and PMOS transistors 903 and 906, which are separated and electrically isolated from each other by a field oxide region 920 formed by local oxidation of silicon (LOCOS), or other technique. Alternatively, transistors 903 and 906 may be separated and electrically isolated from each other by a shallow trench isolation (not shown) when transistors 903 and 906 are both NMOS or both PMOS. Each transistor 903 and 906 comprises a source region 912, a drain region 915 and a gate region 918.

A premetal dielectric (PMD) layer 921 separates transistors 903 and 906 from metal layer 940 with connections between metal layer 940 and the transistors made by contacts 924. Metal layer 940 is one of four metal layers 940, 942, 944, and 946, included in integrated circuit 900. Each metal layer 940, 942, 944, and 946 is separated from adjacent metal layers by respective inter-metal dielectric layers 927, 928, and 929. Adjacent metal layers are connected at selected openings by vias 926. Deposited over metal layer 946 are planarized passivation layers 930. CVD apparatus 10 may be used to deposit films used, for example, as metal layers 940, 942, 944, or 946. These layers may consist of multiple sub-layers, such as a titanium layer underlying an aluminum, gold, platinum, or tungsten layer. CVD apparatus 10 also may be used to deposit contacts 924 or plugs in the device structure.

Figure 18:
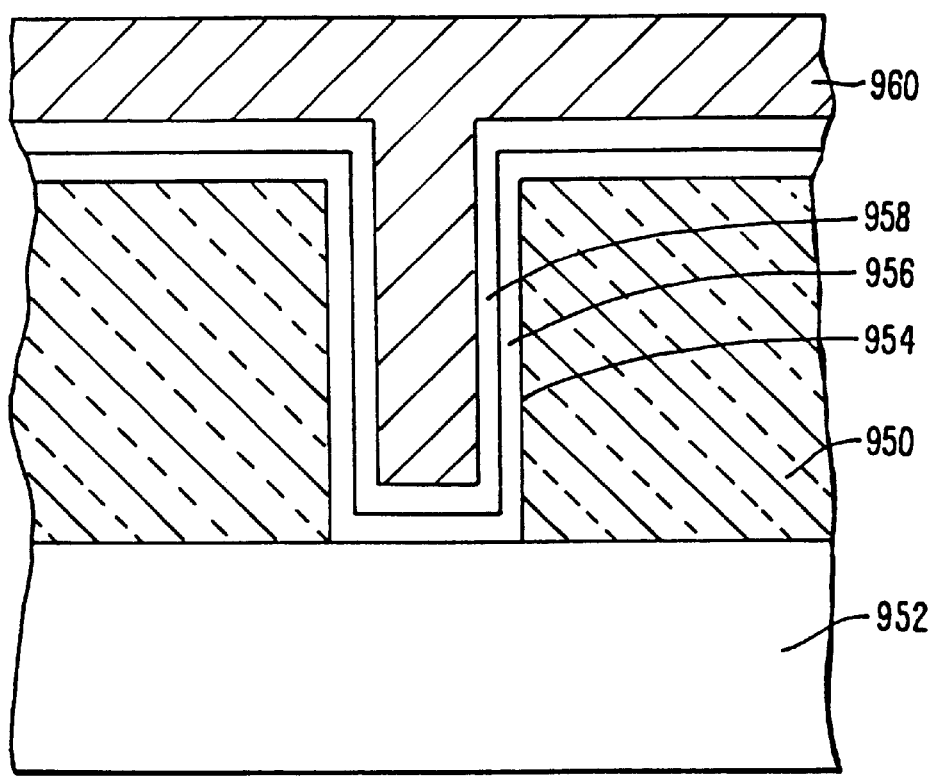
FIG. 18 is a simplified cross-sectional view of a contact in a device fabricated according to an aspect of the present invention.

FIG. 18 is a cross-sectional view of an exemplary contact structure (such as contact 924 or vias 926 of FIG. 17 with which embodiments of the present invention may be used. As seen in FIG. 18 an oxide layer 950, typically $SiO_2$, is deposited to a thickness of about 1 $\mu$m over a substrate 952 having a surface of crystalline silicon or polysilicon. Oxide layer 950 may act as a pre-metal dielectric or as an inter-level dielectric, but to provide electrical contact between levels a contact hole 954, is etched through oxide layer 950 to be filled with a metal such as aluminum. However, in advanced integrated circuits, contact hole 954 is narrow, often less than about 0.35 $\mu$m, and has an aspect ratio of about 6:1 or greater. Filling such a hole is difficult, but a somewhat standard process has been developed in which hole 954 is first conformally coated with a titanium layer 956, and titanium layer 956 is then conformally coated with a titanium nitride layer 958. Thereafter, an aluminum layer 960 is deposited, often by physical vapor deposition, to fill the contact hole 954 and to provide electrical interconnection lines on the upper level. The Ti layer 956 provides a glue layer to both the underlying silicon and the oxide on the sidewalls. Also, it can be silicided with the underlying silicon to form an ohmic contact. The TiN layer 958 bonds well to the Ti layer 956, and the aluminum layer 960 wets well to the TiN so that the aluminum can better fill contact hole 954 without forming an included void. Also, TiN layer 956 acts as a barrier to prevent aluminum 960 from migrating into silicon 952 and affecting its conductivity. In a via structure in which substrate 952 includes an aluminum surface feature, the Ti layer 956 may not be needed. Even though the electrical conductivities of titanium and titanium nitride are not nearly as high as that of aluminum, they are sufficiently conductive in thin layers to provide a good electrical contact. Preferred embodiments of the present invention may be used to deposit Ti layer 956, and other embodiments may be used to deposit TiN layer 958 as well as other layers.

It should be understood that simplified integrated circuit 900 of FIG. 17 and the contact structure of FIG. 18 are for illustrative purposes only. One of ordinary skill in the art could implement the present method for fabrication of other integrated circuits such as microprocessors, application specific integrated circuits (ASICs), memory devices, and the like, as well as discrete devices. Further, the present invention may be applied to PMOS, NMOS, CMOS, bipolar, or BiCMOS devices. Although applications related to the deposition of metal films are discussed above, the present invention also may be used in other applications, such as internetallic deposition, spontaneous formation of an intermetallic film from a metal deposition, or doped film deposition. Specifically, the process can be advantageously applied to CVD of metal oxides, such as BST and PZT. The invention is of course applicable to many other types of metal CVD processes and should be useful in dielectric CVD and other plasma applications as well.

B. Exemplary Processes

Figure 19:
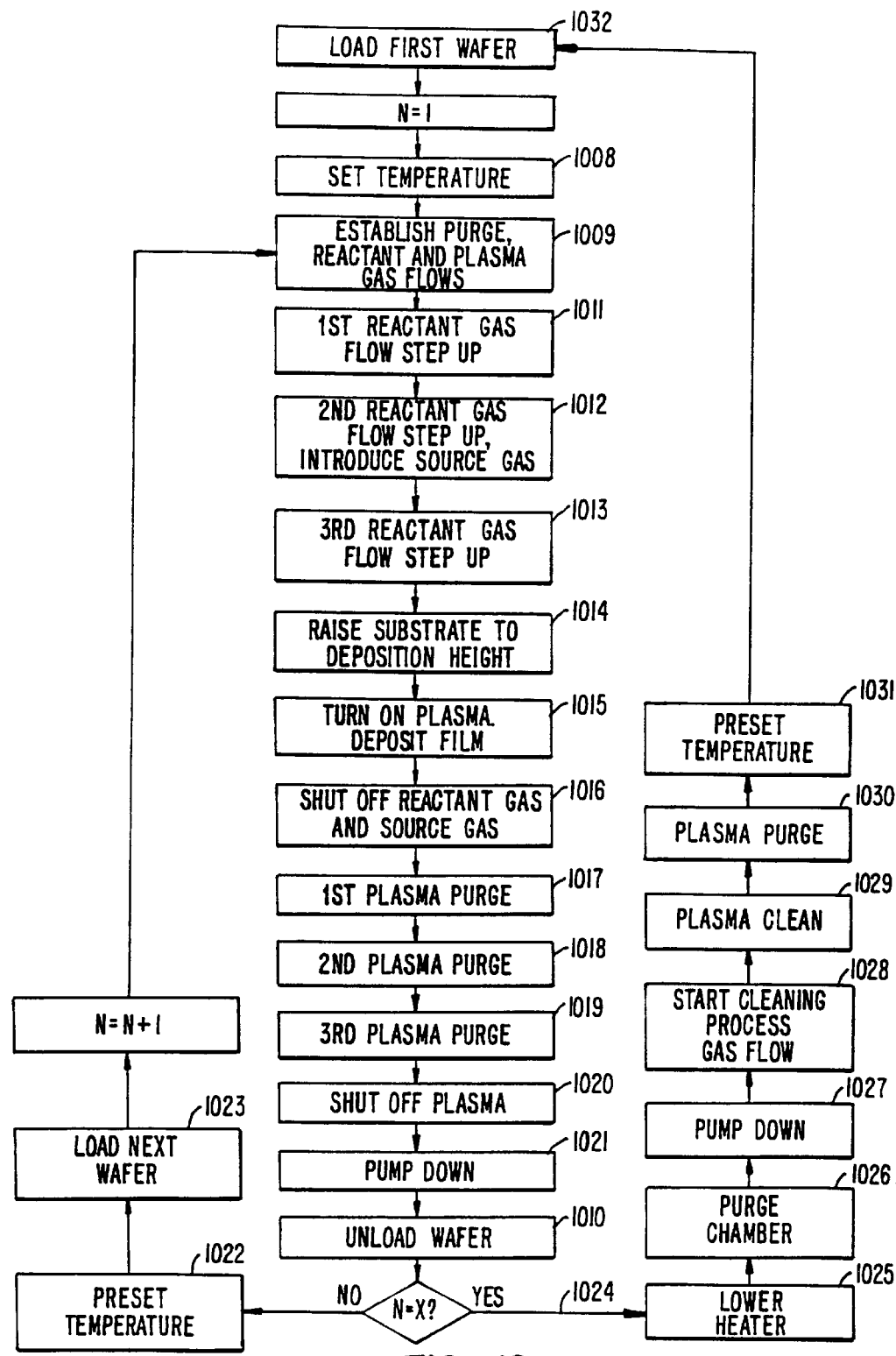
FIG. 19 is a flow chart of a process sequence that can be used with one embodiment of the invention, according to an embodiment of the present invention.

FIG. 19 shows a flow chart of steps in exemplary processes that may be used in the above PECVD system to deposit films such as titanium films on substrates, in accordance with embodiments of the present invention. These exemplary processes use plasma-enhanced chemical vapor deposition (PECVD) to produce titanium films at deposition rates up to at least about 200 Å/minute, up to about 400 Å/minute or greater from a vaporized liquid $TiCl_4$ source, in contrast with other processes that produce titanium films at rates around 100 Å/minute. Increased deposition rates are believed to be achieved due to the liquid delivery system control, the efficiency resulting from the dry clean processes, and the corrosion-resistant, high-temperature chamber components like the faceplate, heater (such as the ceramic heater assemblies described above), and others. The increased deposition rate allows shorter processing time per wafer, and hence greater wafer throughput from the deposition system. The electrically-resistive heating element used in the ceramic heater assembly provides higher temperatures than typically achieved with other conventional CVD systems, for example. An exemplary substrate processing system suitable for performing these processes is the TixZ system (equipped for 200-mm wafers or scalable to 300-mm or other sized wafers), available from Applied Materials, Inc. of Santa Clara, Calif.

The flow rate of reactant and source gases for this process is approximately three times greater than the flow rate for similar processes, such as titanium nitride deposition from an organometallic source, such as tetrakis-dimethylamido-titanium. Accordingly, exhaust port 80 and throttle valve 83, as shown in FIG. 1A have increased cross-sectional areas from prior PECVD systems of similar chamber volume, as discussed above. As described above, showerhead 40 and baffle plate 52 are fabricated to accommodate the increased gas flow, as well. Additionally, because the deposition of titanium from $TiCl_4$ creates chlorine gas, chlorine ions, and hydrochloric acid as byproducts, baffle (or blocker) plate 52 is made of nickel and showerhead 40 of anodized aluminum, according to a specific embodiment. Furthermore, because of the high temperature of reaction, showerhead 40 includes liquid heat exchange passageways 81, which reduce deposition on the showerhead and reduce the corrosion of the showerhead by chlorine species, especially in the presence of a plasma. During this process, the wafer temperature is held constant and the throttle valve is fully open. Because the throttle valve is not controlled based on a pressure reading, the chamber pressure is set by the inflow of reactant, source and purge gases; the rate of combination or disassociation of these gases, and the pumping capacity, among other factors. The chamber pressure may be between about 1–10 torr during the deposition, but is preferably about 4.5–5 torr in the specific embodiment.

The first step in the process is to set the temperature (step 1008). During this step, the chamber is pressurized with a non-corrosive gas, such as argon, above the pressure at which deposition will occur. This may pre-charges voids or hollow spaces within the chamber, particularly the interior of the heater pedestal, with a purge gas. This purge gas will then outgas as the chamber pressure is reduced to the deposition pressure of about 4.5 torr in a specific embodiment (step 1009), thereby minimizing the intrusion of process gases that may corrode or oxidize parts of the heater pedestal or chamber. The process may be performed preferably at temperatures between about 400–750° C., most preferably about 625° C. in a specific embodiment. In step 1008, the temperature is initially set to about 635° C., and the wafer is loaded into the chamber. The initial temperature is set higher than the process temperature because the process gases will cool the heater and wafer when they start flowing. Initially heating the wafer above the process temperature results in a shorter wafer cycle time and reduces thermal shock to the heater arising from the thermal gradient between the heater element and the surface of the heater that conventionally arises when heater power is increased to bring the heater back up to processing temperature after the gas flows start.

About 15 seconds after loading the wafer, the temperature is set to the operating temperature, in this instance about 625° C., as the purge gas, such as argon, is flowed into the chamber (step 1009). Concurrently reducing the set-point temperature of the heater (in step 1009) while initiating gas flows allows the thermal capacity of the heater to account for some of the cooling arising from the onset of the gas flow. In this manner, the temperature excursion from the operating temperature is reduced and less heater power is required to restore the heater to the operating temperature. For example, if the set-point temperature is about 625° C. (requiring about 50% of maximum heater power to maintain) at the onset of the gas flow, the heater power controller may supply 100% maximum power to the heater element to restore the heater to about 625° C. If the original set-point temperature is about 635° C., which is about 625° C. at the onset of gas flow, then the heater power controller may only need to supply about 65% maximum power to restore the heater to 625° C., thereby reducing the thermal gradient between the heater element and the surface of the heater. The exact amounts of power will vary with the thermal capacity of the heater, the type of power controller, and the gas flows, among other factors.

Suitable flow rates of the purge gas range between about 500–3000 sccm, preferably about 1000 sccm, for a chamber with a volume of about 5.5 liters. During this time the wafer is held about 550 mil from the showerhead, and the chamber is pumped down by fully opening the throttle valve to about 4.5 torr. The throttle valve is held open during the remainder of this embodiment of the process, but could be partially closed in an open-loop or closed-loop (controlled from a pressure sensor reading) fashion. It is understood that greater or lesser flow rates would be appropriate for larger or smaller chambers. In one embodiment, the purge gas is admitted into the chamber via a bottom vent (not shown) such that the lower portion of the chamber (that portion lower than the flow restrictor ring) is blanketed with purge gas, to reduce unwanted depositions in this region. A plasma gas, such as argon, is concurrently admitted into the chamber via the showerhead at a flow rate between about 1000–10000 sccm, preferably about 5000 sccm (step 1009). The plasma gas is easily formed into a plasma with an appropriate application of RF energy. The mixture of the plasma gas with the reactant and source gases facilitates forming a plasma from the reactant and source gases. Simultaneously, a reactant gas, such as hydrogen ($H_2$), is turned on at an initial flow rate (step 1009). The reactant gas lowers the energy required for the decomposition of the source gas to form the desired film and also reduces the corrosivity of the deposition byproducts by converting some of the chlorine to hydrogen chloride (HCl), rather than leaving it as Cl— or $Cl_2$. The flow rate of the reactant gas is stepped up in increments (or, alternatively, ramped) from an initial to a final flow rate. This reduces the thermal shock to the heater, as the final flow rate of reactant gas is fairly high and would unduly cool the wafer if turned on all at once. This stepped or ramped onset of gas may be particularly important with gases such as helium or hydrogen, as these gases exhibit high thermal transfer characteristics. The initial rate of reactant gas may be approximately 11% of the final flow rate in some specific embodiments. This condition is held for about 5 seconds.

In the next step, the reactant gas flow is increased to approximately 32% of the final flow rate (step 1011). After about a 5 second wait, the reactant gas flow is increased to about 53% of the final flow rate, and the source gas is turned on (step 1012). Preferably, the reactant:source gas flow ratio is less than about 250:1 in specific embodiments. In one embodiment, the source gas is comprised of helium gas which is bubbled through a liquid source of titanium tetrachloride ($TiCl_4$) heated to about 60° C. The total pressure above the liquid is a combination of the helium pressure and the vapor pressure. Heating the liquid $TiCl_4$ to a temperature of about 60° C. results in a $TiCl_4$ vapor pressure of about 60 torr.

The flow of helium through the liquid source bubbler is set to about 200 sccm. The resultant combined flow of $TiCl_4$ vapor and helium corresponds to a flow rate of 58 sccm through a mass flow controller (MFC) (which is calibrated for $TiCl_4$ vapor) on the output source line. Those skilled in the art understand that MFCs are calibrated for particular gases, and that altering the relative pressures between the helium bubbler pressure and helium-plus-$TiCl_4$-vapor output pressure could alter the concentration of $TiCl_4$ vapor in the source gas, even if the MFC continued to control a "flow" of 58 sccm. Furthermore, heating $TiCl_4$ to higher temperatures not only results in higher vapor pressures, but also alters the concentration of $TiCl_4$ vapor in the source gas for a given "flow." It is desirable to choose the helium pressure, output source pressure, and $TiCl_4$ temperature to produce a stable $TiCl_4$ vapor delivery that results in a high film deposition rate. The throttle valve between the chamber and the vacuum pump is held open, providing maximum exhaust capacity. At the above rates of flow, the resultant chamber pressure is about 4–5 torr for the particular deposition system used. The relative flows of $TiCl_4$ vapor and $H_2$ are chosen to optimize the formation of the resultant titanium layer at these conditions, given the available exhaust capacity. A greater capacity would allow a higher total gas flow rate, and hence a greater quantity of $TiCl_4$ vapor could be delivered to the deposition chamber. Similarly, increasing the flow of $H_2$ relative to the flow of $TiCl_4$ vapor in a system with a fixed exhaust capacity would reduce the quantity of $TiCl_4$ vapor delivered to the chamber.

As an alternative to the temperature-based MFC controller, a pressure-based control system may be used. Examples of pressure-based controllers include pressure regulators, fixed-aperture (orifice) controllers, and variable-aperture controllers, as discussed above. The simplicity of a fixed-aperture control system may be desirable with vapors, such as $TiCl_4$, that may condense in and/or clog a MFC controller, thus upsetting its thermal sense mechanism. For example, a 29.2 mil aperture placed between a liquid source of $TiCl_4$ and the deposition chamber may maintain stable delivery of $TiCl_4$ vapor to the chamber. In other embodiments, the aperture may range between about 25–40 mil to achieve high deposition rates. In this embodiment, the chamber is maintained at a pressure of about 4.5 torr by the adjusting the throttle valve with the pressure controller according to the measured chamber pressure. If the liquid source is heated to about 60° C. and helium is bubbled through the liquid at about 400 sccm, the aperture will maintain a stable pressure of about 110 torr above the liquid source at an aperture output pressure of about 4.5 torr. Suitable vapor flow rates may also be obtained without the use of a bubbler gas, especially if the liquid source is heated to a temperature that provides sufficient vapor pressure to maintain a stable rate of deposition.

Next, the reactant gas is set to its final processing flow rate of about 9500 sccm (step 1013), which is held for about five seconds before the wafer is moved to its processing position, approximately 400 mil from the showerhead nozzle (step 1014). This condition is held for an additional five seconds to allow the gas flow pattern to stabilize, and then the RF power is turned on (step 1015). The RF frequency may be between about 300–450 kHz, preferably about 400 kHz, at a power level between about 200–2000 watts, preferably about 700 watts. These conditions, including use of argon, establish a stable plasma without needing additional means to ignite a glow discharge, such as an ultra-violet source or a spark generator. Alternative embodiments may use a higher frequency RF source, operating for example at about 13.56 MHz. This source may be used alternatively or in addition to the lower RF source. A titanium film will be deposited on the wafer at a rate of about 200 Å/minute. Accordingly, holding these process conditions for about 100 seconds will result in a titanium film approximately 300 Å thick.

After the desired film has been deposited, the source and reactant gases are turned off (step 1016). The plasma power is reduced to a lower power level (approximately 43% of the deposition power level) within about 2 seconds (step 1017), reduced again to approximately 20% within about 2 seconds (step 1018), and then finally reduced to about 7% within about 2 seconds (step 1019), after which the RF power is shut off (step 1020). During this time, the throttle valve remains open. The heater is lowered to reduce heat loss to the colder walls of the chamber, especially the faceplate and lid. This plasma purge sequence acts to loosen larger particulates formed on the chamber and various chamber components. The plasma power, plasma gas, and purge gas are then turned off, and the chamber is pumped down (step 1021) prior to unloading the processed wafer (step 1010). After the wafer is removed, the temperature is preset to about 635° C. (step 1022) before the next wafer is loaded (step 1023). Although the in situ plasma purge process is described as a three-step process, this process could be performed in fewer or additional steps, or could be performed as a continuous ramp down with a constant or variable rate of change of RF power.

In addition to the plasma purge clean done after each wafer deposition, additional cleaning procedures are utilized to avoid wafer contamination. A dry clean process (which is done without opening the chamber lid) is performed periodically on the chamber after a certain number of wafer deposition processes. According to the present invention, there is no wafer (e.g., a dummy wafer) in the chamber during this clean process. The dry clean process may be run between every "X" wafers, preferably 1–25 wafers. The dry clean may be performed, for example, between every 3–5 wafers in a specific embodiment. It is desired to keep the dry clean process efficient, so that it does not significantly affect the total system wafer output. An exemplary dry cleaning process in accordance with a specific embodiment is described in further detail below.

Referring again to FIG. 19, if X (where X=3, for example) wafers have been processed, the chamber is due for a dry clean (step 1024). First, the heater is moved further away from the showerhead to a distance of about 700 mil (step 1025), and maintained at the processing temperature of 625° C. The chamber is maintained at a cleaning pressure ranging between about 0.1–10 torr, preferably less than about 5 torr, and about 0.6 torr in a specific embodiment. This minimizes heat flow from the heater to the showerhead, thus cooling the showerhead relative to the heater. The chamber is purged with a purge gas, such as argon, at a pressure (higher than the process pressure) between about 5–15 torr, preferably about 15 torr in a specific embodiment, (step 1026) and then pumped down to about 0.6 torr (step 1027). Purging at a higher pressure than either the pump down or deposition pressures fills the heater pedestal with argon gas, which subsequently out gasses to keep cleaning process gas from infiltrating the heater or pedestal. Chlorine ($Cl_2$) gas is then flowed into the chamber at a rate of about 200 sccm, in addition to argon gas (step 1028), which will assist with plasma formation, as discussed above. Next, a plasma is struck at a power of about 400 watts (step 1029). This condition is held for about 80 seconds, during which time the chlorine species react with unwanted deposits and argon plasma species physically bombard deposits to etch these deposits from the chamber components. Unwanted deposits from the deposition processes are generally thickest over the hottest exposed portions of the chamber, i.e. the top surfaces of the heater that were not covered by a wafer or not shielded by a flow restrictor ring. By moving the heater away from the showerhead, the conditions given above ensure sufficient cleaning of all chamber components without over etching any of those components, especially the showerhead. After the plasma clean, the chlorine gas is turned off and the plasma power is reduced to about 50 watts to perform a plasma purge for about 5 seconds (step 1030). The temperature is then preset to about 635° C. (step 1031) in preparation to process X wafers by loading the next wafer into the chamber(1032), and the chamber is pumped out for about 15 seconds. Of course, it is recognized that "wet cleans" or preventive maintenance cleanings (occurring between every hundreds to thousands of processed wafers) may be performed by opening the chamber lid to manually clean various parts of the chamber.

Performing the periodic dry clean process between wafer depositions minimizes the frequency of these preventive maintenance cleanings, which are often very time consuming. Further, the dry clean process provides a cleaner chamber and processes run in the chamber are believed to be more efficient and contribute to faster deposition rates.

III. Test Results And Measurements

Experiments were performed to evaluate deposition processes and apparatus suitable for the rapid deposition of a titanium film, or other film, with good gap filling characteristics. The experiments were performed in a TixZ deposition system (manufactured by Applied Materials, Inc.) having a resistively-heated ceramic heating assembly and configured for a 200-mm wafer. The experimental conditions were generally chosen to approximate the conditions during deposition of a titanium film onto a wafer, according to a specific embodiment described above, except as indicated below.

Figure 20:
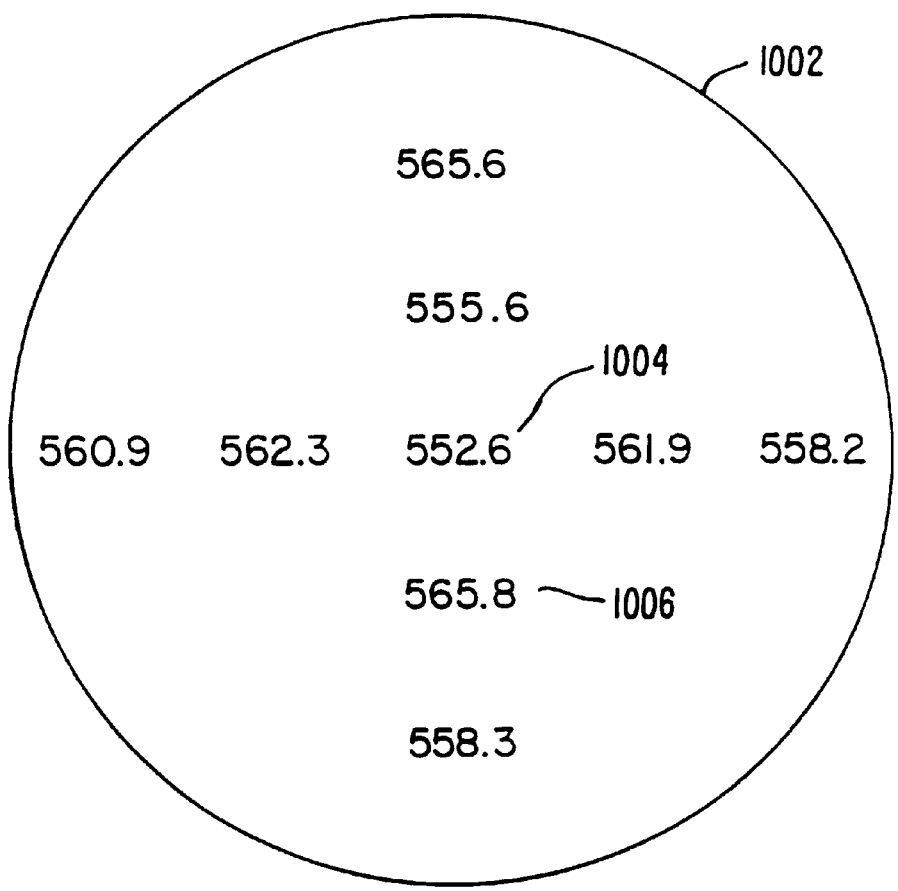
FIG. 20 illustrates test results on temperature uniformity of the heater pedestal according to an embodiment of the present invention.

FIG. 20 is a chart showing the measured temperature uniformity across a 200-mm silicon wafer 1002 when heated to set-point temperature of 625° C. on a resistively-heated AlN heater assembly (such as the short stub AlN heater described above) at a chamber pressure of about 5 torr, and at a spacing of about 400 mil between the showerhead and wafer 1002. As seen in FIG. 20, the temperature values at different locations of wafer 1002 range from a minimum of 552.6° C. (reference 1004) to a maximum of 565.8° C. (1006), resulting in a temperature variation of 13.2° C. The temperature uniformity is defined according to the following equation:

$$\text{Temperature Uniformity} = \pm(\Delta \text{Temperature}/(2 \times \text{Temperature})) \times 100\%,$$

where the temperature is in ° C. Using this equation, the temperature uniformity across the wafer is ±1.2%. The ceramic heater of the present invention therefore demonstrates good, uniform heating capability.

Figure 21:
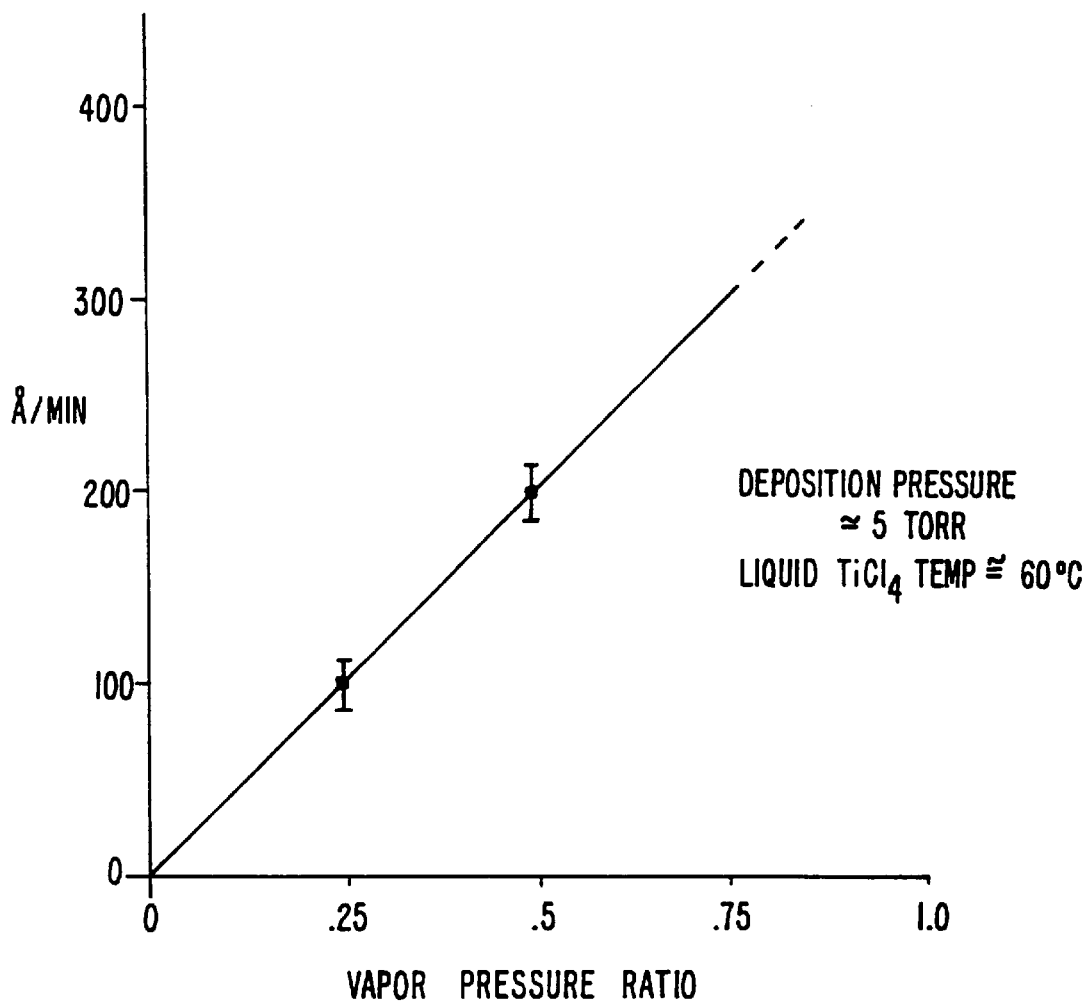
FIG. 21 is a graph of the deposition rate of a titanium layer versus $TiCl_4$ vapor pressure ratio under otherwise similar deposition conditions.

FIG. 21 is a graph showing the relationship of deposition rate of a titanium layer to the concentration of $TiCl_4$ vapor in the source output under similar process conditions discussed above for a liquid $TiCl_4$ source bubbled using helium. The vapor pressure ratio is the ratio of $TiCl_4$ vapor pressure to the total pressure over the liquid source, which includes the helium pressure from the bubbler supply. For both depositions, the liquid source was held at a temperature of about 60° C., which produced a $TiCl_4$ vapor pressure of about 60 torr. Both depositions were performed at about the same chamber pressure, using the same fixed-aperture orifice to control the total pressure over the liquid at about 120 torr. The flow of the helium bubbler gas was varied to produce different $TiCl_4$ vapor pressure ratios. As shown in FIG. 21, doubling the vapor pressure ratio in this region doubles the deposition rate. Although the relationship appears linear in this region, it may or may not be linear over the entire range of vapor pressure ratios. Furthermore, controlling the vapor pressure ratio may be accomplished by other means, such as controlling the temperature (and hence the vapor pressure) of the $TiCl_4$ liquid source. For example, raising the temperature of the liquid source to 70° C. may produce a $TiCl_4$ vapor pressure of about 90 torr. Given a constant helium bubbler flow rate, raising the temperature of the liquid source may increase the vapor pressure ratio, thereby increasing the quantity of $TiCl_4$ delivered to the deposition chamber. Increasing the diameter of the orifice in a pressure-controlled system, as discussed above, may also increase the pressure ratio and hence increase the amount of $TiCl_4$ delivered to the chamber. Orifice diameters may range between about 25–40 mil in specific embodiments. For example, increasing the orifice diameter from about 29 mil to about 35 mil may increase the deposition rate from about 200 Å/minute to about 400 Å/minute. Changing the deposition parameters, such as chamber pressure or wafer temperature, for example, may result in different rates of deposition. Use of pressure-based control for the output of a source gas to the chamber (such as a bubbler to provide a source gas from a vaporized liquid source, which is introduced into the chamber via an aperture orifice) results in good control of deposition rate, as well as stability and reliability in the deposition process.

It is to be understood that the above description is intended to be illustrative and not restrictive. Many embodiments will be apparent to those of skill in the art upon reviewing the above description. By way of example, the inventions herein have been illustrated primarily with regard to a titanium process recipe, but they are not so limited. For example, the film formed according to other embodiments may be a titanium silicide film, a titanium nitride film, other metal film, doped film, dielectric film, or other film. As another example, the plasma gas used for the specific embodiment is argon, but other gases such as $BCl_3$ or $ClF_3$ also may be used as the plasma gas in other embodiments. Of course, it is recognized that the same CVD apparatus discussed above may be used to deposit films at temperatures lower than about 400° C., as well as temperatures above 625° C. It is also recognized that the invention is not limited to the specific dimensions described above for various specific embodiments. Also, materials besides those described above for specific embodiments may be used for various components of the chamber, such as the faceplate which may be made of nickel, graphite, or other materials. Additionally, various aspects of the present invention may also be used for other applications. Those skilled in the art will recognize other equivalent or alternative methods of depositing the layer while remaining within the scope of the claims of the present invention. The scope of the invention should, therefore, be determined not with reference to the above description, but should instead be determined with reference to the appended claims, along with the full scope of equivalents to which such claims are entitled.

What is claimed is:

1. An assembly comprising:
    a ceramic upper layer;
    a perforated metal layer having a plurality of perforations, said perforated metal layer disposed below said ceramic upper layer;
    a plurality of electrodes coupled to an electrode base, said electrodes electrically coupling said perforated metal layer to said electrode base; and
    a ceramic bonding disk disposed between said perforated metal layer and said electrode base, said ceramic bonding disk having a plurality of holes through which said electrodes extend through said ceramic bonding disk to said perforated metal layer, wherein said ceramic upper layer is bonded to said ceramic bonding disk through at least one of said plurality of perforations in said perforated metal layer.

2. The assembly of claim 1 wherein said ceramic upper layer and said ceramic bonding disk comprise aluminum nitride.

3. The assembly of claim 1 wherein said perforated metal layer is a radio-frequency electrode.

4. The assembly of claim 1 wherein said perforated metal layer comprises molybdenum or tungsten.

5. The assembly of claim 1 wherein said perforated metal layer is about 3–6 mil thick.

6. The assembly of claim 1 wherein said ceramic upper layer is less than about 200 mil thick.

7. The assembly of claim 1 wherein said electrode base is configured as a metal spider having a plurality of arms.

8. The assembly of claim 7 wherein at least one of said plurality of arms is perforated to provide at least one through-hole through said arm.

9. The assembly of claim 7 wherein at least one of said plurality of arms is bent.

10. The assembly of claim 1 further comprising a planar heating element disposed within the assembly, said heating element comprising a plurality of pairs of concentric partial rows of resistive elements.

11. The assembly of claim 10 wherein said concentric partial rows have a sinuous pattern.

12. The assembly of claim 10 wherein each of said concentric partial rows of resistive elements is folded back to create a plurality of seams between each of said pairs of concentric partial rows of resistive elements, each of said plurality of seams being circumferentially offset from at least an adjacent seam.

13. The assembly of claim 12 wherein said plurality of pairs of concentric partial rows of resistive heating elements are configured to provide a non-uniform heating characteristic.

14. The assembly of claim 1 wherein a portion of at least one of said plurality of electrodes overhangs an edge of said electrode base.

15. The assembly of claim 1 wherein said electrode base has a conical shape with a top surface.

16. The assembly of claim 15 further comprising a conductive shelf, said conductive shelf coupled between said plurality of electrodes and said electrode base.

17. The assembly of claim 1 wherein said plurality of electrodes is disposed on said electrode base.

18. The assembly of claim 7 wherein said plurality of arms comprises at least four arms.

19. The assembly of claim 7 wherein at least one of said plurality of arms branches into a sub-arm.

* * * * *